US011914796B1

(12) United States Patent
Goh et al.

(10) Patent No.: US 11,914,796 B1
(45) Date of Patent: Feb. 27, 2024

(54) LOW ACOUSTIC KEYBOARD STABILIZED KEY

(71) Applicant: Dell Products L.P., Round Rock, TX (US)

(72) Inventors: Peng Lip Goh, Singapore (SG); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/214,600

(22) Filed: Jun. 27, 2023

(51) Int. Cl.
  *G06F 3/02* (2006.01)
(52) U.S. Cl.
  CPC .................................. *G06F 3/0202* (2013.01)
(58) Field of Classification Search
  CPC ..................................................... G06F 3/0202
  See application file for complete search history.

(56) References Cited

U.S. PATENT DOCUMENTS

| | | | |
|---|---|---|---|
| 4,990,731 A | 2/1991 | Wu et al. | |
| 5,212,473 A | 5/1993 | Louis | |
| 6,064,371 A | 5/2000 | Bunke et al. | |
| 6,092,209 A | 7/2000 | Holzhammer et al. | |
| 8,279,176 B2 | 10/2012 | Krah et al. | |
| 8,314,780 B2 | 11/2012 | Lin et al. | |
| 8,400,410 B2 | 3/2013 | Taylor et al. | |
| 9,323,228 B2 | 4/2016 | Zhu et al. | |
| 9,645,647 B2 | 5/2017 | Levesque | |
| 9,778,760 B1 | 10/2017 | Huang et al. | |
| 9,798,387 B2 | 10/2017 | Joseph et al. | |
| 9,864,437 B2 | 1/2018 | Pang et al. | |
| 10,401,979 B2 | 9/2019 | Wang et al. | |
| 10,502,271 B2 | 12/2019 | Battlogg | |
| 10,726,984 B2 | 7/2020 | Keltz et al. | |
| 10,936,091 B1 | 3/2021 | Tseng et al. | |
| 11,163,375 B1 * | 11/2021 | Lin | G06F 3/0202 |
| 11,347,312 B1 | 5/2022 | Wang | |
| 11,413,521 B2 | 8/2022 | Soelberg | |
| 11,599,136 B1 | 3/2023 | Morrison | |
| 2002/0063477 A1 | 5/2002 | Chang et al. | |
| 2002/0093481 A1 | 7/2002 | Kehlstadt | |
| 2003/0066126 A1 | 4/2003 | Armbruster et al. | |
| 2005/0009496 A1 | 1/2005 | Chen | |

(Continued)

OTHER PUBLICATIONS

IEEE, "A Haptic interface with adjustable stiffness using MR fluid," 2015 IEEE International Conference on Advanced Intelligent Mechatronics (AIM), Jul. 7-11, 2015, 2 pages.

(Continued)

*Primary Examiner* — Amit Chatly
(74) *Attorney, Agent, or Firm* — ZAGORIN CAVE LLP; Robert W. Holland

(57) ABSTRACT

An information handling system keyboard has plural key caps coupled to a frame with a vertical travel having a raised position defined by engagement between a stop of the frame and a key cap extension from the key cap. Larger key caps, such as a space bar, shift and enter key cap, are stabilized by including a balancing bar that maintains the key cap level when depressed and released. Acoustic noise associated with key cap movement and balancing bar rattle is reduced by stabilizing the balancing bar with one or more magnets and/or a shaped cushion to reduce balancing bar rattle.

12 Claims, 50 Drawing Sheets

(56) References Cited

U.S. PATENT DOCUMENTS

| | | |
|---|---|---|
| 2005/0206618 A1 | 9/2005 | Lee et al. |
| 2005/0231482 A1 | 10/2005 | Theytaz et al. |
| 2006/0114231 A1 | 6/2006 | Koh |
| 2006/0284854 A1 | 12/2006 | Cheng et al. |
| 2007/0188453 A1 | 8/2007 | O'Sullivan |
| 2009/0114675 A1 | 5/2009 | Kuzar et al. |
| 2009/0231279 A1 | 9/2009 | Ganey et al. |
| 2010/0171702 A1 | 7/2010 | Cheng |
| 2010/0177043 A1 | 7/2010 | Chen |
| 2010/0201626 A1 | 8/2010 | Krah et al. |
| 2013/0285911 A1 | 10/2013 | Nissen et al. |
| 2014/0247246 A1 | 9/2014 | Maus |
| 2014/0267005 A1 | 9/2014 | Urbach |
| 2014/0317199 A1 | 10/2014 | Lucero et al. |
| 2016/0018891 A1 | 1/2016 | Levesque et al. |
| 2016/0103489 A1 | 4/2016 | Cruz-Hernandez et al. |
| 2016/0208203 A1 | 7/2016 | Traynor et al. |
| 2016/0334865 A1 | 11/2016 | Siegfried et al. |
| 2016/0334871 A1 | 11/2016 | Levesque |
| 2017/0192536 A1 | 7/2017 | Wang et al. |
| 2017/0285848 A1 | 10/2017 | Rosenberg et al. |
| 2018/0071621 A1 | 3/2018 | Xu et al. |
| 2018/0298959 A1 | 10/2018 | Battlogg |
| 2019/0113988 A1 | 4/2019 | Hotelling et al. |
| 2019/0122837 A1* | 4/2019 | Yang ................... H01H 13/14 |
| 2019/0146600 A1 | 5/2019 | Tsai et al. |
| 2019/0339793 A1 | 11/2019 | Rizvi et al. |
| 2020/0005977 A1 | 1/2020 | Keltz et al. |
| 2020/0135415 A1 | 4/2020 | Chang et al. |
| 2020/0192479 A1 | 6/2020 | Forest et al. |
| 2021/0113918 A1 | 4/2021 | Soelberg |
| 2021/0142959 A1 | 5/2021 | Lee |
| 2021/0157420 A1 | 5/2021 | Krishnakumar et al. |
| 2021/0342020 A1 | 11/2021 | Jorasch et al. |
| 2022/0044886 A1* | 2/2022 | Han ..................... H01H 3/125 |
| 2022/0171470 A1 | 6/2022 | Drezet et al. |

OTHER PUBLICATIONS

Lee, C-H, and Jang, M-G, "Virtual Surface Characteristics of a Tactile Display Using Magneto-Rheological Fluids," MDPI, Department of Mechanical Engineering, Inha University, Yonghun-dong 253, Nam-gu, Incheon 402-751, Korea, Published Mar. 2, 2011, 14 pages.

U.S. Appl. No. 17/147,224, filed Jan. 12, 2021, entitled "Information Handling System Variable Feel Input Device," by inventor Morrison.

U.S. Appl. No. 17/382,573, filed Jul. 22, 2021, entitled "Dynamic Input Device Surface Texture Coordinated With Information Handling System Operations," by inventors Deeder M. Aurongzeb and Peng Lip Goh.

U.S. Appl. No. 17/875,901, filed Jul. 28, 2022, entitled "Information Handling System Mouse With Selectable Input Button Response," by inventors Peng Lip Goh and Deeder M. Aurongzeb.

Wikipedia, "Magnetorheological fluid," downloaded from https://en.wikipedia.org/wiki/Magnetorheological_fluid on Jul. 22, 2021, 7 pages.

Xeeltech, "Reinventing User Experience," X Hapticore, downloaded from https://www.xeeltech.com/ on Jul. 22, 2021, 7 pages.

Yano, S., et al. "Particle size and surface texturing effects on friction of magnetorheological fluids," Tribologia, Finnish Journal of Tribology, vol. 33, No. 2, Feb. 2, 2015, 3 pages.

Fumio Webpage https://www.fumio.com.tw/, printed Jun. 26, 2023, 2 pages.

* cited by examiner

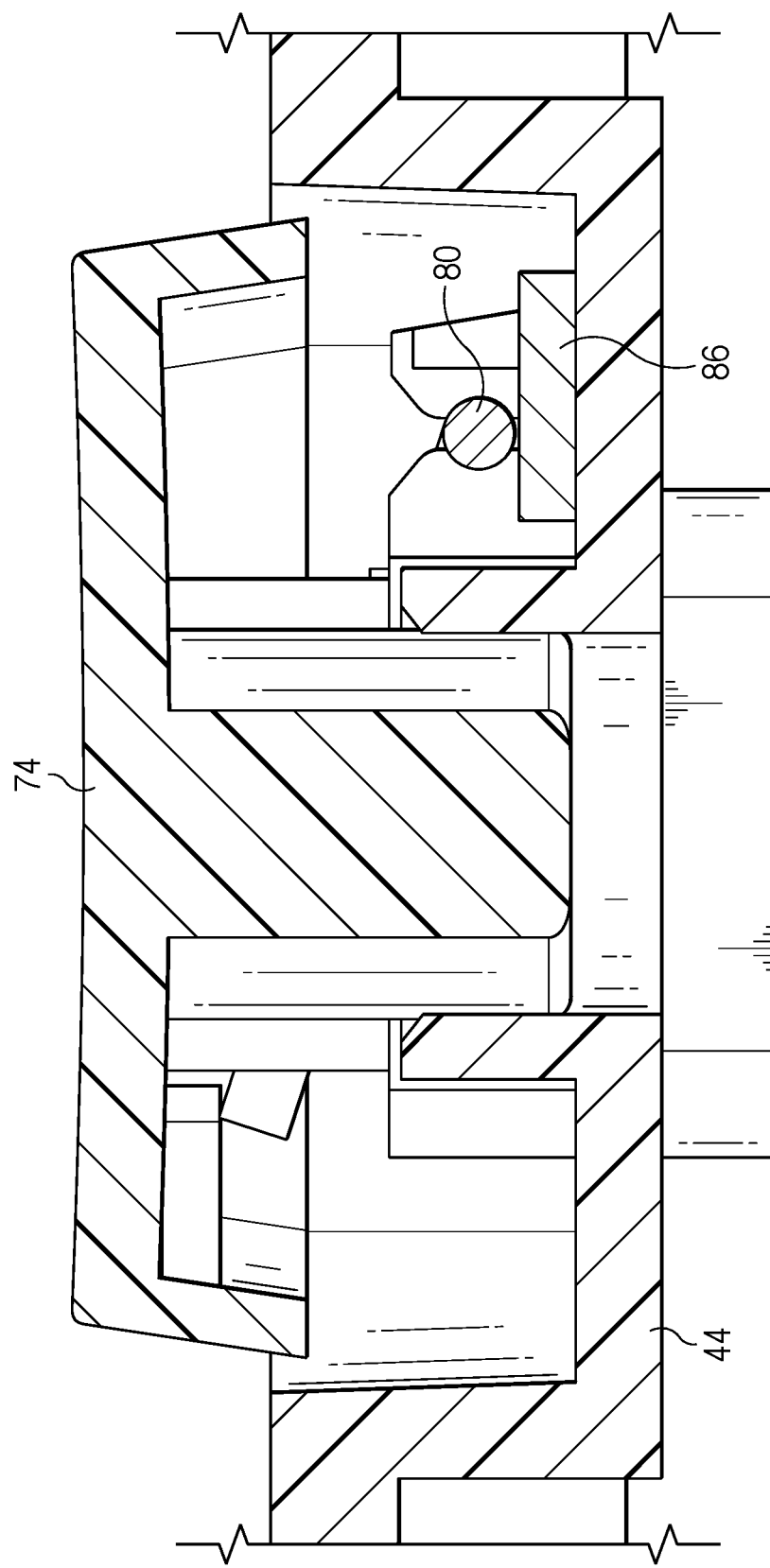

LOW ACOUSTIC KEYBOARD STABILIZED KEY

BACKGROUND OF THE INVENTION

Field of the Invention

The present invention relates in general to the field of information handling system keyboards, and more particularly to an information handling system low acoustic keyboard stabilized key.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems integrate processing components into a housing that cooperate to process information communicated with an end user through input/output (I/O) devices, such as a keyboard, mouse and display. Desktop information handling systems have a stationary housing that typically communicates with a peripheral display, keyboard and mouse through a cable or wireless interface. Portable information handling systems have a portable housing that typically integrates a display, keyboard, touchpad and a power source to support mobile operations. Portable information handling systems allow end users to carry a system between meetings, during travel, and between home and office locations so that an end user has access to processing capabilities while mobile. Convertible configurations typically include multiple separate housing portions that couple to each other so that the system converts between closed and open positions. For example, a main housing portion integrates processing components and a keyboard and rotationally couples with hinges to a lid housing portion that integrates a display. In clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

One difficulty that can arise with input devices is that end user interactions create audible noise that can be distracting to an end user or those around the end user. For example, when a keyboard key is pressed and then released the key is biased upward to a neutral position against a stop. Typically the upward bias of the key is substantial so that the key is quickly available for another input after the key is released. In plunger type keys a plastic hook of the key engages with the keyboard in the upper position to stop the key movement. The hook striking the keyboard tends to produce a clacking noise. Another example is the spacebar of the keyboard which tends to have a metal balancing bar to prevent tilting of the spacebar when pressed down at only one end. The metal balancing bar tends to rattle during movement of the spacebar. In many instances, the area under the keys is an empty space to allow for key movement. This area acts like an echo chamber that amplifies typing noise through partial empty volumetric air in the keyboard chassis. This area can also act as a liquid trap that collects and holds liquid spilled on the upper surface of the keyboard. In some instances, key noise is generated when the key completes an input, such as touching a sensor or reaching an end of downward key travel. For instance, mechanical spring type keys tend to bias upwards in response to metallic spring interactions that create audible noise on contact and that can degrade over time.

Mouse input devices also typically generate audible noise in response to end user interactions. The audible noises may result from mouse button pushes similar to the key presses of a keyboard and from scroll wheel inputs. For example, a typical mouse scroll wheel has tactile feedback that opposes end user rotation and clicks when rotation takes place. For instance, a spring member extends to engage with gears of a wheel coupled to the scroll wheel so that a click occurs as each gear clicks by. Other arrangements include dimples formed in wheel that rotates with the scroll wheel and engages a spring member as the wheel rotates. In addition to generating audible clicks, these types of mechanical haptic feedback systems typically do not adjust the force applied to resist scroll wheel rotation.

Another difficulty that arises with peripheral devices is that the devices often include both a wireless and a cable interface to the information handling system. The cable interface is typically a USB cable that couples to a port of the peripheral device. USB offers both the exchange of information between the peripheral and information handling system and also the exchange of power so that a battery of the peripheral can charge when the cable is coupled in place. The transition to Type C USB cables have resulted in low profile ports at peripheral devices that are sometimes difficult to reinforce so that strain placed on the cable and port during use can result in damage to the port and associated peripheral device electronic components. Further, the small size of the cable and port can make connecting and disconnecting the cable to the port difficult for an end user.

SUMMARY OF THE INVENTION

Therefore, a need has arisen for a system and method which dampens undesired acoustics associated with peripheral operations.

Another need has arisen for a system and method that reduces the risk of damage to a peripheral when interfaced with a cable.

In accordance with the present invention, a system and method are provided which substantially reduce the disadvantages and problems associated with previous methods and systems to accept inputs at a peripheral device with dampened acoustics. A further system and method are provided to manage cables coupled to peripheral devices so as to minimize risk of damage to the peripheral device.

More specifically, an information handling system processes information with a processor that executes instructions in cooperation with a memory that stores the instructions and information. Peripheral devices interface with the processor, such as through a wireless interface or a cable interface, to provide inputs, such as keyboard key press input values and mouse scroll commands. Various techniques are applied to reduce undesired acoustics generated by peripheral device inputs. In one example embodiment, a fluid reservoir is positioned between a key cap and keyboard frame where impacts occur, such as the raised position of a key cap where an extension of the key cap hits a stop of the frame. In another example embodiment, magnets and dampeners are interfaced with a spacebar key cap to reduce rattle of a metal balancing bar that maintains the spacebar key cap level through an input press and release. An audible dampener is placed on the keyboard between keys to fill frame cavities that can cause key echoes, such as a silicon sheet placed over the keyboard membrane. A mouse scroll wheel has a MR fluid captured in a chamber with spaced blades so that rotation of the scroll wheel near a magnet stiffens the MR fluid to generate resistance at the blades and mimic scroll wheel clicks. In an alternative embodiment, a similar haptic feedback is created with a ferromagnetic geared wheel that rotates pass a magnet to cycle between high and low magnetic forces. A cable couples to a port in a peripheral device having the port mounted on a receptacle circuit board that has freedom to move and thereby avoid excessive torsional forces. A sleeve made of rubberized material fits around the port and couples to the peripheral chassis to keep the port aligned with a chassis opening that accepts the cable. In another embodiment, a dongle fully inserts in the port to prevent application of excess torsional force and is pushed out with a magnetic toggle switch.

The present invention provides a number of important technical advantages. One example of an important technical advantage is that an information handling system operates with peripheral devices that have undesired audible sounds dampened to reduce distractions to an end user. In one example embodiment, extraneous noise associated with space bar rattle was reduced by 12 dB. The acoustic reduction techniques introduce minimal complexity and cost to achieve dampened sounds and higher quality peripheral devices.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 6, 6A, 6B, 6C and 6D depict a space bar key cap maintained in a level orientation when depressed and returned to the raised position by a metal balancing bar having audible sounds damped with magnets;

DETAILED DESCRIPTION

Information peripheral devices, such as a keyboard and mouse, accept inputs with reduced acoustical noise. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
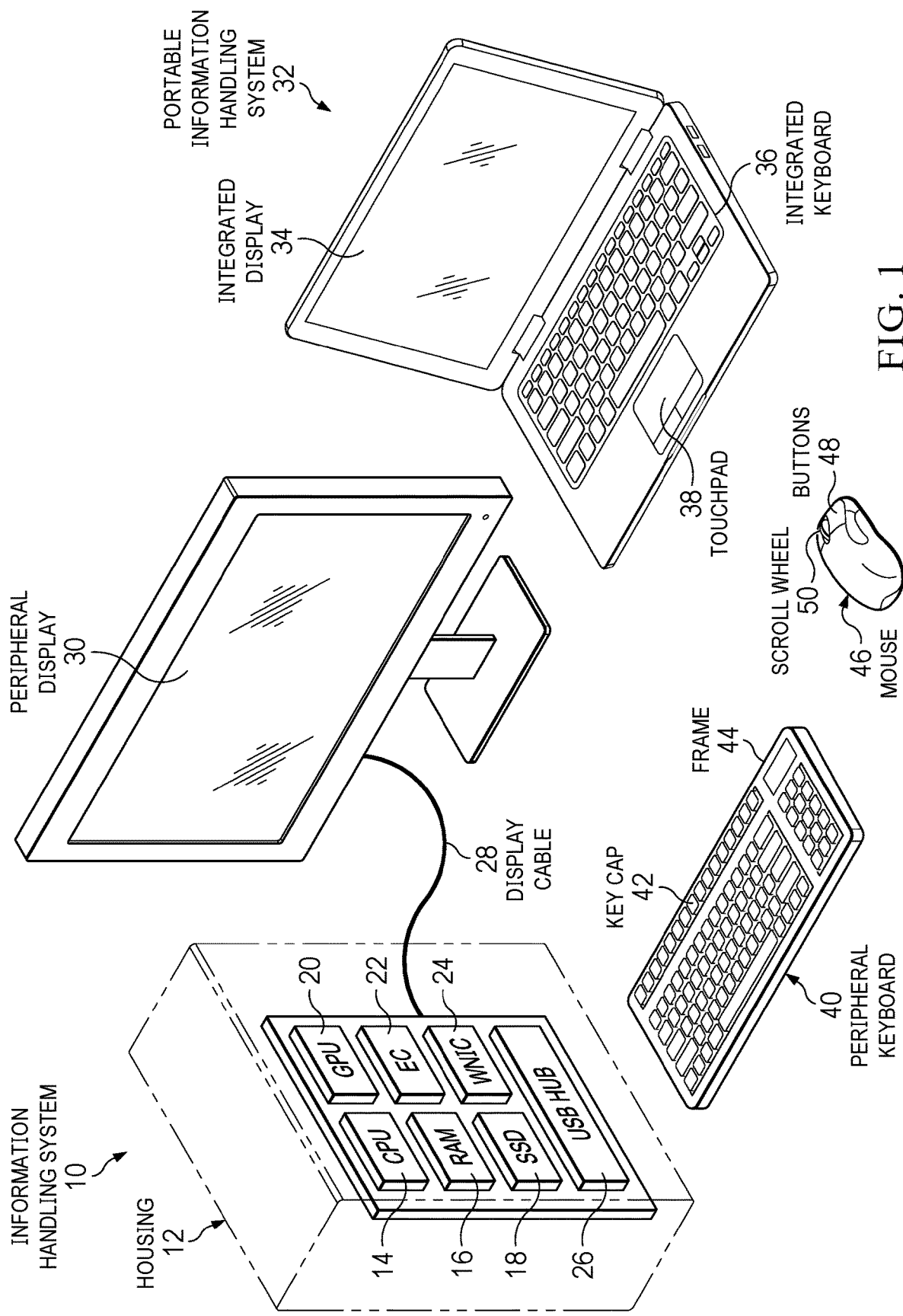
FIG. 1 depicts a desktop information handling system and portable information handling system configured to interface with a peripheral display, peripheral keyboard and peripheral mouse.

Referring now to FIG. 1, a desktop information handling system 10 and portable information handling system 32 are configured to interface with a peripheral display 30, peripheral keyboard 40 and peripheral mouse 46. In the example embodiment, desktop information handling system 10 processes information with processing components disposed in a stationary housing 12. A central processing unit (CPU) 14 executes instructions that process information in cooperation with a random access memory (RAM) 16 that stores the instructions and information. For example, an operating system and application stored in persistent storage of a solid state drive (SSD) 18 are retrieved to RAM 16 by pre-boot instructions executing on an embedded controller 22 to bring the system to an operational state. A graphics processing unit (GPU) 20 further processes information to generate visual images defined by pixel values that are communicated through Universal Serial Bus (USB) hub 26 through a Type C display cable 28 for presentation at peripheral display 30. A wireless network interface controller (WNIC) 24 supports wireless communication of signals, such as through WIFI and/or BLUETOOTH. Although the example embodiment of information handling system 10 depicts one example configuration of processing components that cooperate to process information, alternative embodiments may process information with alternative arrangements of processing components. For instance, portable information handling system 32 has a similar arrangement of processing components in a portable housing that presents visual images at an integrated display 34 and that accepts inputs with an integrated keyboard 36 and integrated touchpad 38.

Both desktop information handling system 10 and portable information handling system 32 interact with end users through peripheral input/output (I/O) devices. In the example embodiment, a peripheral display 30 is an output device that presents visual images based upon information communicated through a display cable 28 and/or wireless communication by WNIC 24. In the example embodiment, peripheral keyboard 40 and peripheral mouse 46 are input devices that accept end user inputs for communication to CPU 14, such as through a cable or wireless interface managed by embedded controller 22. Peripheral keyboard 40 has plural key caps 42 that press down to accept input values, such as those defined by a QWERTY keyboard. Key caps 42 are guided between a raised and depressed position with a keyboard frame 44 supporting each key cap in a travel range and aligned to contact a sensor under each key cap. Each key cap includes a biasing device that raises the key cap to the raised position after an end user input. Peripheral mouse 46 includes a position sensor that tracks mouse movement and translates the mouse movement to a cursor movement for presentation at the display. Peripheral mouse 46 includes buttons 48 that press down to accept end user inputs and a scroll wheel 50 that rotates to command a scroll of displayed information. In various embodiments, peripheral keyboard 40 and peripheral mouse 46 may have different configurations to accept key press inputs and position reporting. In one embodiment, the improvements to peripheral keyboard 40 may also be applied to improve integrated keyboard 36 of portable information handling system 32.

Figure 2:
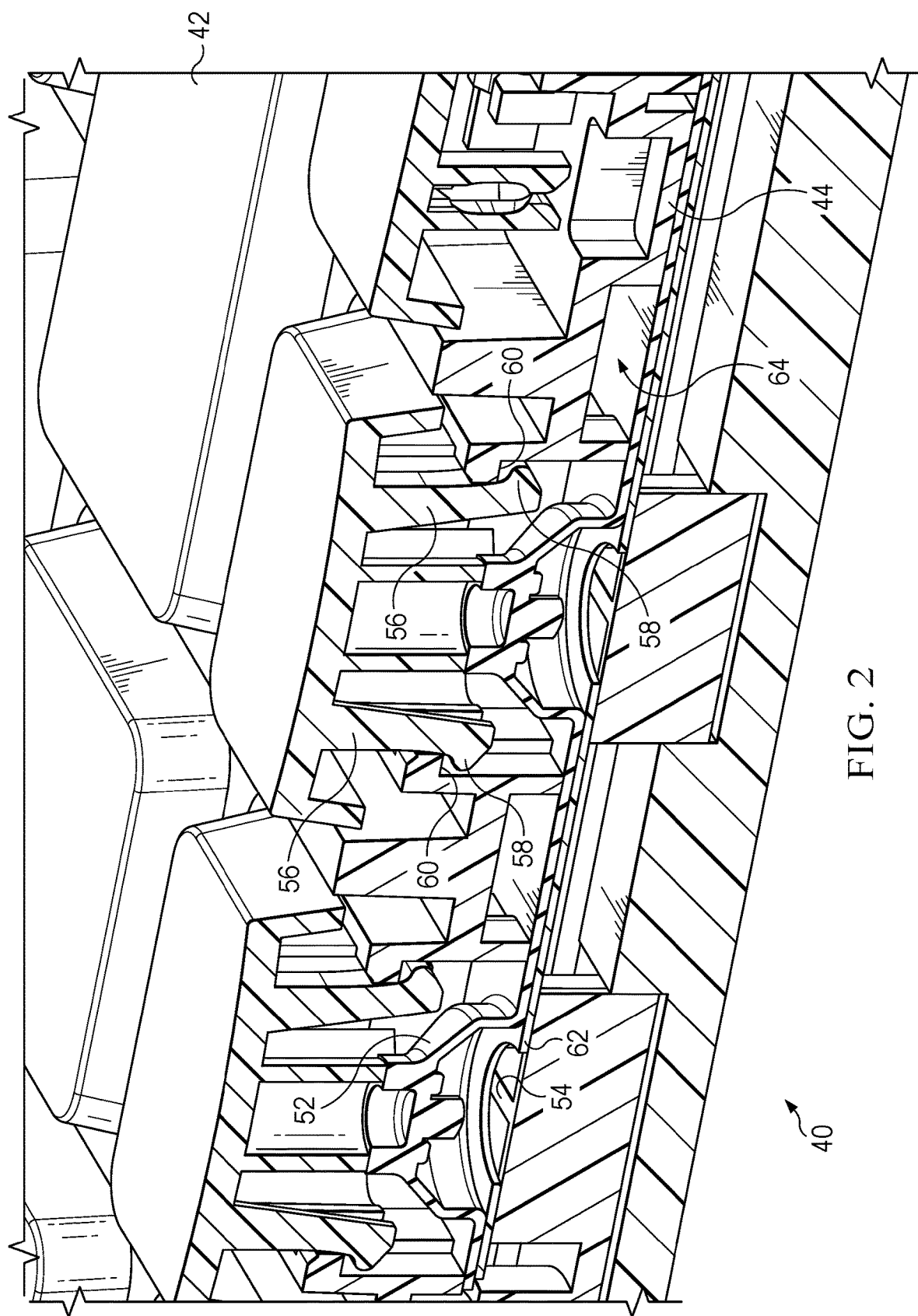
FIG. 2 depicts an upper perspective sectional view of a peripheral keyboard to illustrate the key cap vertical travel within a keyboard frame.

Referring now to FIG. 2, an upper perspective sectional view of a peripheral keyboard 40 depicts key cap 42 vertical travel within a keyboard frame 44. Key cap 42 engages with frame 44 at a vertical member 56 that extends from the bottom surface of key cap 42 into frame 44. The raised position of key cap 42 vertical travel is defined by an extension 58 from vertical member 56 towards frame 44 and against a stop 60 having a lower side surface that meets against the upper surface of extension 58. A rubber dome 52 presses up against a central area of the bottom side of key cap 42 to bias key cap 42 to the raised position. When an end user presses down on key cap 42 to overcome the bias of rubber dome 52, the central bottom portion of key cap 42 contacts an input switch sensor 54 that detects the key input, such as a pressure switch disposed in a conventional membrane 62 having a key input matrix to report the key input values associated with the key cap to an embedded controller. A frame cavity 64 is defined by the frame between each key cap as an empty space at the periphery around the key cap. During normal operation, audible sound is generated when a key cap is released from an input, extension 58 contacts step 60 at the raised position. This audible sound can be amplified within frame cavity 64.

Figure 3:
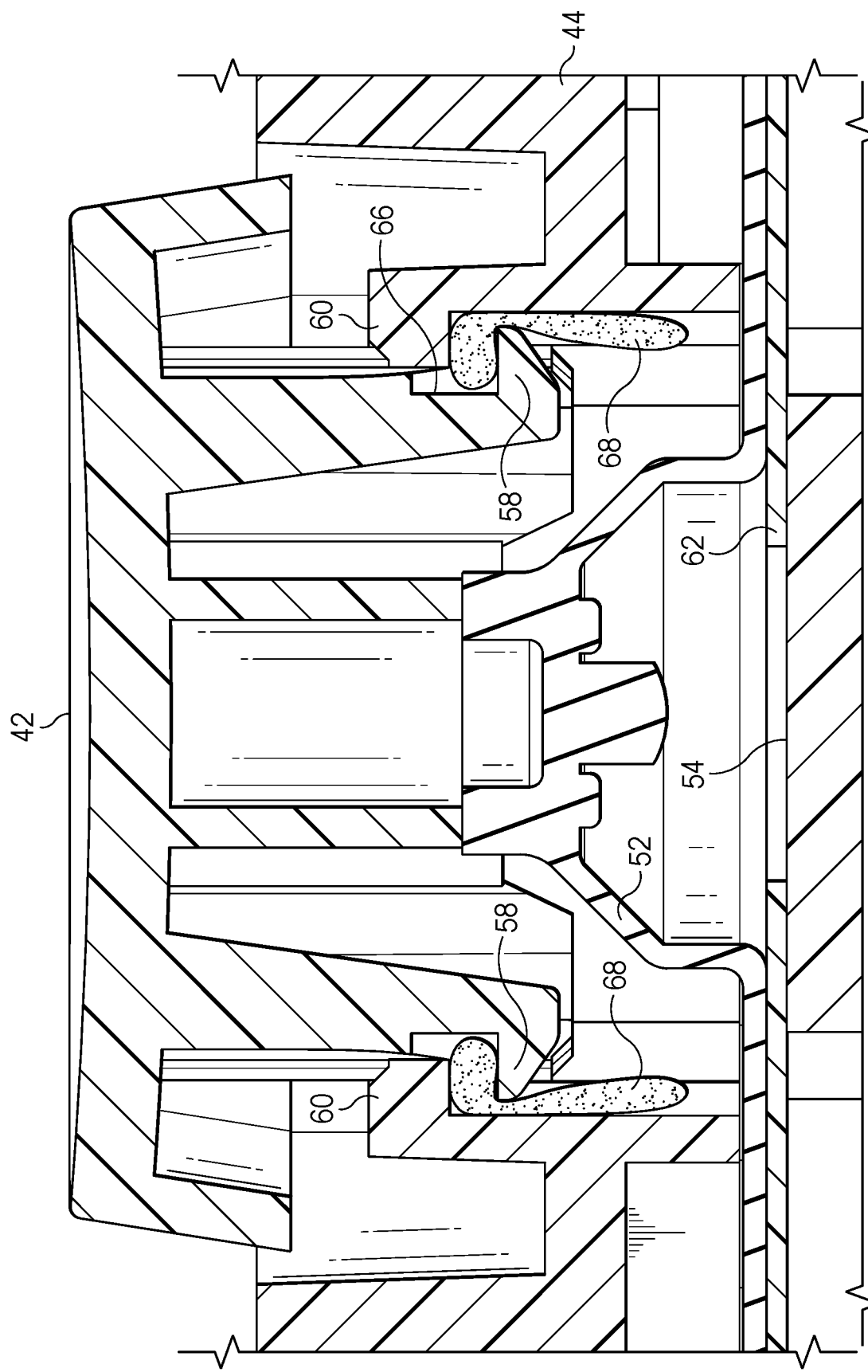
FIG. 3 depicts a side sectional view of a key cap in a raised position with audible sound associated with contact of the extension and stop dampened by a fluid reservoir.

Referring now to FIG. 3, a side sectional view depicts a key cap 42 in a raised position with audible sound associated with contact of the extension 58 and stop 60 dampened by a fluid reservoir 66. As described above, the vertical travel range of key cap 42 is defined at a raised position by engagement of stop 60 and extension 58 and at the bottom position by impact of rubber dome 52 inner member against the input sensor 54 of membrane 62. Fluid reservoir 66 couples to key cap 42 at the upper side of extension 58 to dampen audible noise created when key cap 42 biases upward against stop 60. In the example embodiment, a lubrication oil 68 is injected to the travel region of frame 44 to further dampen the noise and also reduce resistance associated with key travel within the vertical travel channel defined by frame 44 for each key. In an alternative embodiment, lubrication oil 68 may also be stored in a reservoir positioned at the bottom side of stop 60 to dampen contact against extension 58. In one embodiment, a fluid reservoir is placed on both extension 58 and stop 60 and aligned to contact in the raised position to reduce noise created when key cap 42 gets to the raised position.

Figure 4:
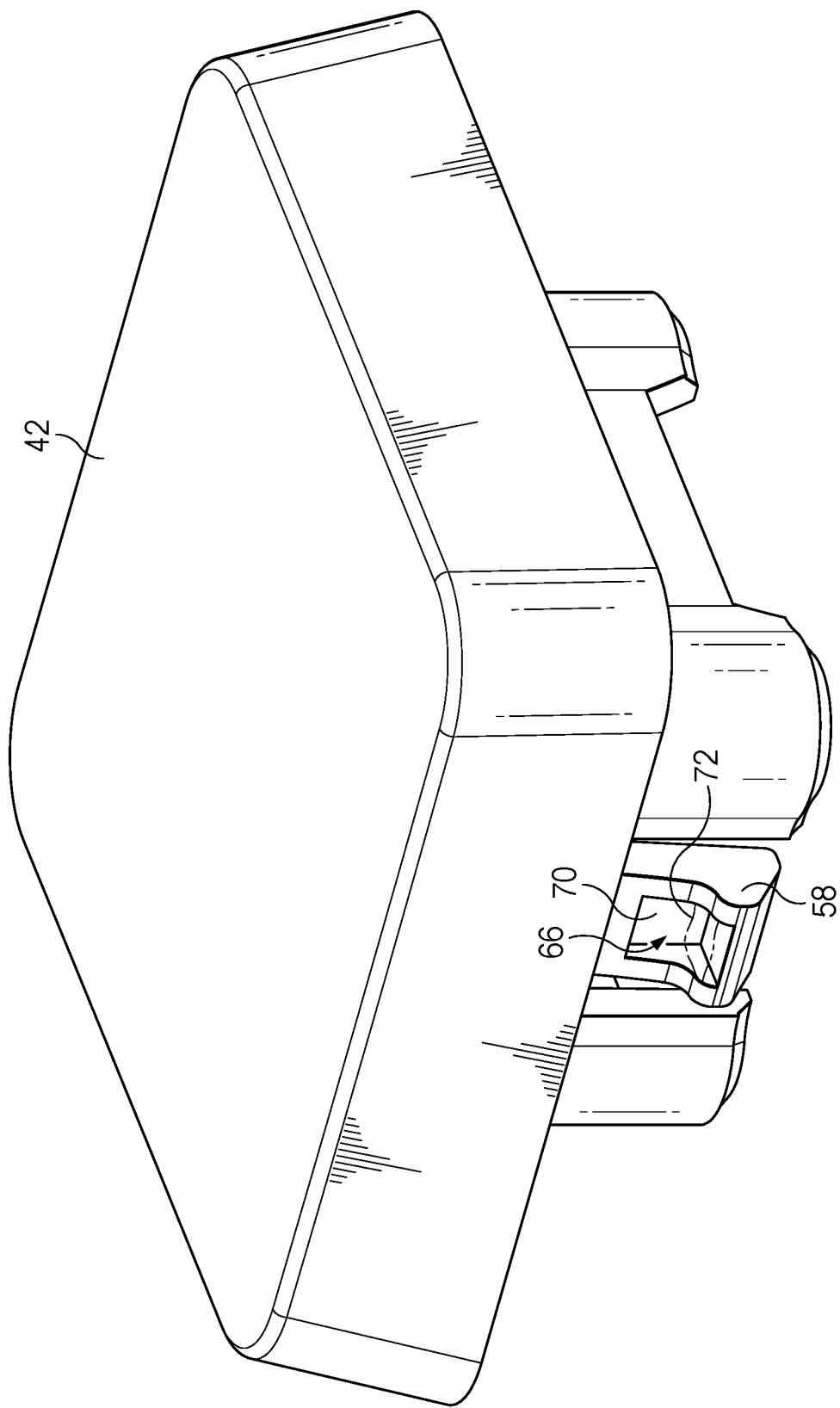
FIG. 4 depicts an upper perspective view of a key cap having an example embodiment of a fluid reservoir at a key cap extension.

Referring now to FIG. 4, an upper perspective view of a key cap 42 illustrates an example embodiment of a fluid reservoir at a key cap extension 58. Fluid reservoir 66 has an outer membrane 70, such as an elastic plastic, that encloses a fluid 72. Membrane 70 couples in place at extension 58 with an adhesive, such as in a cavity formed to accept the membrane shape. Fluid 72 is an oil and or grease fluid that encloses in membrane 70 to absorb a physical contact against a frame stop and dampen noise associated with contact against the frame stop by extension 58. As an example, fluid 72 is an oil, such as a silencer oil having a grease composition, available from FUMIO at www.fumio.com.tw. In alternative embodiments, other types of fluids may be used, and a membrane to enclose the fluid may be used at both the extension and the stop to further dampen noise associated with key cap contact. Although the noise reduction techniques described herein are in the context of a peripheral keyboard, they may also be used within an integrated keyboard of a portable information handling system.

Figure 5:
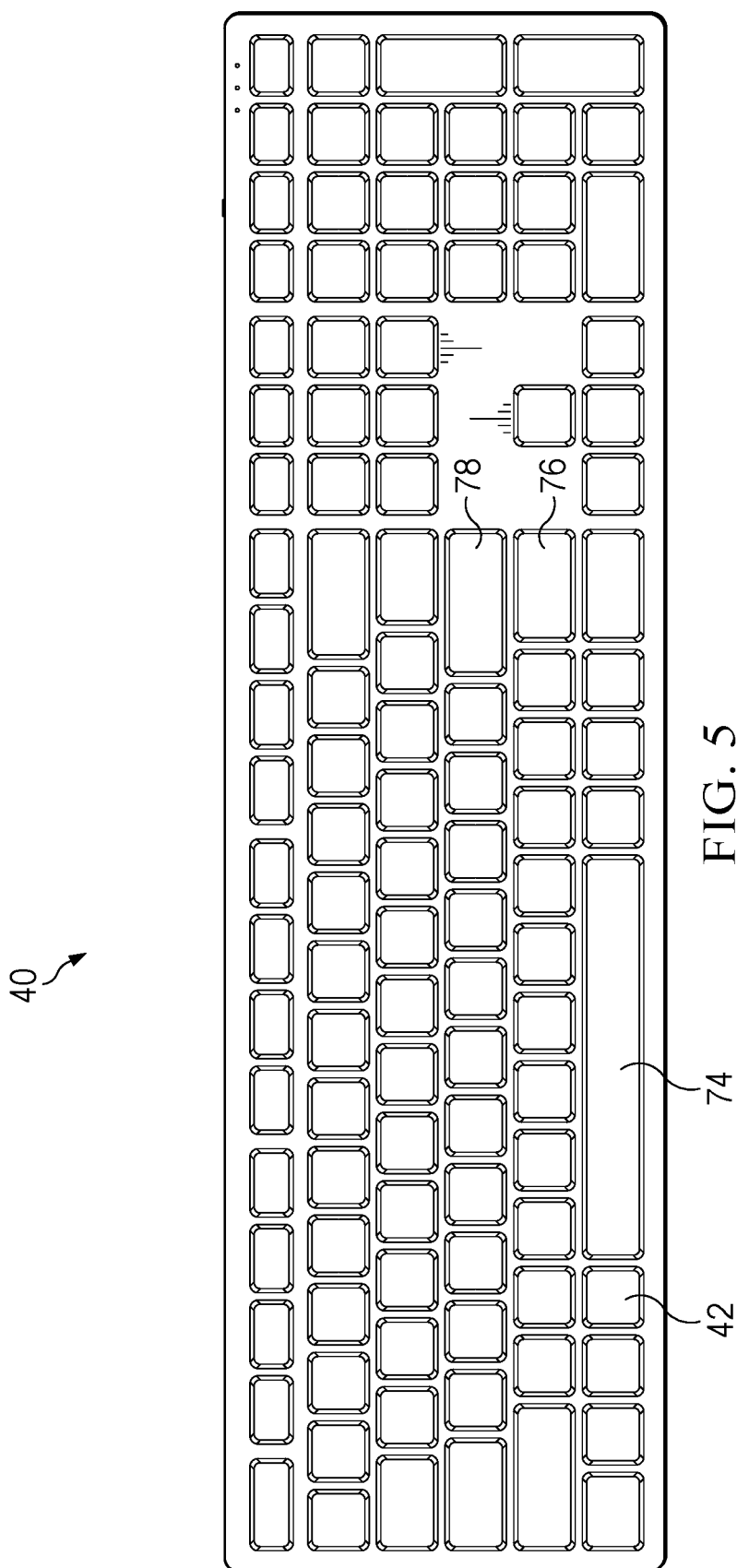
FIG. 5 depicts a top view of a peripheral keyboard with plural keys of different sizes.

Referring now to FIG. 5, a top view depicts a peripheral keyboard 40 with plural key caps 42 of different sizes. In addition to QWERTY key caps that each have a letter or number, a larger space bar 74 has a length of approximately 6 letter key caps, a shift key cap 76 has a length of three letter key caps and an enter key cap 78 has a length of approximately two key caps. Each of these key caps has a similar vertical travel as a letter/number key cap but can have some difficulty maintaining a level movement across the length of the key when depressed and raised. Additional structure can help to ensure level vertical movement of the key cap but tends to increase the audible noise associated with key presses and key return to the raised position. In the example of space bar 74, a metal balancing bar coupled to the keyboard frame and the key cap maintain the space bar level during vertical travel and prevent tilting when pressed at the ends, however, the metal balancing bar can introduce rattling noise during spacebar movement.

Figure 6:
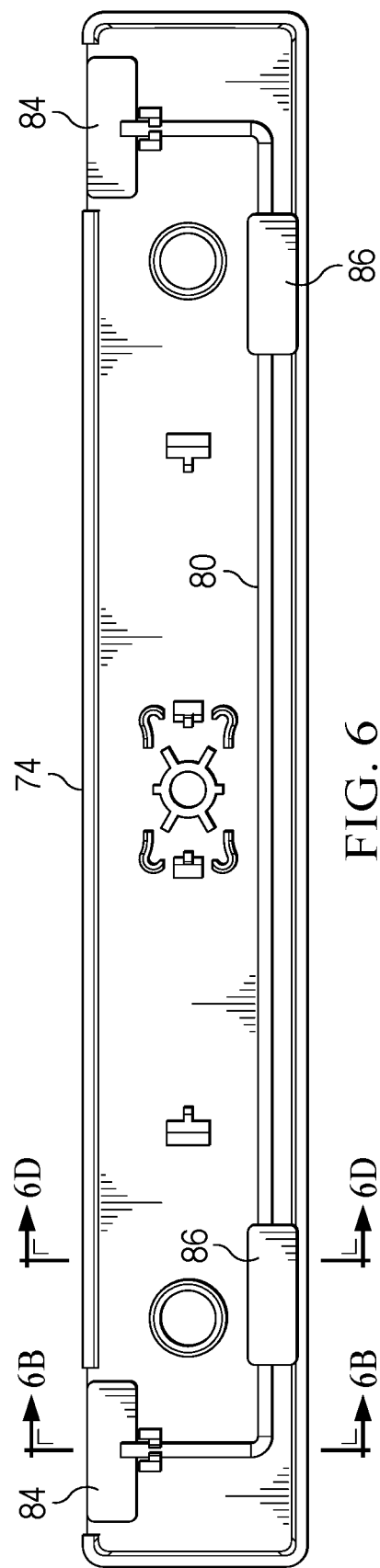
Figure 6A:
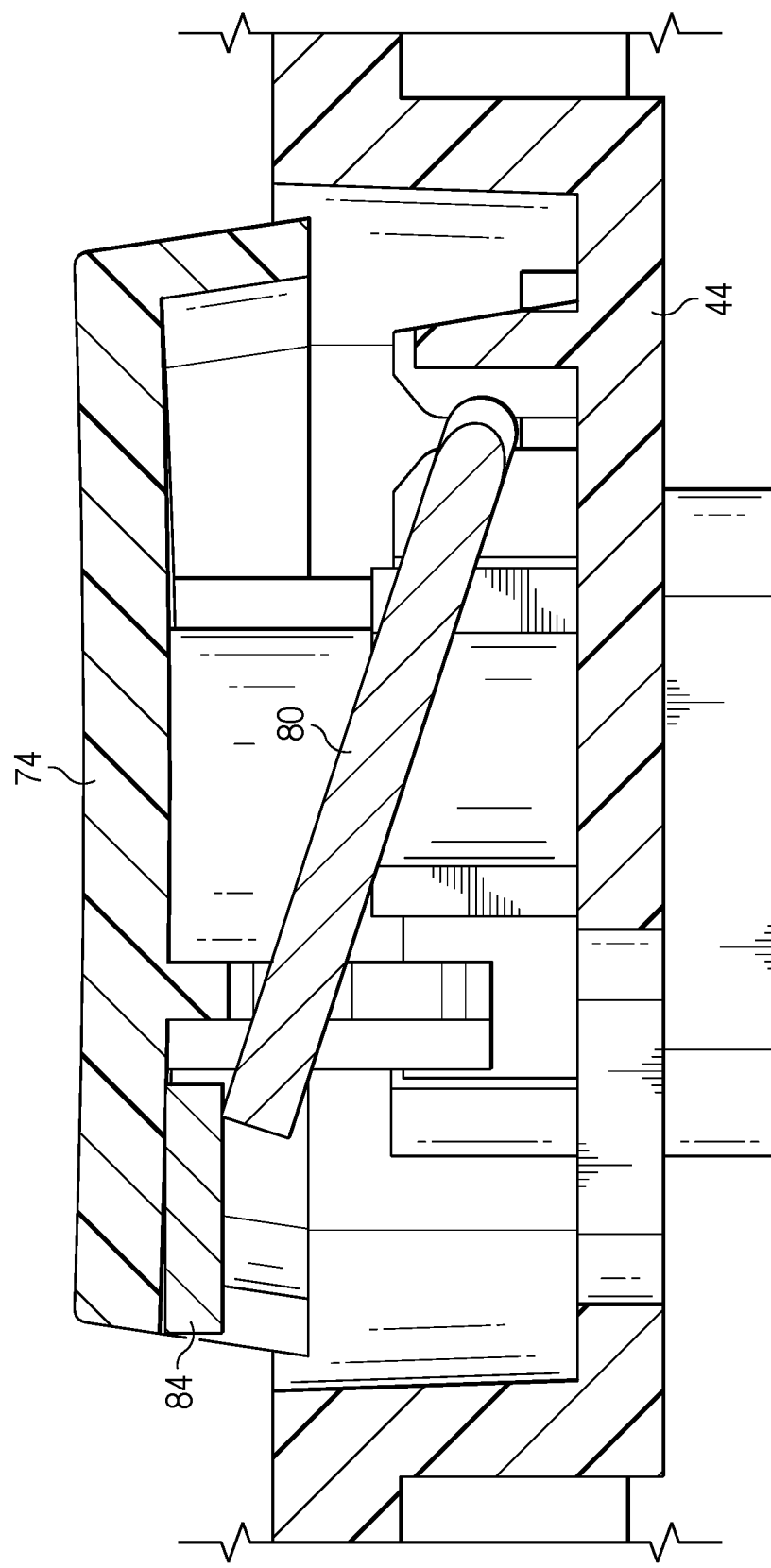
Figure 6B:
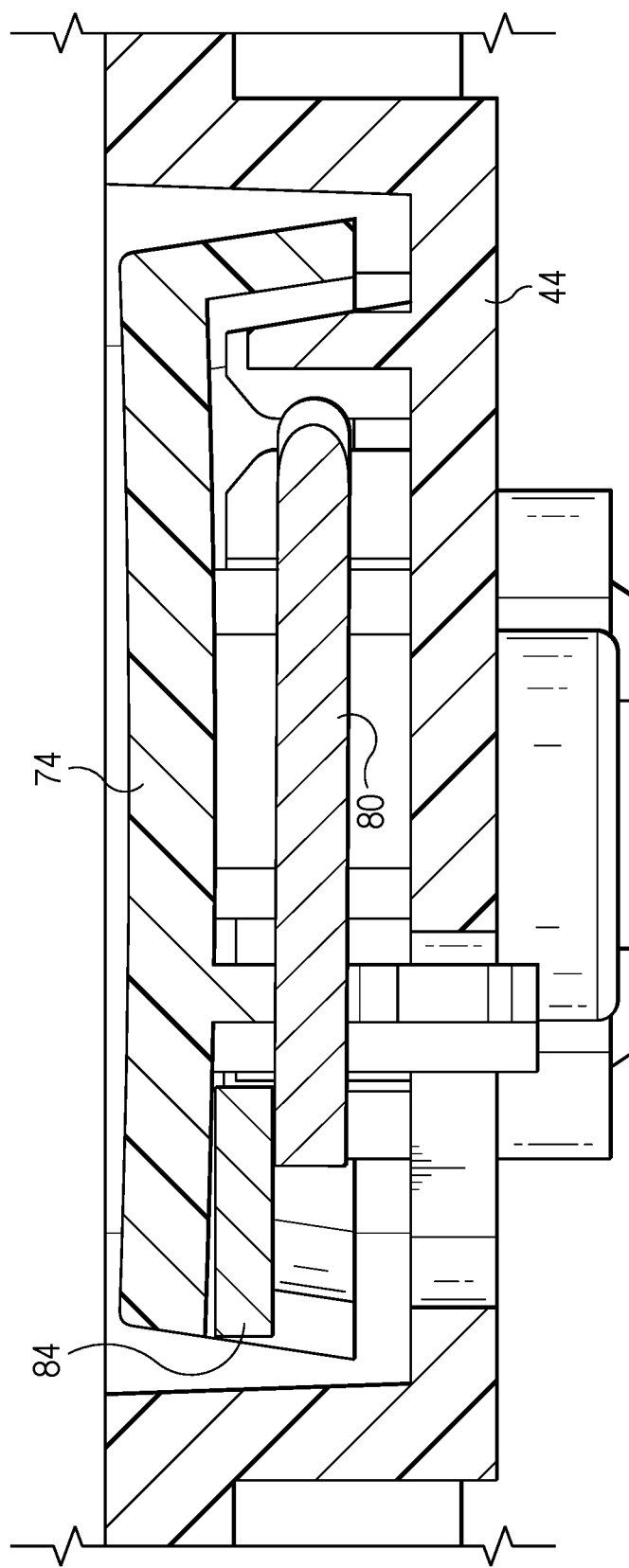
Figure 6D:
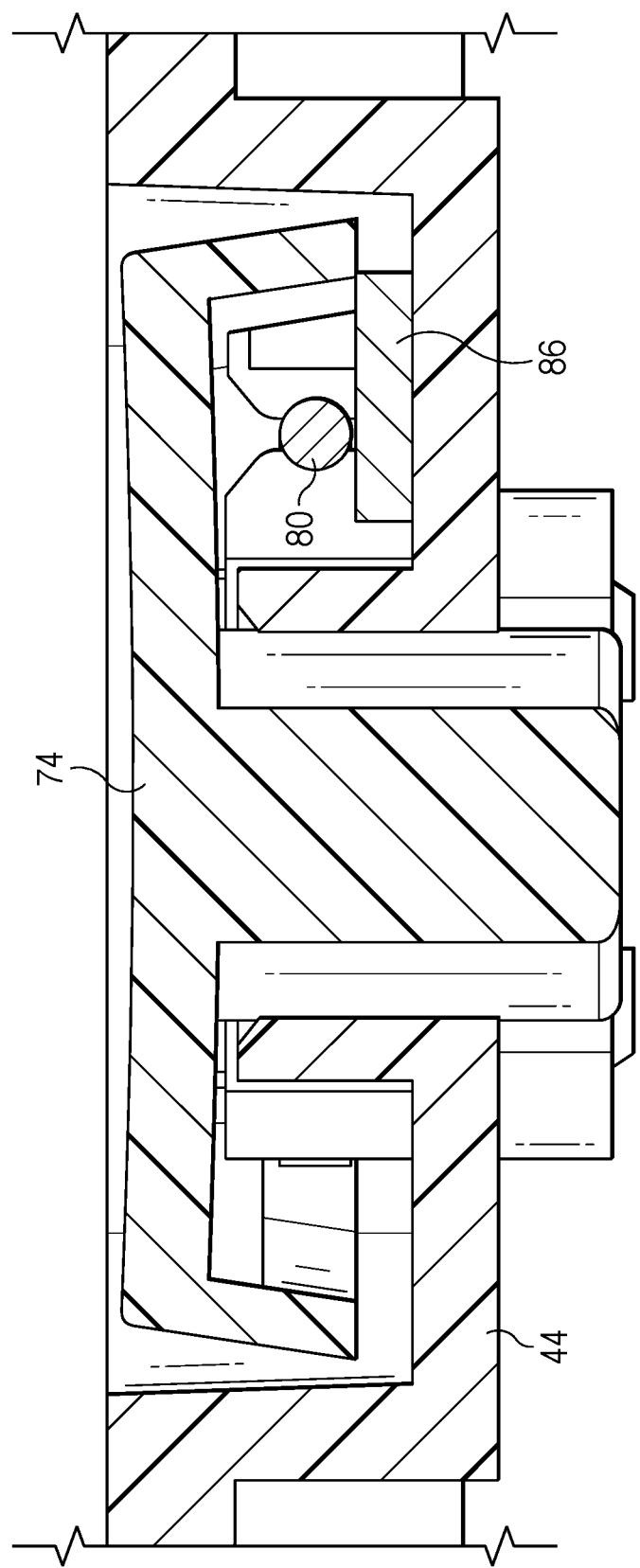

Referring now to FIGS. 6, 6A, 6B, 6C and 6D, a space bar key cap 74 is maintained in a level orientation when depressed and returned to the raised position by a metal balancing bar 80 having audible sounds damped with magnets. FIG. 6 depicts spacebar key 74 from a bottom side showing the position of metal balancing bar 80, spacebar magnets 84 that travel vertically with the spacebar keycap and base magnets 86 that couple the keyboard frame to minimize metal balancing bar 80 rattle at a pivot axis. FIG. 6A depicts a sectional view AA from FIG. 6 with spacebar key cap 74 in a raised position having spacebar magnet 84 magnetically attracting metal balancing bar 80 to reduce rattling noise. The opposing ends of metal balancing bar 80 remain at a similar height to keep the spacebar key cap level through vertical travel, and both ends have an associated spacebar magnet 84 to keep the ferromagnetic material of metal balancing bar 80 against the spacebar keycap through motion to eliminate rattle of the metal against the spacebar plastic surface. FIG. 6B depicts a sectional view AA from FIG. 6 with spacebar key cap 74 in a lowered position having spacebar magnet 84 magnetically attracting metal balancing bar 80 to prevent rattle or other noise. Spacebar key cap 74 travels in a vertical channel defined by frame 44 with metal balancing bar 80 rotating to a substantially parallel orientation relative to frame 44. FIG. 6C depicts a sectional view BB from FIG. 6 with spacebar key cap 74 in a raised position having base magnet 86 positioned to attract metal balancing bar 80 towards the bottom surface of frame 44. FIG. 6D depicts a sectional view BB from FIG. 6 with spacebar key cap 74 in a lowered position having base magnet 86 positioned to attract metal balancing bar 80 towards the bottom surface of frame 20. By maintaining magnetic attraction with base magnet 86 to metal balancing bar 80 during rotation, the axis of metal balancing bar 80 remains flat against the base of frame 44 to reduce rattle noise when the tips move vertically against the spacebar key cap.

Figure 7:
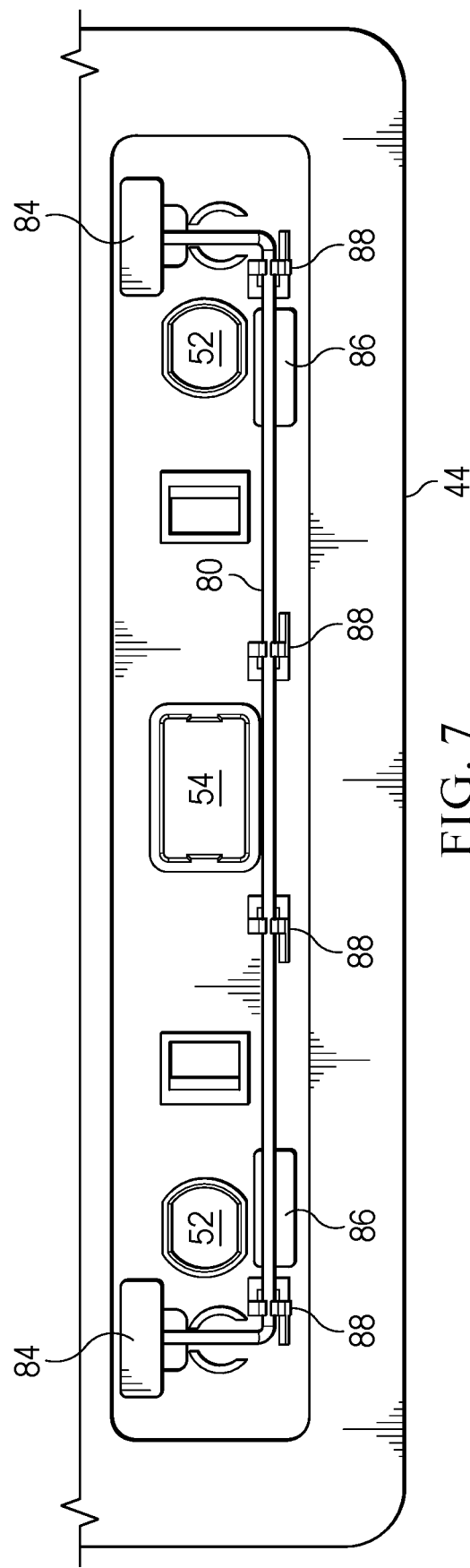
FIG. 7 depicts a top view of the keyboard spacebar key cap area with the spacebar key cap removed.

Referring now to FIG. 7, a top view depicts the keyboard spacebar key cap area with the spacebar key cap removed. Metal balancing bar 80 clips into positions with clips 88 that couple to frame 44. An input switch 54 at a central location detects presses of the spacebar key cap against the input membrane to report inputs. Dual rubber domes 52 at each side of the spacebar key cap bias the key cap upwards and away from the bottom surface of frame 44. Base magnets 86 magnetically attract metal balancing bar 80 towards frame 44 to prevent rattle against the frame and spacebar magnets 84 attract the opposing ends of metal balancing bar 80 against the spacebar key cap to prevent rattle at the contact location of the spacebar key cap. In one example embodiment, including magnets to reduce rattle of the balance bar decreases noise associated with movement of the spacebar by substantially 12 dB.

Figure 8:
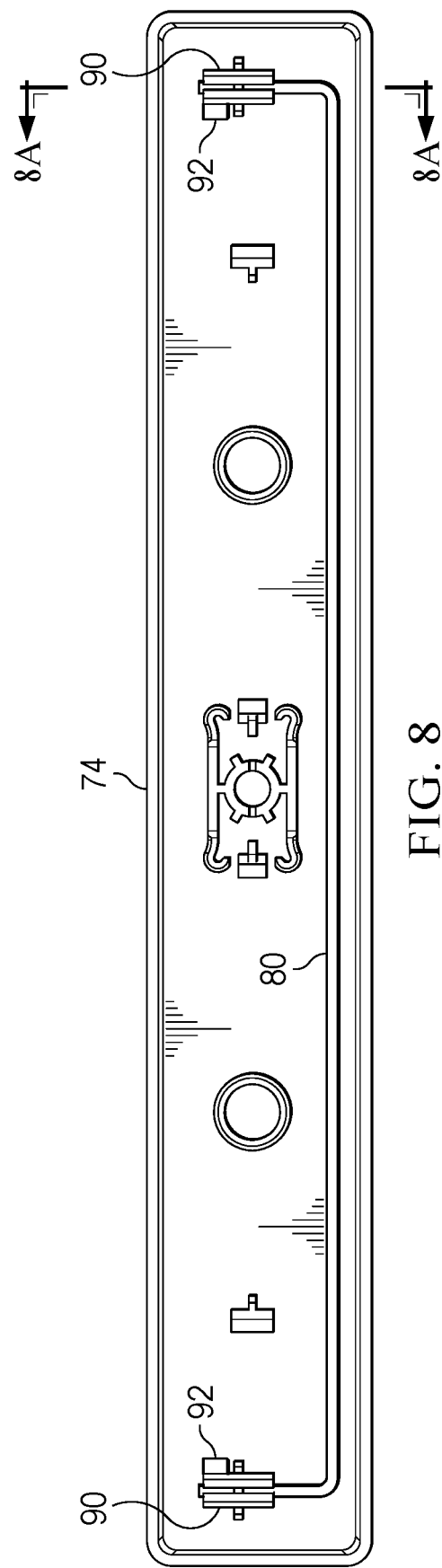
FIGS. 8, 8A and 8B depict a bottom view of the spacebar key cap having an example embodiment of an alternative arrangement of magnets to manage metal balancing bar rattle.
Figure 8A:
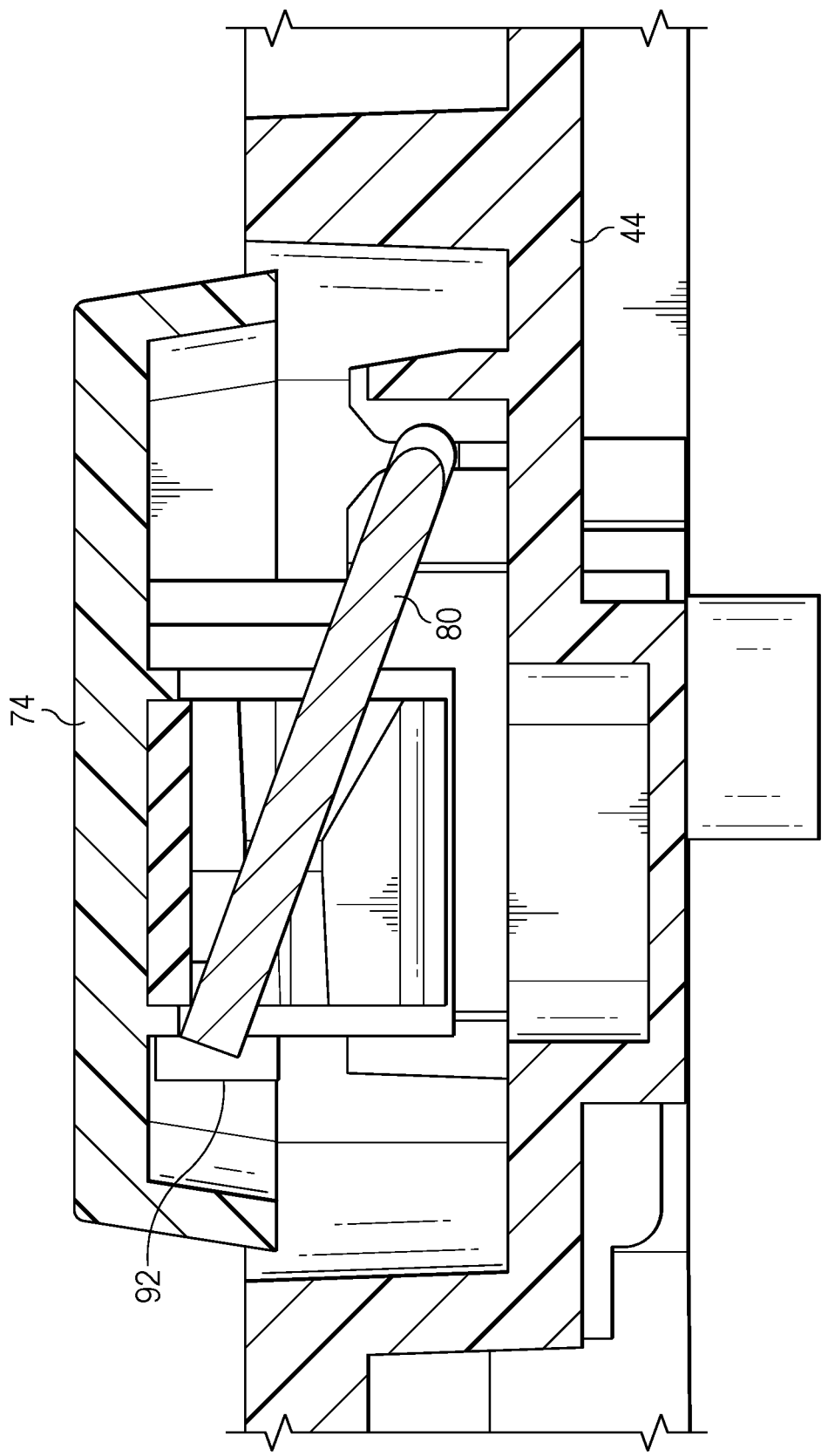
Figure 8B:
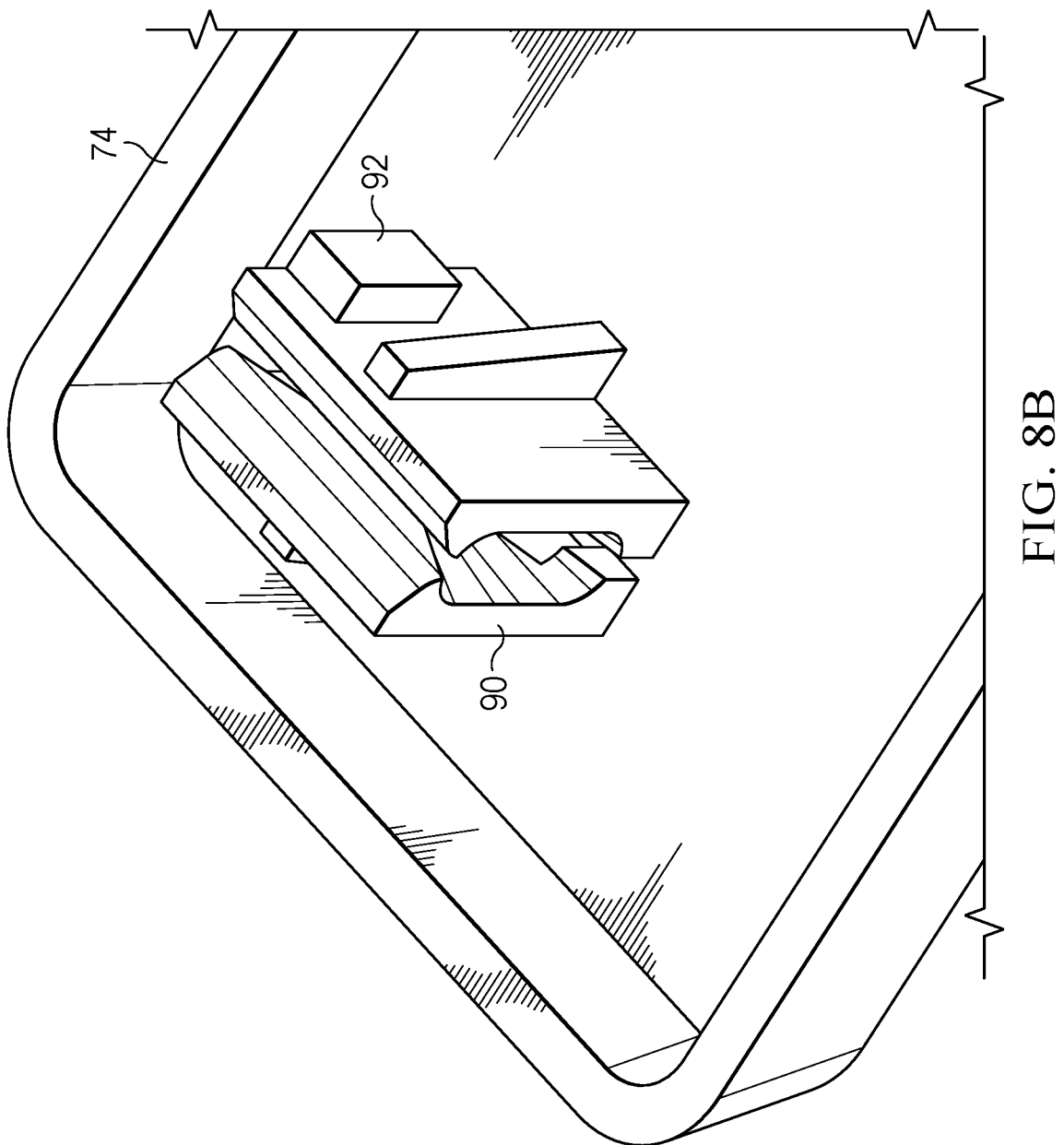

Referring now to FIGS. 8, 8A and 8B, an example embodiment depicts a bottom view of the spacebar key cap 74 having an alternative arrangement of magnets to manage metal balancing bar 80 rattle. In the example embodiment, a side clip 90 coupled to spacebar key cap 74 at each opposing end of metal balancing bar 80 presses against the ends of metal balancing bar 80 to reduce rattle, such as by including a cushion that reduces acoustic noise. A magnet 92 couples to the side of the clip to magnetically attract the metal balancing bar tip within the side clip 90 and thereby further reduce the rattle. FIG. 8A depicts a side sectional view of spacebar key cap 74 with magnet 92 aligned to the metal balancing bar 80 tip through rotation between raised and lowered positions within frame 44. FIG. 8B depicts a detailed view of side clip 90 coupled to spacebar key cap 74 and configured to grasp the metal balancing bar tip with magnet 92 placed at the metal balancing bar tip end to reduce rattle. The side clip may be used in conjunction with other magnets, such as those depicted in FIGS. 6 and 7, and also with cushions as described below with respect to FIG. 9.

Figure 9:
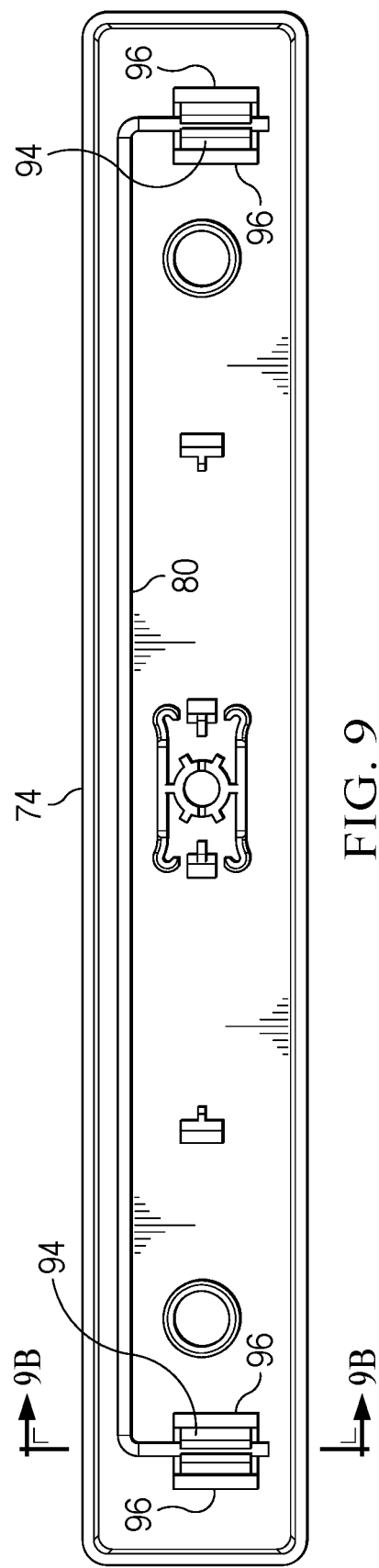
FIGS. 9, 9A, 9B and 9C depict a bottom view of the spacebar key cap having another example embodiment for managing space bar rattle.
Figure 9A:
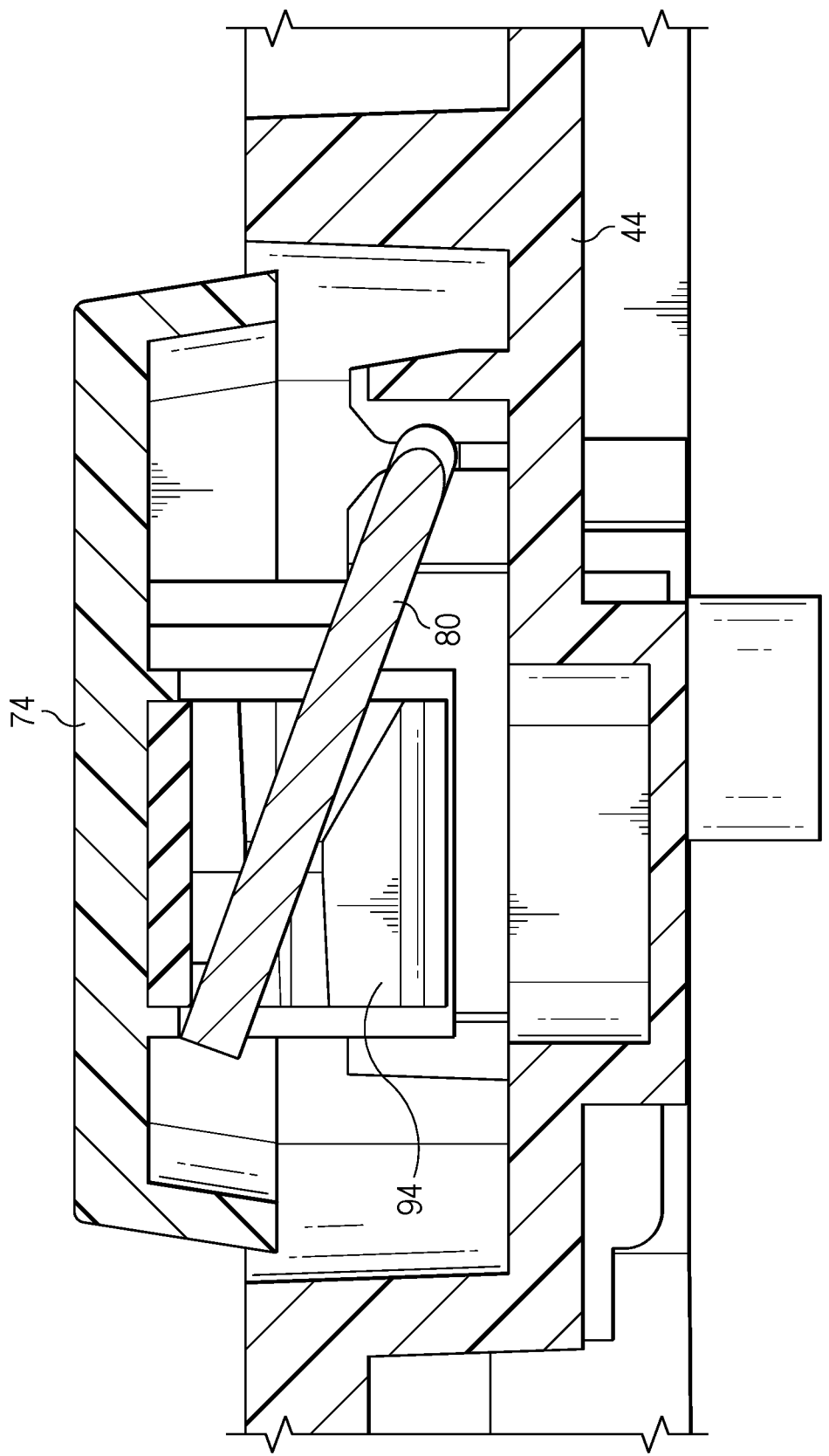
Figure 9B:
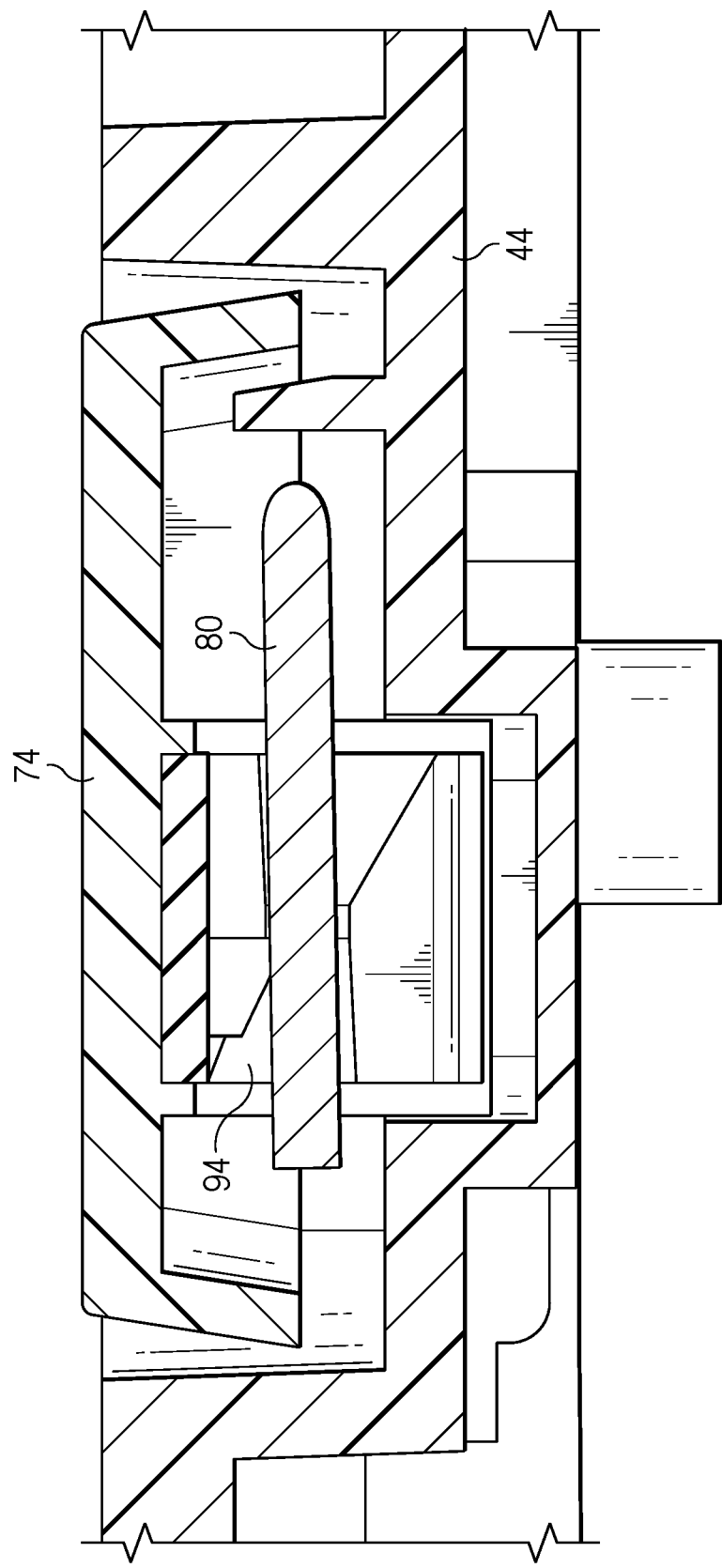
Figure 9C:
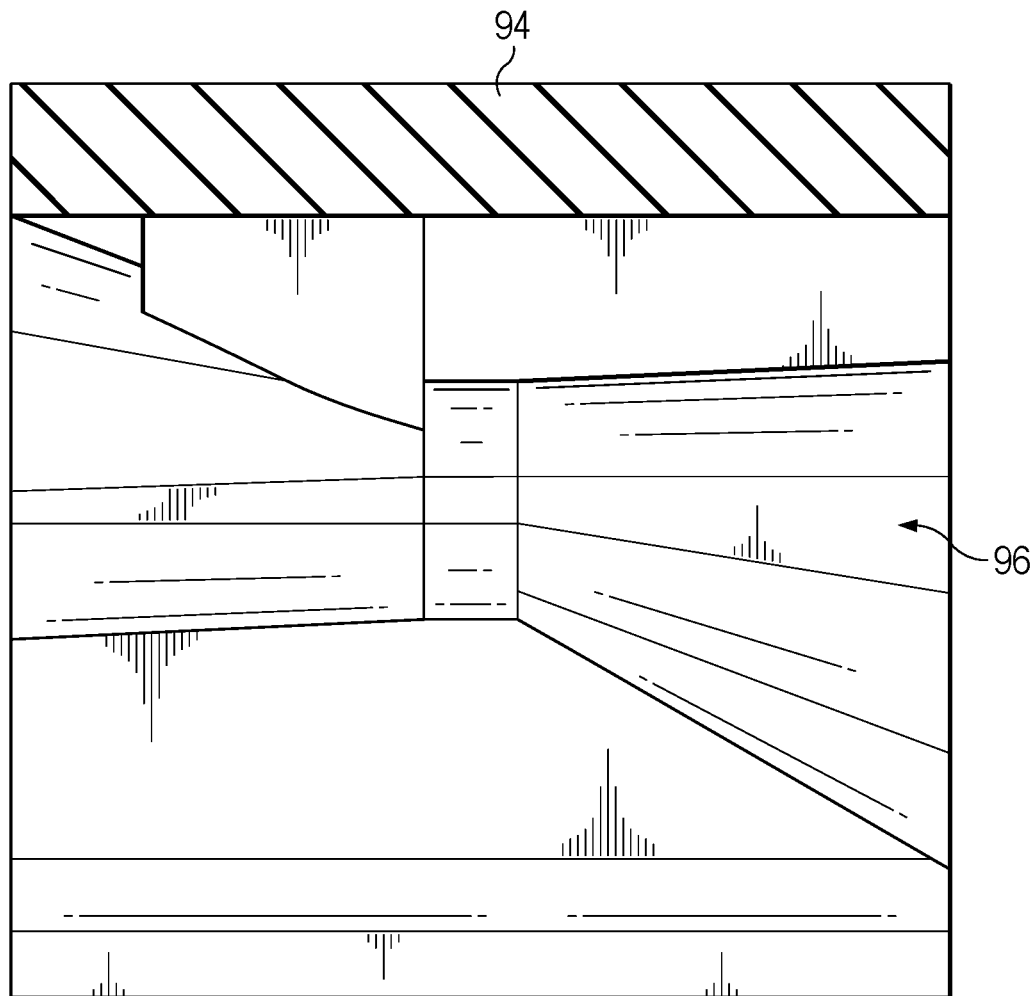

Referring now to FIGS. 9, 9A, 9B and 9C, a bottom view of the spacebar key cap 74 depicts another example embodiment for managing space bar rattle. Metal balancing bar 80 couples at opposing ends to a rubber cushion 94, such as a rubberized silicon material, that dampens vibrations to reduce rattle acoustics. Rubber cushion 94 couples to spacebar key cap 74 with a retainer 96 extending from the bottom surface of the key cap. For instance, rubber cushion 94 couples with adhesive to retainer 96 formed as a plastic injection part. FIGS. 9A and 9B depict a sectional view AA as indicated by FIG. 9 of the spacebar key cap 74 in a raised position and depressed position respectively. As indicated by the side view of rubber cushion 94 in FIG. 9C, a retainer 96 is formed in the rubber cushion that defines motion of the end of metal balancing bar 80 when spacebar key cap 74 travels between the raised and depressed positions. The cushioning of the metal balancing bar contact point with rubber cushion 94 within retainer 96 reduces vibration during movement resulting in reduced acoustic noise. As the key cap moves vertically within frame 44, retainer 96 is shaped to maintain contact against metal balancing bar 80 so that vibrations are dampened. These various spacebar key cap acoustic management techniques as described above may be applied to an integrated keyboard of a portable information handling system and to key caps of smaller sizes than the space bar.

Figure 10:
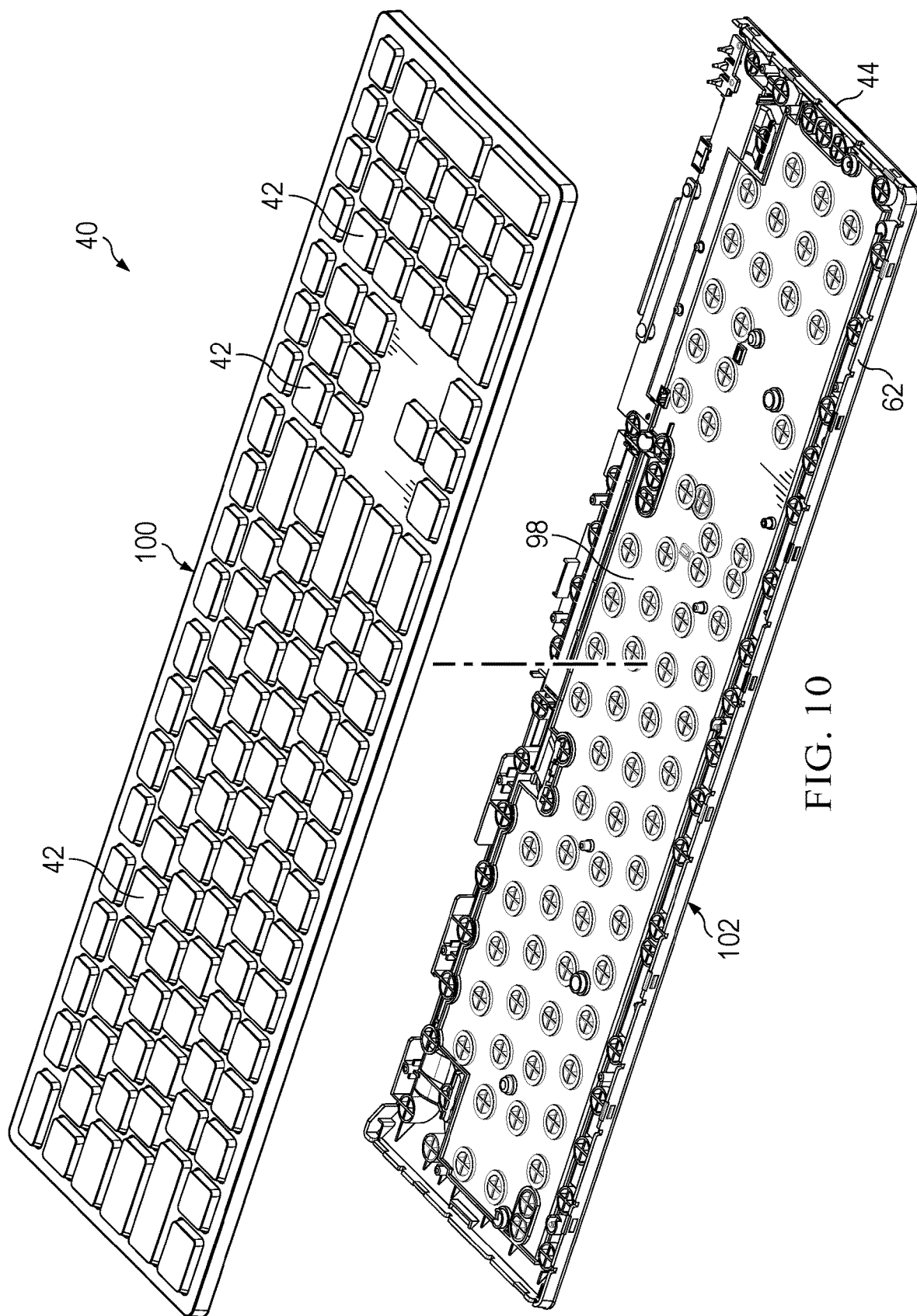
FIG. 10 depicts an exploded perspective view of a peripheral keyboard with an example embodiment having a noise dampener layer that diverts spilled liquids to a trench drain.

Referring now to FIG. 10, an exploded perspective view of a peripheral keyboard 40 depicts an example embodiment having a noise dampener layer that diverts spilled liquids to a trench drain. A top frame 100 and key caps 42 couple to a frame 44 to enclose a keyboard printed circuit board 102, membrane 62 and an audible dampener 98 disposed over membrane 62. Audible dampener 98 is, for instance, a silicon structure that fills voids between key caps 42 to dampen noise and echoes related to key cap actuations. In the example embodiment, audible dampener 98 is a solid sheet soft silicon rubber material having openings cut where rubber domes and input sensors are located so as not to interfere with key cap inputs. In an alternative embodiment, audible dampener 98 may be cut into small pieces that fill just the frame cavity between key caps.

Figure 11:
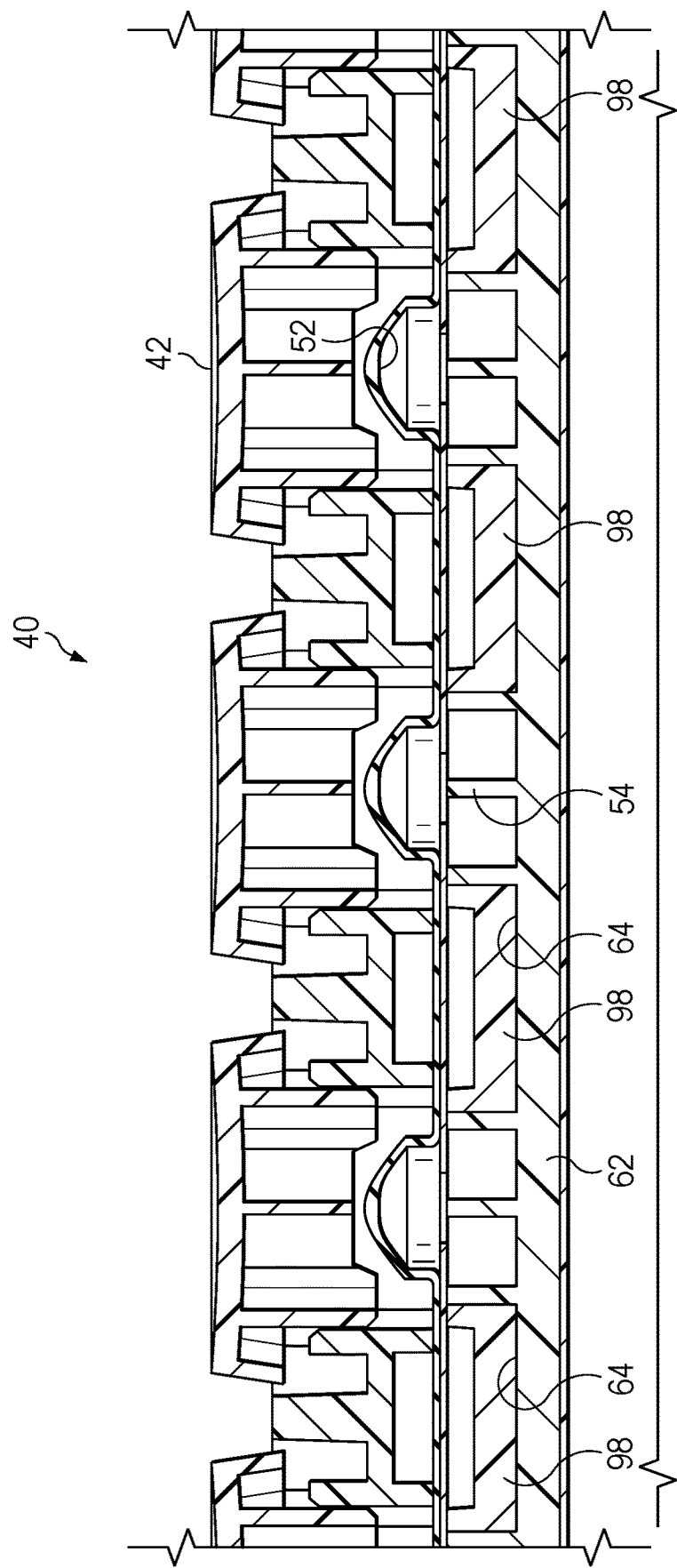
FIG. 11 depicts a side sectional view of a keyboard having an audible dampener disposed in the frame cavities between the key caps to dampen sounds that tend to echo out from the frame cavities.

Referring now to FIG. 11, a side sectional view depicts keyboard 40 having audible dampener 98 disposed in frame cavities 64 between key caps 42 to dampen sounds that tend to echo out from the frame cavities. When a key cap 42 depresses from the raised position to compress rubber dome 52 against membrane 62 having an input sensor 54, the noise associated with the input is dampened outside the key cap 42 periphery by audible dampener 98. Similarly, when key cap 42 is released to bias upwards to the raised position, noise created by the impact of the key cap extension against the frame stop is also dampened by audible dampener 98. Empty air pockets with in frame cavities 64 that tend to echo and amplify sound are filled with a silicon or similar material that dampens noise propagation, thereby reducing audible sounds associated with keyboard inputs.

Figure 12:
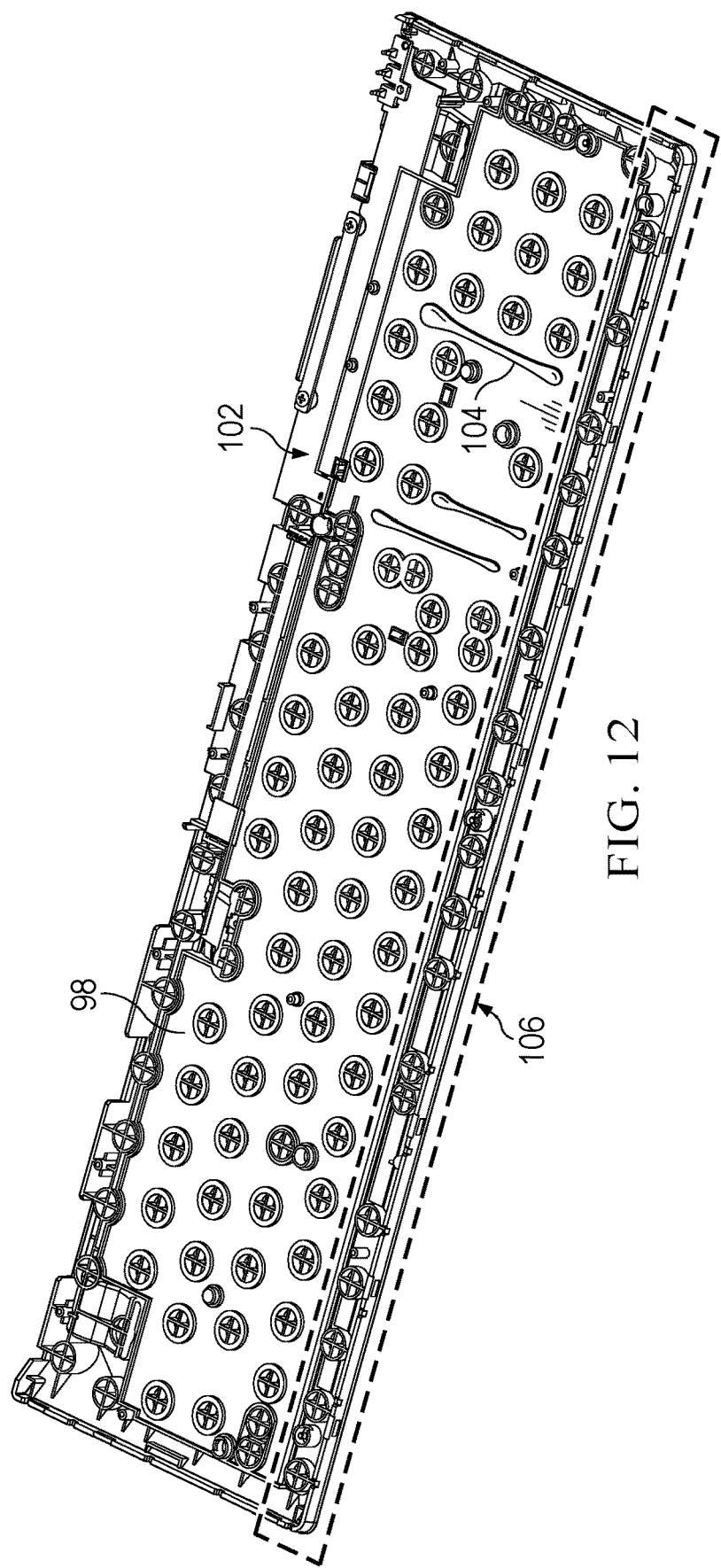
FIG. 12 depicts an upper perspective view of the keyboard having the audible dampener disposed over the membrane to illustrate a secondary function of the audible dampener as protecting against liquid spills.

Referring now to FIG. 12, an upper perspective view of the keyboard having audible dampener 98 disposed over the membrane illustrates a secondary function of the audible dampener as protecting against liquid spills. When deployed and operational, the keyboard typically has taller feet at a rear side that raise the rear relative to the front side for improved typing. Printed circuit board 102 at a rear position is less likely to have exposure to water 104 in the event of a leak. Audible dampener 98 protects the separate underlying membrane from liquid damage by draining spilled water (or other fluid) downward and towards a trench drain 106 at the front side of the keyboard. In one example embodiment, the silicon or similar material selected for audible dampener 98 is selected to encourage surface tension of spilled water so that the water travels towards trench drain 106. In another embodiment, the thickness of the audible dampener 98 is tapered towards the front and between rubber domes to help drain liquid towards trench drain 106.

Figure 13:
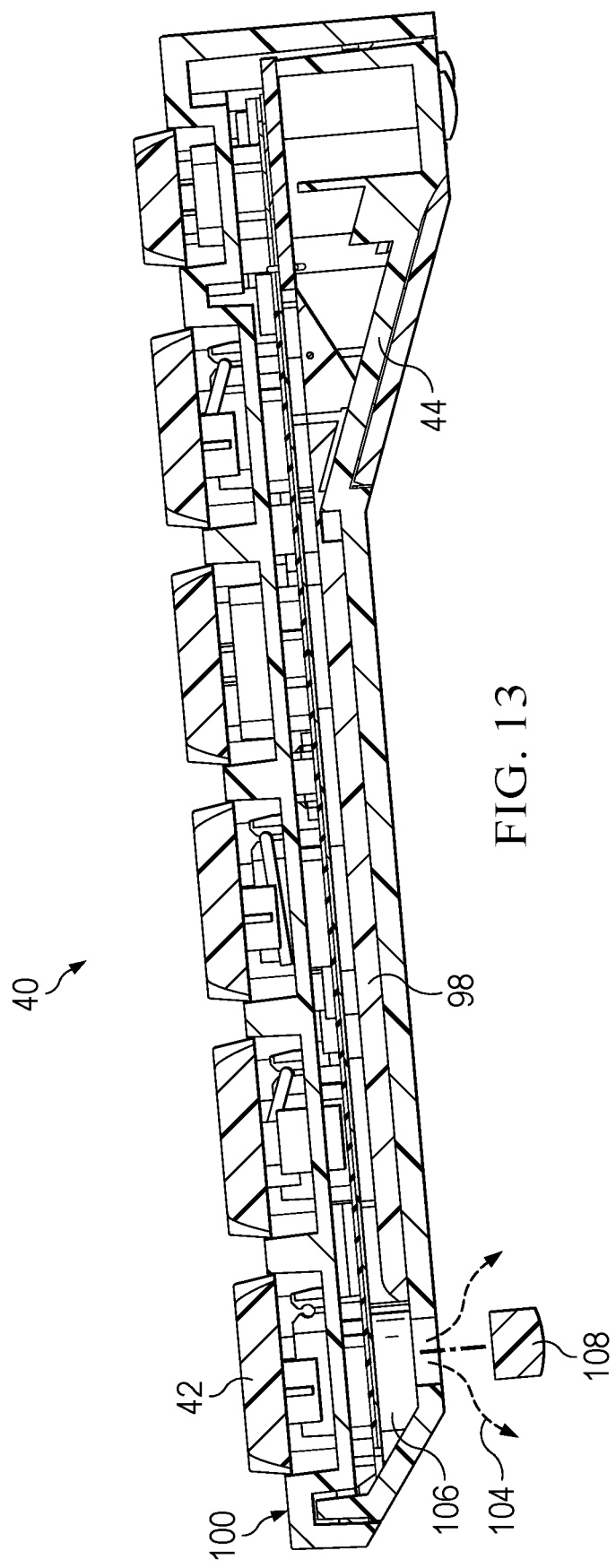
FIG. 13 depicts a side sectional view of the keyboard having a drain opening configured to remove liquid from the trench drain.

Referring now to FIG. 13, a side sectional view of keyboard 40 depicts a drain opening cap 108 configured to remove liquid 104 from trench drain 106. In the example embodiment, keyboard 40 is elevated at a rear side so that gravity drains spilled fluid along audible dampener 98 towards drain trench 106. Fluid that enters the keyboard tends to enter at a periphery of a key cap 42 and drain to audible dampener 98 where the fluid is directed towards trench drain 106. When drain opening cap 108 is removed at trench drain 106, liquid 104 is allowed to drain out of keyboard 40. In the example embodiment, audible dampener 98 extends from the rear side to the rear side of the most front row of key caps 42 to define the space of the trench drain 106 where water can pool.

Figure 14:
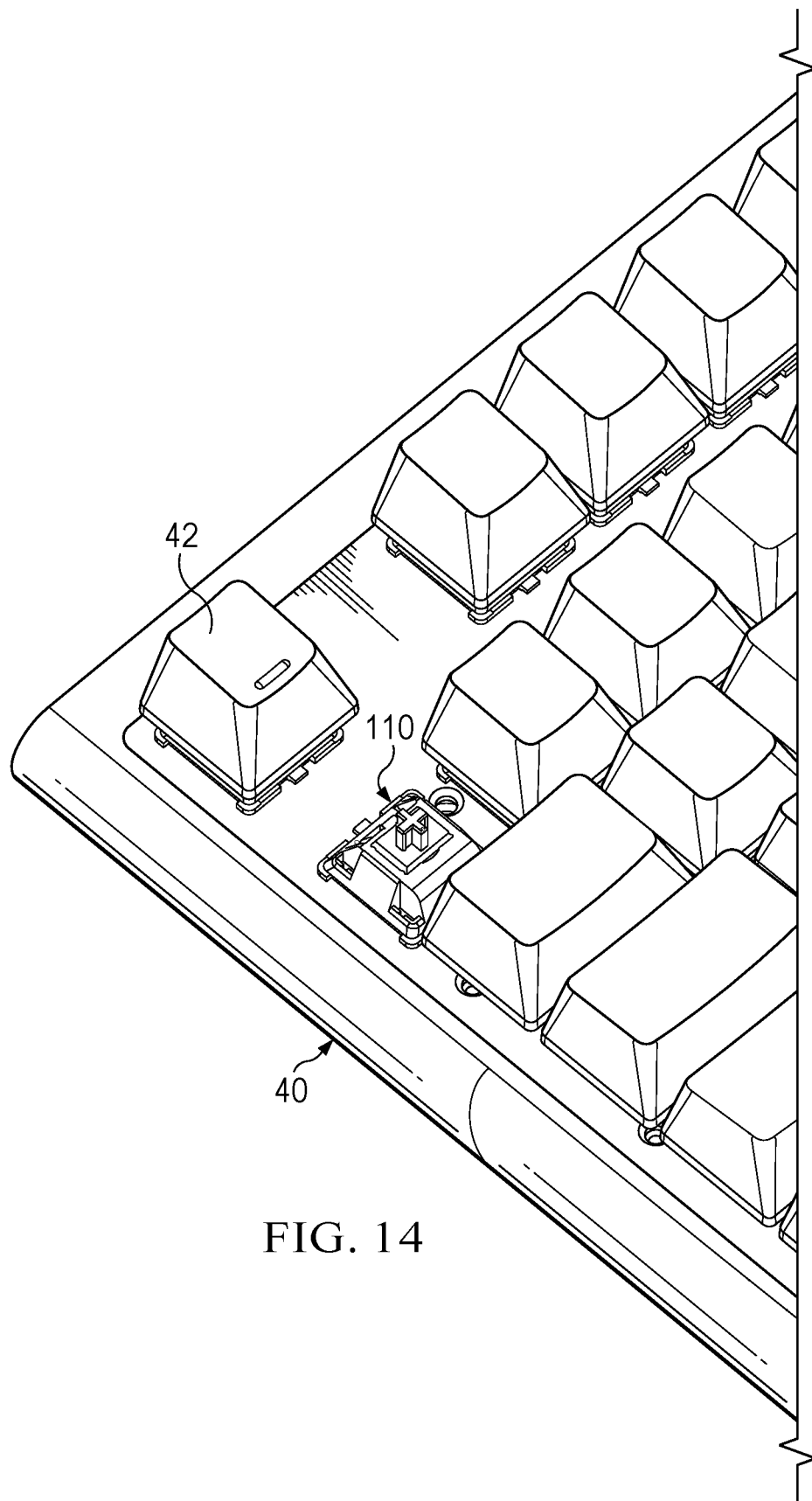
FIG. 14 depicts a top perspective view of a keyboard having an alternative embodiment of a key input detection sensor associated with magnetic key cap upward bias.

Referring now to FIG. 14, a top perspective view of keyboard 40 depicts an alternative embodiment of a key input detection sensor associated with magnetic key cap 42 upward bias. In the example embodiment, keyboard 40 has one key cap 42 removed to expose a mechanical key input switch 110 that detects key depressions as key inputs. Mechanical key input switch 110 in the example embodiment includes opposing magnets that provide an upward bias and that detect key depressions with minimal acoustic noise, as is described in greater depth below.

Figure 15:
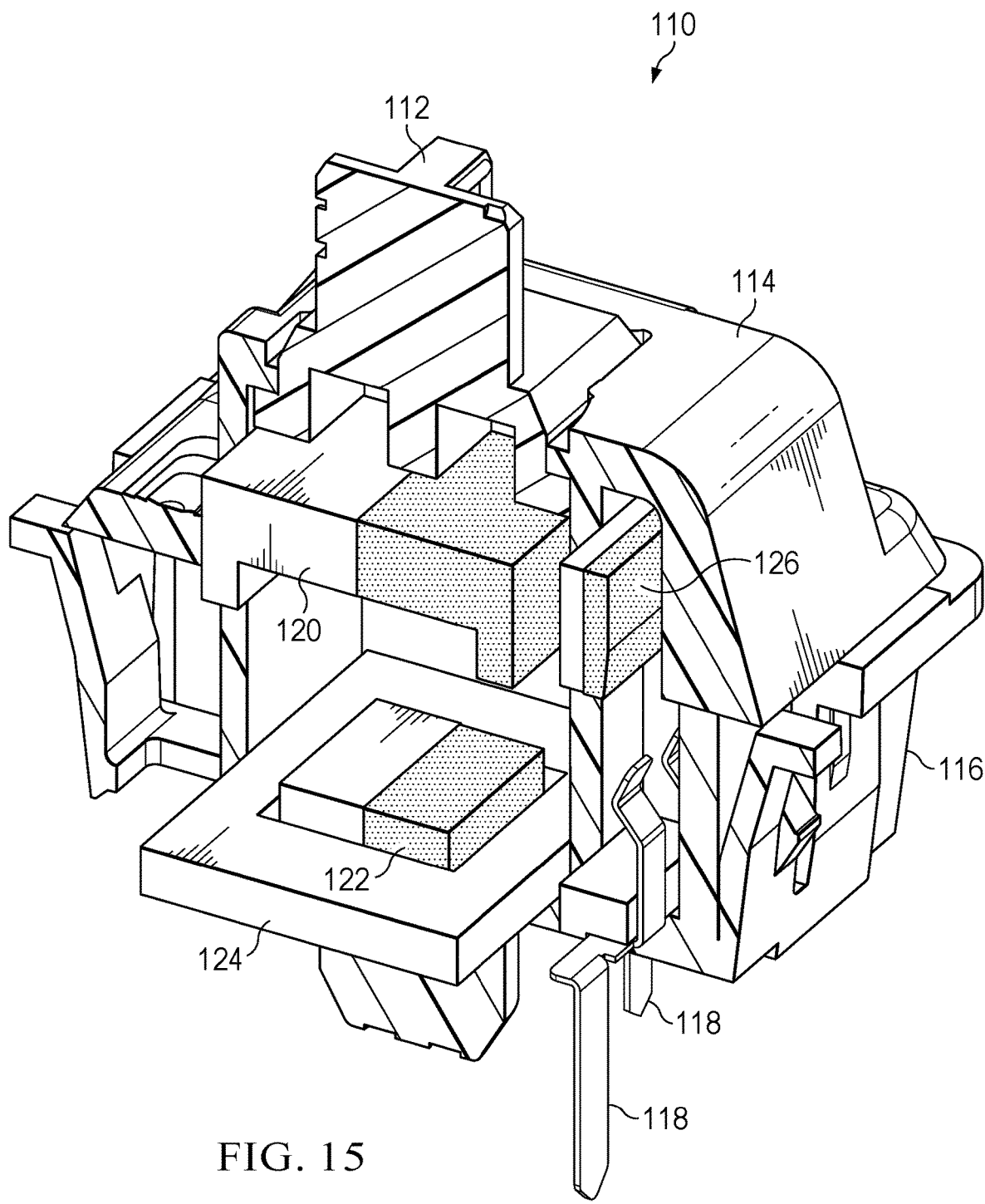
FIGS. 15 and 15A, a sectional view of mechanical key input switch depict an arrangement of magnets that biases the key cap to a raised position and detects a depressed position when the key cap is pressed.
Figure 15A:
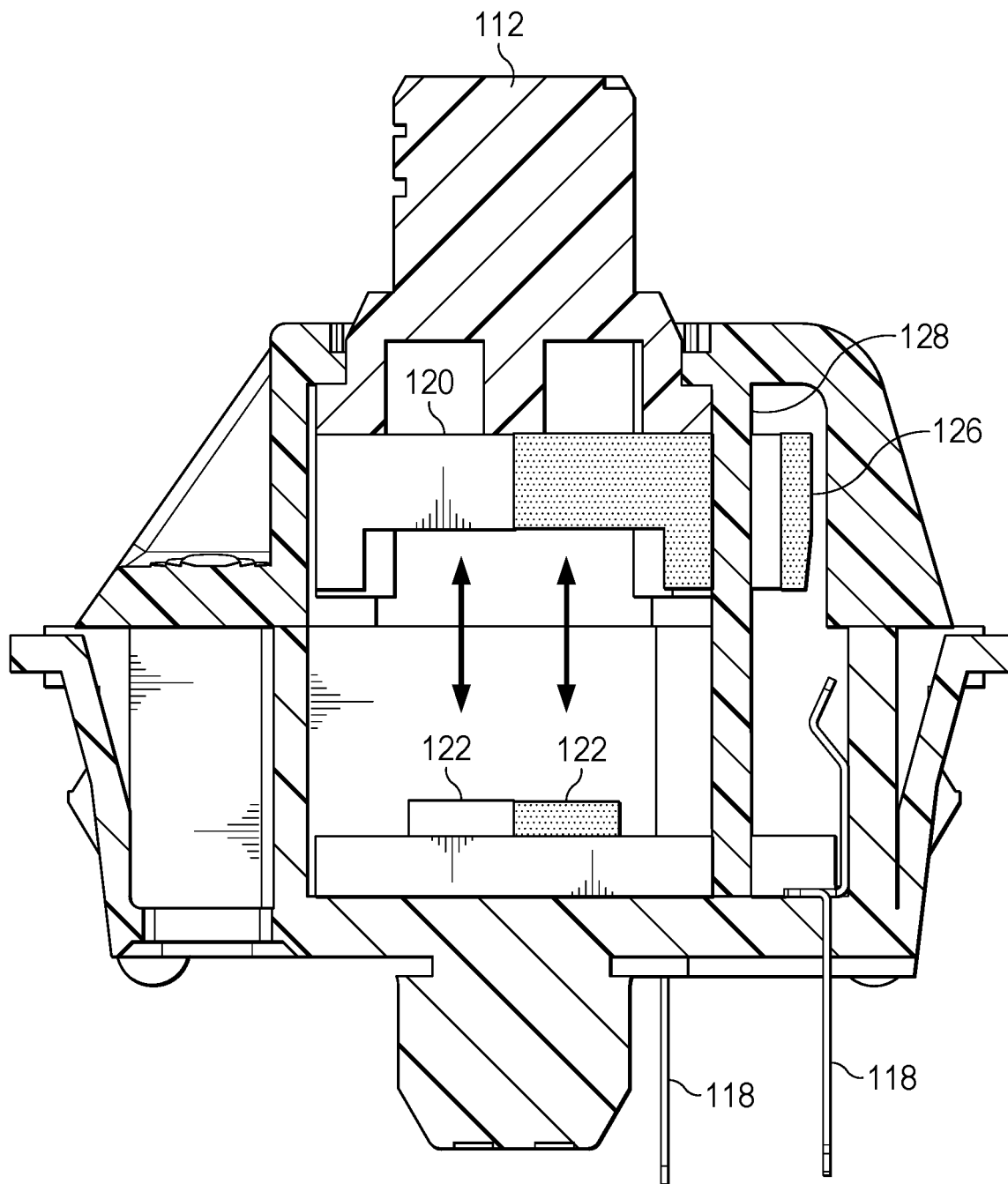

Referring now to FIGS. 15 and 15A, a sectional view of mechanical key input switch 110 depicts an arrangement of magnets that biases the key cap to a raised position and detects a depressed position when the key cap is pressed. A key cap couples to a plunger 112 captured between a top cover 114 and a bottom cover 116. Electrical leads 118 extend from bottom cover 116 to couple to a circuit board and communicate when an input is detected. For instance, one of the electrical leads provides a current that communicates out the other electrical lead when the switch closes to complete a circuit. Plunger magnet 120 couples to the bottom surface of plunger 112 with an arrangement of north and south poles that match push up magnet 122. A press down of plunger 112 brings like poles of plunger magnet 120 and push up magnet 122 in alignment resulting in an upward bias to a raised position. Push up magnet 122 is coupled to a rubberized base 124 that dampens sound and absorbs contact when made. In the raised position depicted by the sectional side view of FIG. 15A, a repelling force of the same pole magnet alignment biases plunger 112 in a raised position and also pulls sliding contact magnet 126 to a raised position within a sound isolation chamber defined by top cover 114 and bottom cover 116. In the raised position, sliding contact magnet 126 is distal electrical leads 118 so that the switch circuit is open to indicate a lack of an input from the key.

Figure 16:
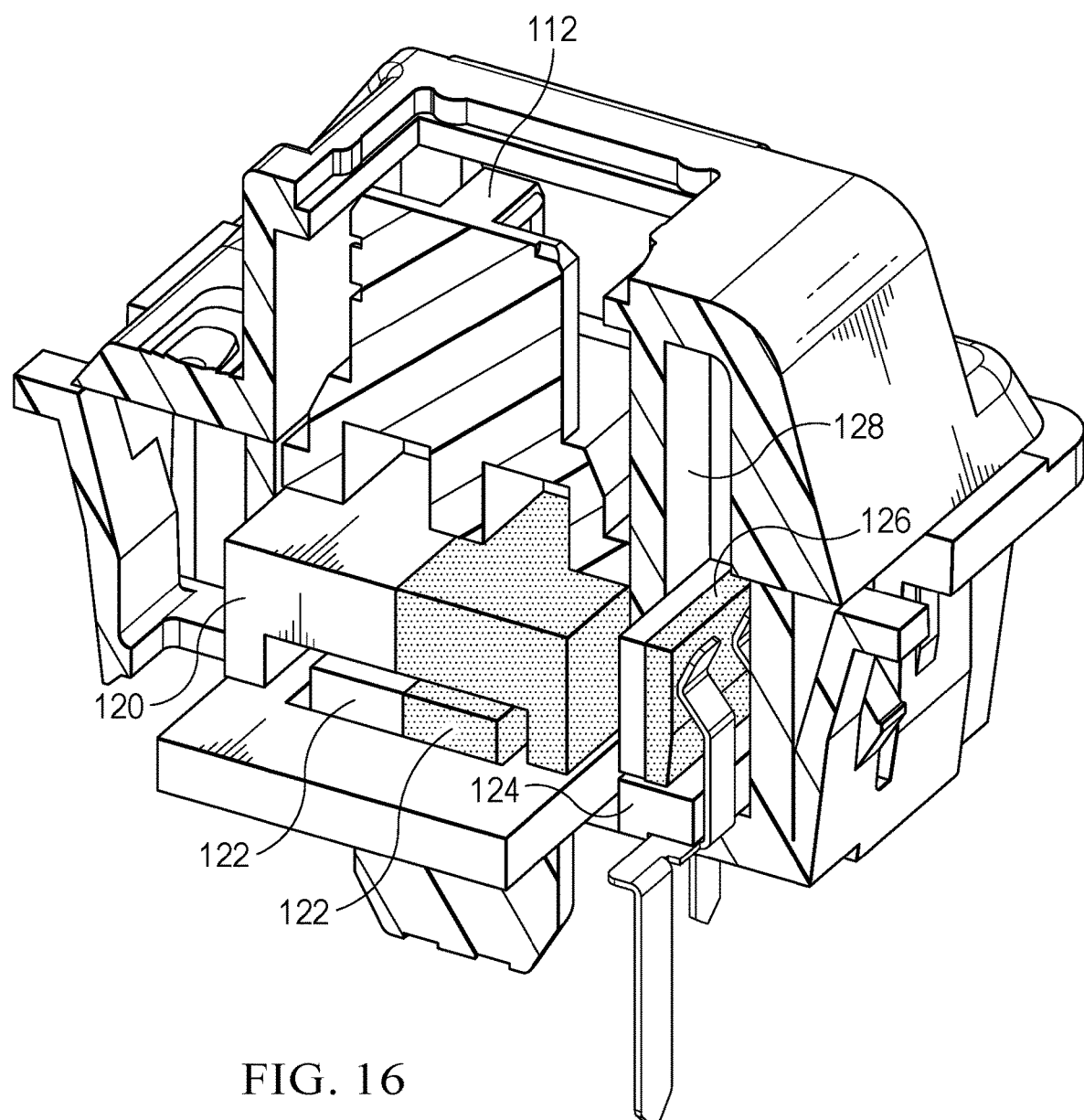
FIGS. 16 and 16A depict a sectional view of the mechanical input key input switch with an arrangement of magnets in a depressed position that completes the input circuit and sends a signal through electrical leads.
Figure 16A:
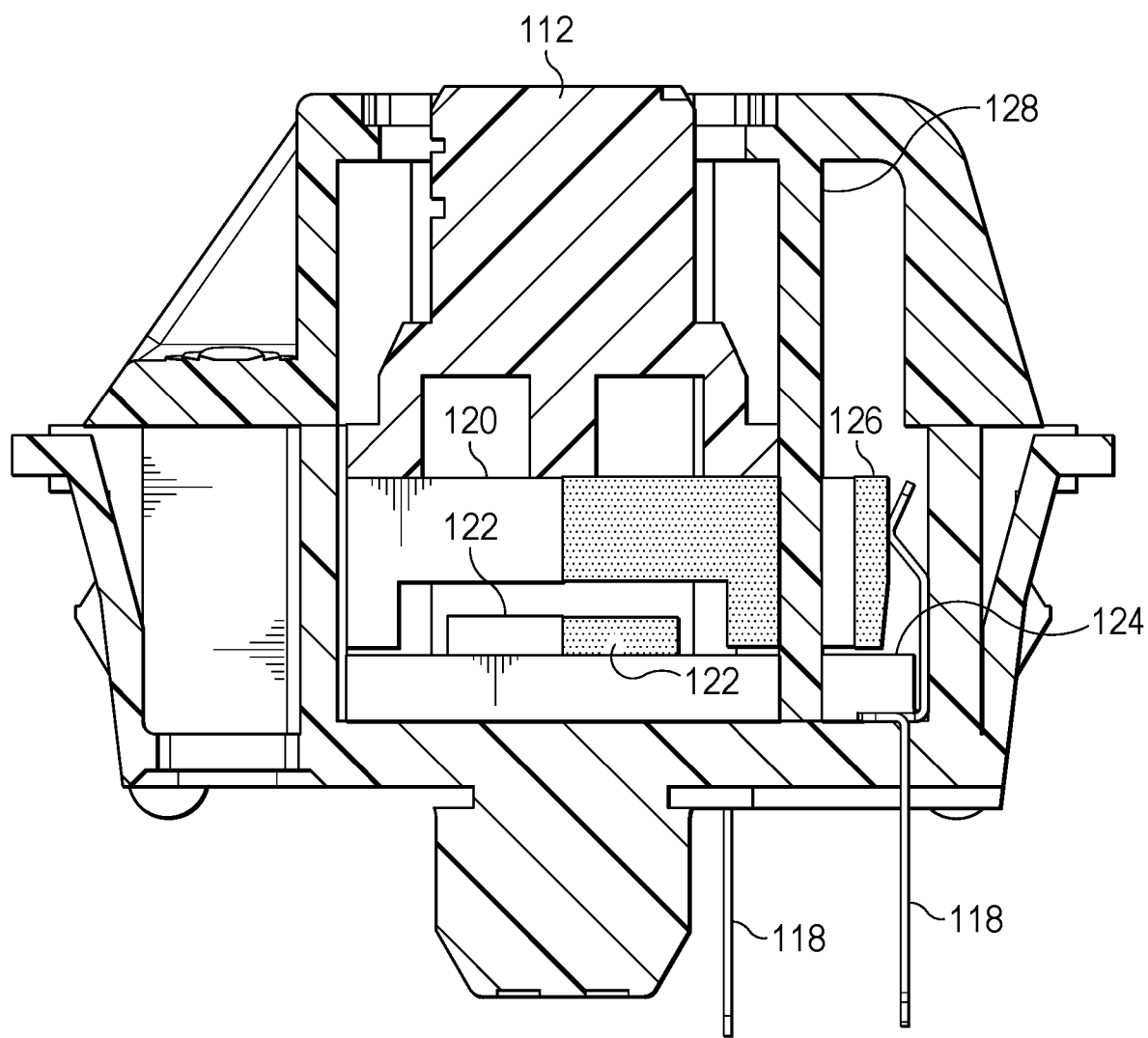

Referring now to FIGS. 16 and 16A, a sectional view of mechanical input key input switch 110 depicts an arrangement of magnets in a depressed position that completes the input circuit and sends a signal through electrical leads 118. When sufficient force is pressed down on plunger 112, the upward bias of push up magnet 122 and plunger magnet 120 is overcome to depress the key cap. Downward movement of plunger magnet 120 translates to sliding contact magnet 126 to bring sliding contact magnet in physical contact with electrical leads 118, thus completing the circuit and signaling an input. When the press is released, pushup magnet 122 and plunger magnet 120 bias plunger 112 up to the raised position. The sliding contact magnet 126 and electrical leads 118 make contact in an isolated chamber 128 over rubber base 124 so that sounds are minimized and dampened. Sliding motion to bring spring ends of electrical leads 118 into contact with sliding contact magnet 126 avoids a striking noise and striking action to reduce sound made at contact. Magnetic attraction and repelling forces used instead of mechanical springs and switches provides a consistent key input response that does not degrade over time.

Figure 17:
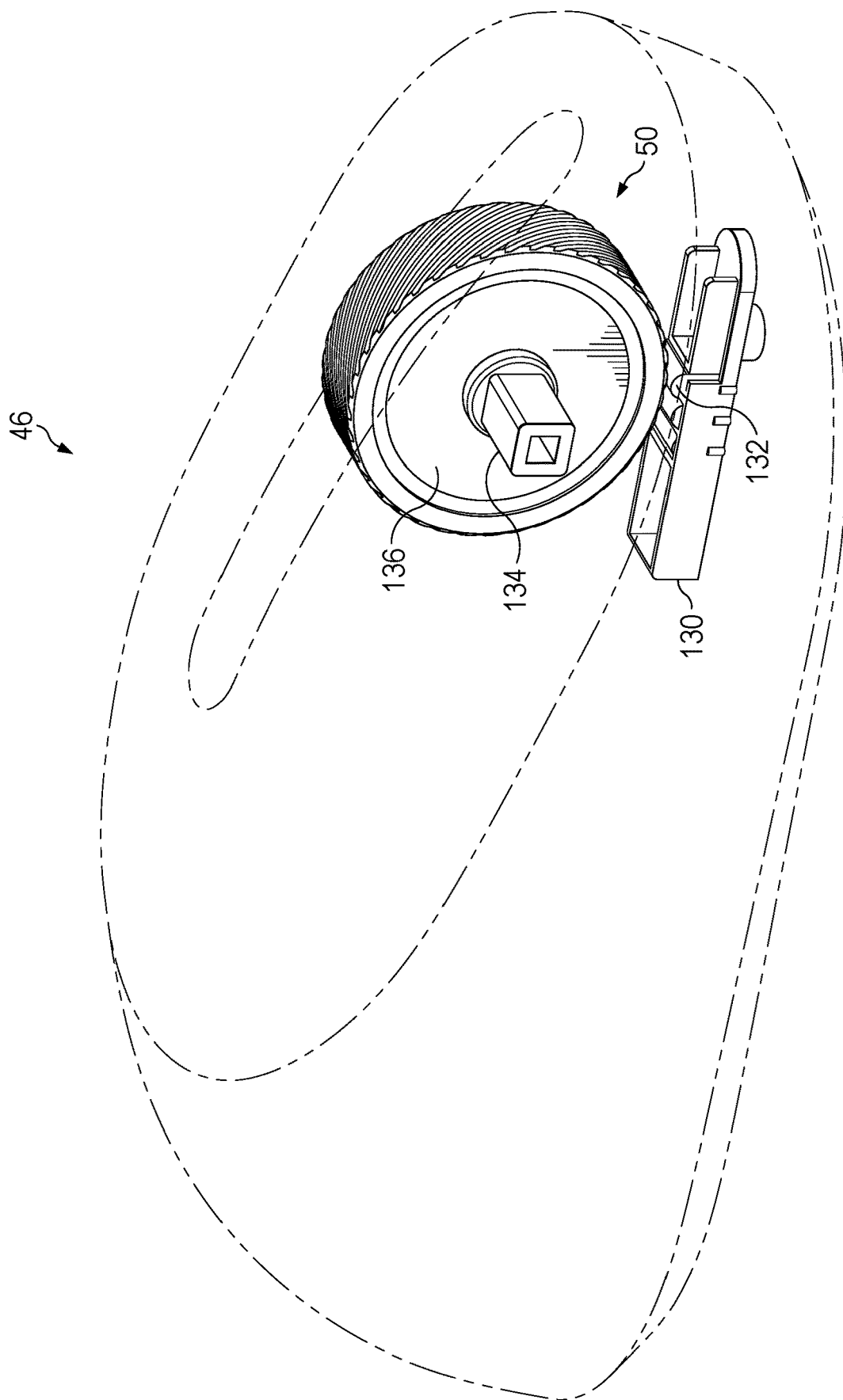
FIG. 17 depicts a side perspective view of a mouse having a scroll wheel with a low acoustic haptic response.

Referring now to FIG. 17, a side perspective view depicts a mouse 46 having a scroll wheel 50 with a low acoustic haptic response. Scroll wheel 50 rotates about a shaft 134 and encloses magnetorheological (MR) fluid in a chamber having blades that create a haptic response to a rotation by an end user. A sliding magnet housing 130 couples plural magnets 132 of varying flux proximate the MR fluid to adjust the viscosity of the MR fluid for selectable haptic response. MR fluid consists of liquid oil with very fine micro magnetic particles suspending within the oil that change the viscosity of the oil when magnetic flux is applied, such as by three external magnets of varying heights and sizes. The magnetic flux creates a chain of particles within the fluid in the direction of the magnetic flux having increased viscoelastic characteristics as the flux increases. The interior of the chamber having the MR fluid includes spaced blades that resist rotation of the chamber in varying amounts based upon the size of the chain of magnetic particles within the fluid. The spaced blades create high and low resistance as the chamber rotates past the magnets to mimic the tactile feel offered by conventional mechanical scroll wheels. The amount of resistance can vary based upon the length of blades within the MR fluid chamber and the amount of magnetic flux placed by the MR fluid and chamber.

Figure 18:
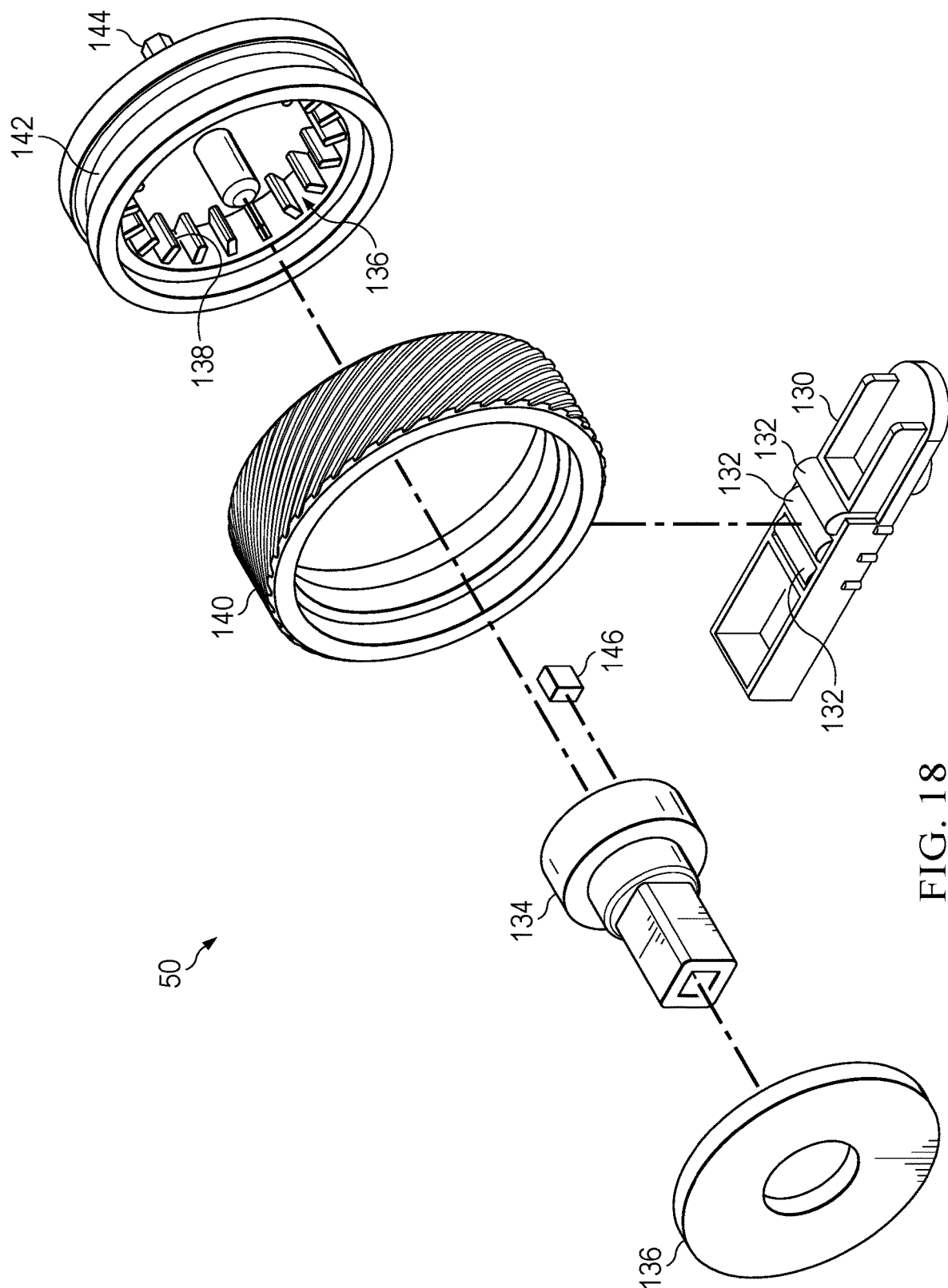
FIG. 18 depicts an exploded perspective view of the scroll wheel having an example configuration of an MR fluid chamber with blades to generate a haptic response in resistance to scroll wheel rotation.

Referring now to FIG. 18, an exploded perspective view of scroll wheel 50 depicts an example configuration of an MR fluid chamber with blades to generate a haptic response in resistance to scroll wheel rotation. Shaft 134 couples to mouse structure to provide a rotational axis in cooperation with a rotation member 144 on an opposing side of the scroll wheel 50. A rotation sensor to detect scroll wheel rotation may couple to shaft 134 or may be an optical sensor coupled to the mouse and directed at either side of the scroll wheel, or other types of rotation sensors. A core magnet 146 couples in a central location of shaft 134 to bias MR fluid particles towards a central location that reduces rotation resistance of the scroll wheel. An MR fluid seal 136 fits within a rubberized outer ring 140 and couples to a central wheel 142 to define a chamber 146 in which MR fluid is contained. Within chamber 146 at the inner circumference a set of evenly spaced blades 138 extend from the periphery inwards partially to the center position of shaft 134. MR fluid seal 136 is located above sliding magnet housing 130 so that a selectable amount of magnetic flux is available from magnets 132 to adjust the amount of resistance applied against rotation of the scroll wheel when the blades 138 within chamber 146 interact with magnetic particles of the MR fluid. In an alternative embodiment, magnets 132 may include one or more electropermanent magnets that turn magnetic flux on and off in response to a command signal from the mouse MCU.

Figure 19A:
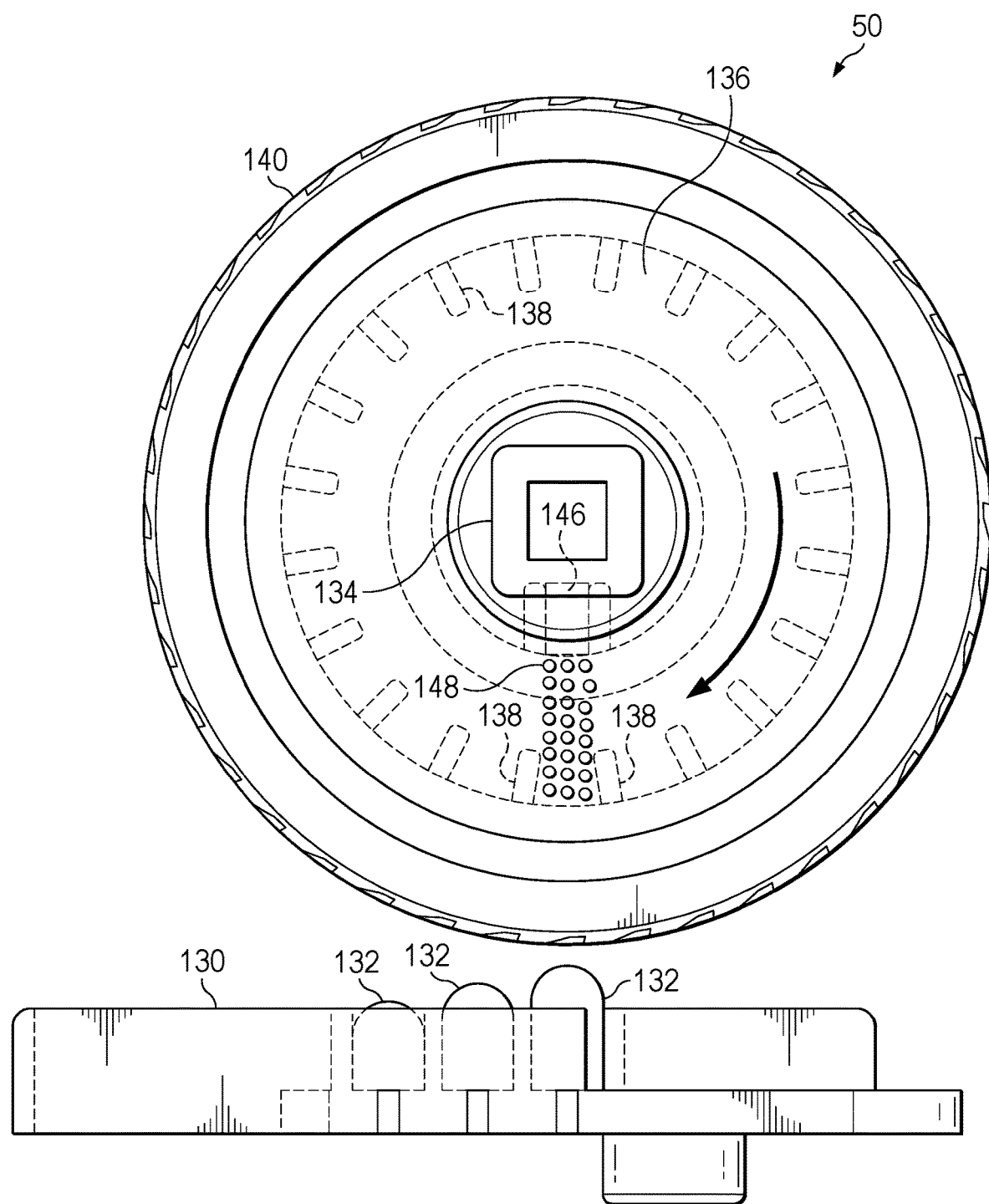
FIGS. 19A, 19B and 19C depict various configurations of magnetic flux and MR fluid magnetic particle composition to generate various haptic responses to scroll wheel rotation.
Figure 19B:
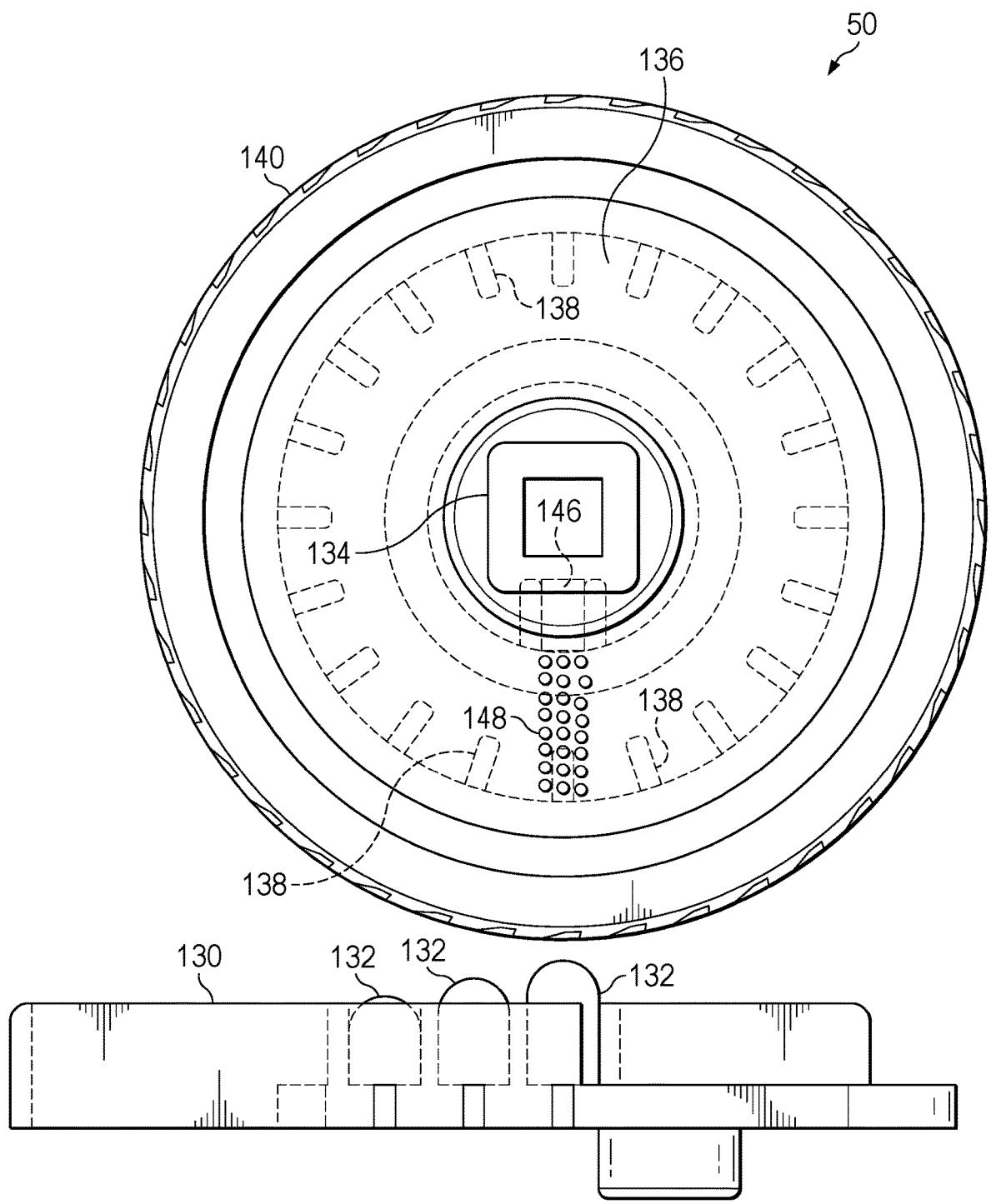
Figure 19C:
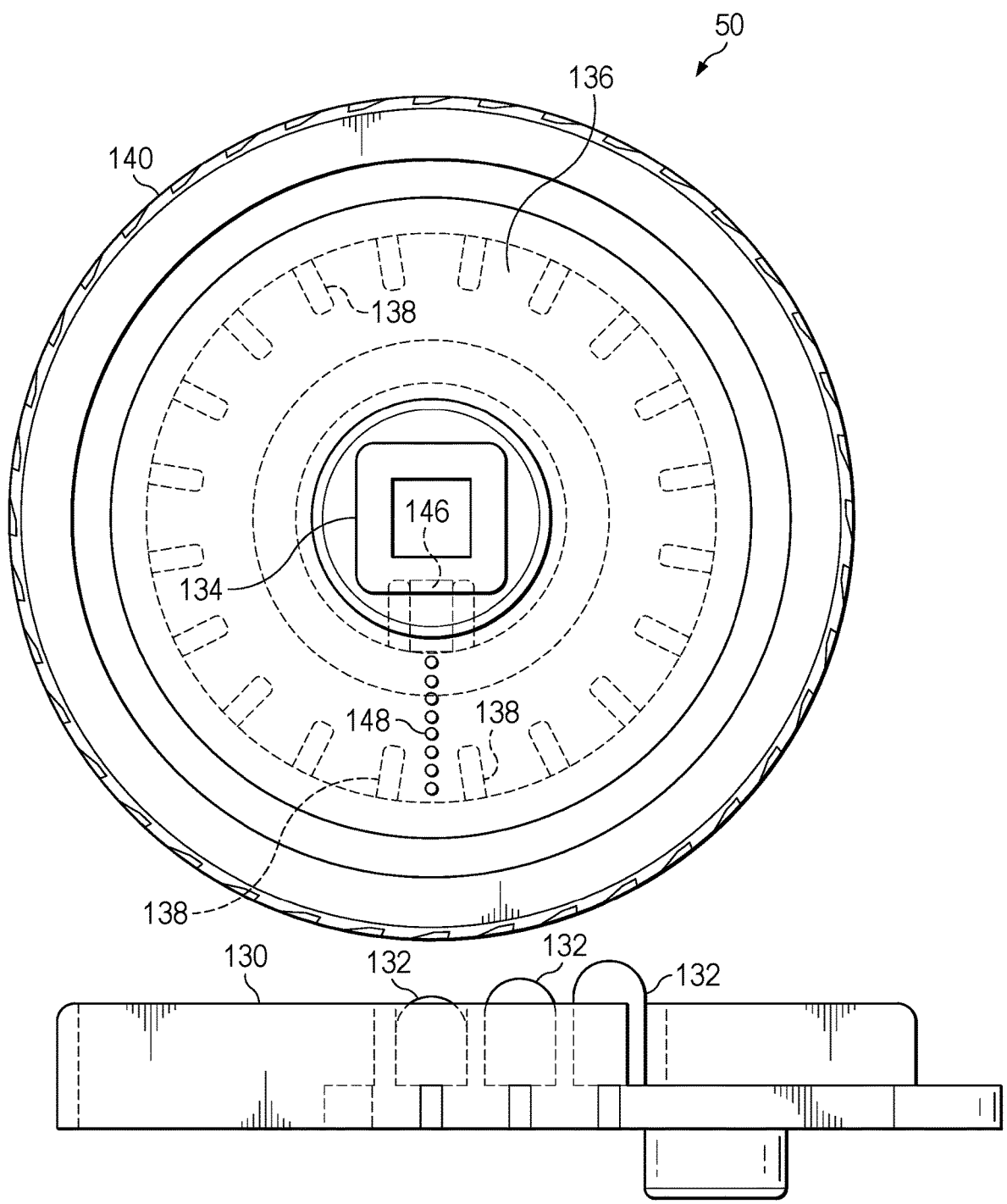

Referring now to FIGS. 19A, 19B and 19C, various configurations of magnetic flux and MR fluid magnetic particle composition are depicted to generate various haptic responses to scroll wheel rotation. FIG. 19A illustrates that a south pole of magnet 132 in sliding magnet housing 130 aligns with a north pole of core magnet 146 to create a particle chain 148 between first and second blades 138 of the MR fluid chamber 136 to create resistance to rotation of scroll wheel 50 when an end user applies a rotational force at rubber outer ring 140. FIG. 19B depicts that rotation of blade 138 through particle chain 148 increases resistance leading to an end user who applies force to cause rotation to receive a haptic feedback that mimics a spring click. As blade 138 passes through particle chain 148, resistance to rotation decreases so that a cycle of high and low rotational forces generates a haptic feedback for the amount of rotation of the scroll wheel. The resistance is adjustable by changing the length and width of the blades and the magnetic particle concentration in the MR fluid. FIG. 19C depicts an example of a reduced resistance from a reduced concentration of magnetic particles due to the alignment of a smaller magnet with an increased distance to the scroll wheel. When sliding magnet housing 130 brings the magnets 132 out of alignment with core magnet 146, then core magnet 146 tends to draw the magnetic particles away from blades 138 to allow the scroll wheel to freely rotate without a haptic response.

Figure 20:
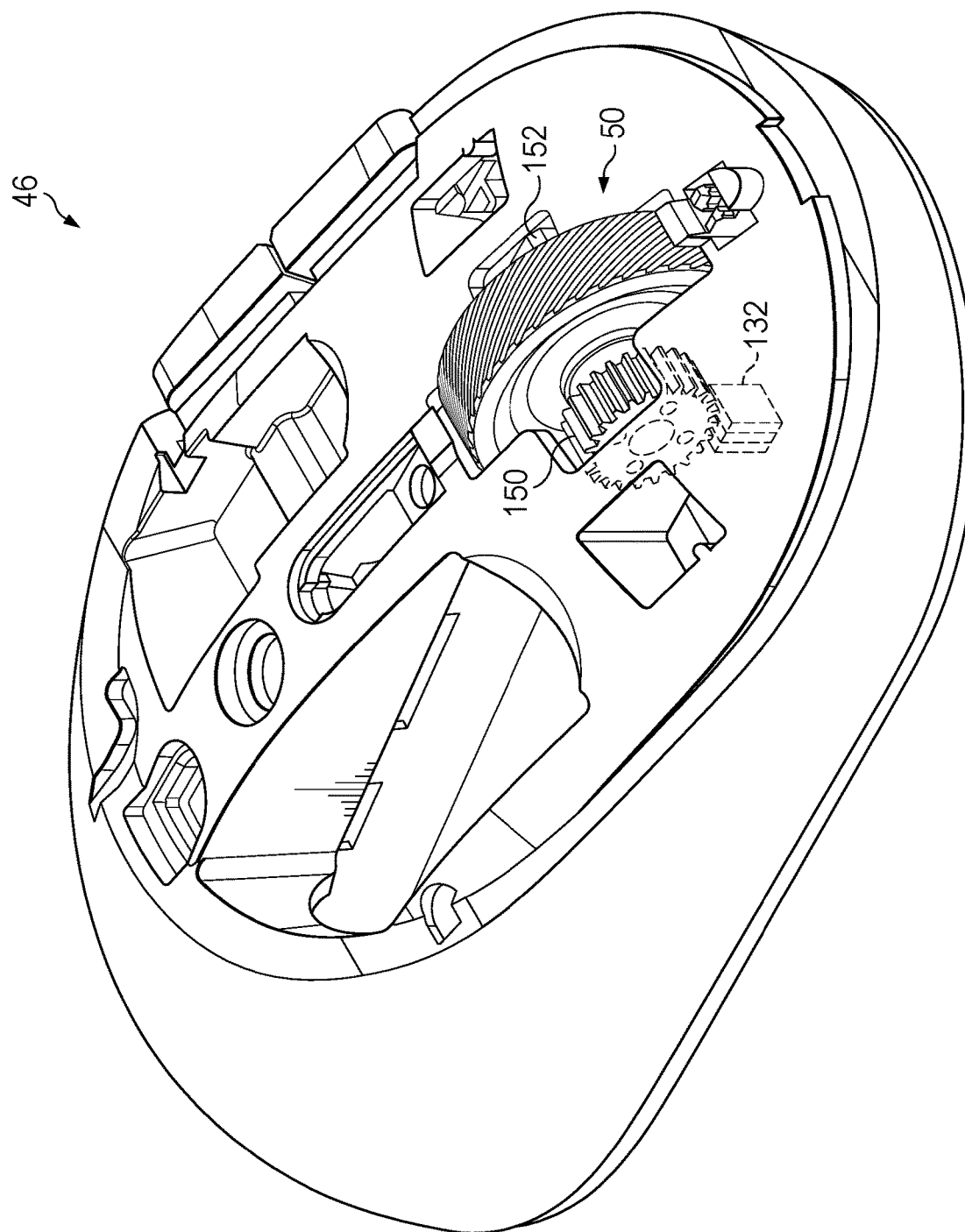
FIGS. 20, 20A, 20B, 20C and 20D depict a mouse having a scroll wheel example of a magnetic based configuration to generate a haptic response in resistance to scroll wheel rotation.
Figure 20A:
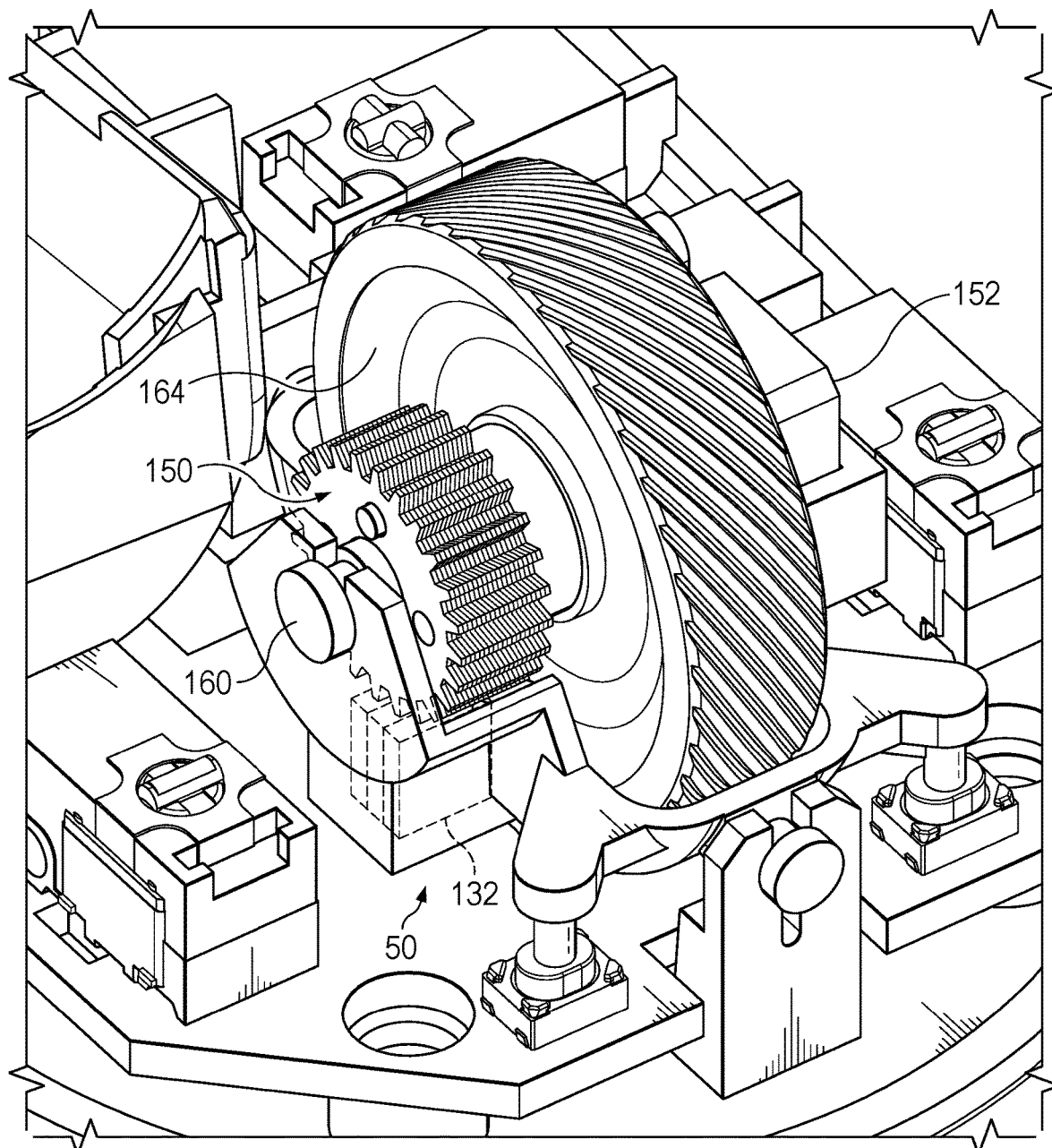
Figure 20B:
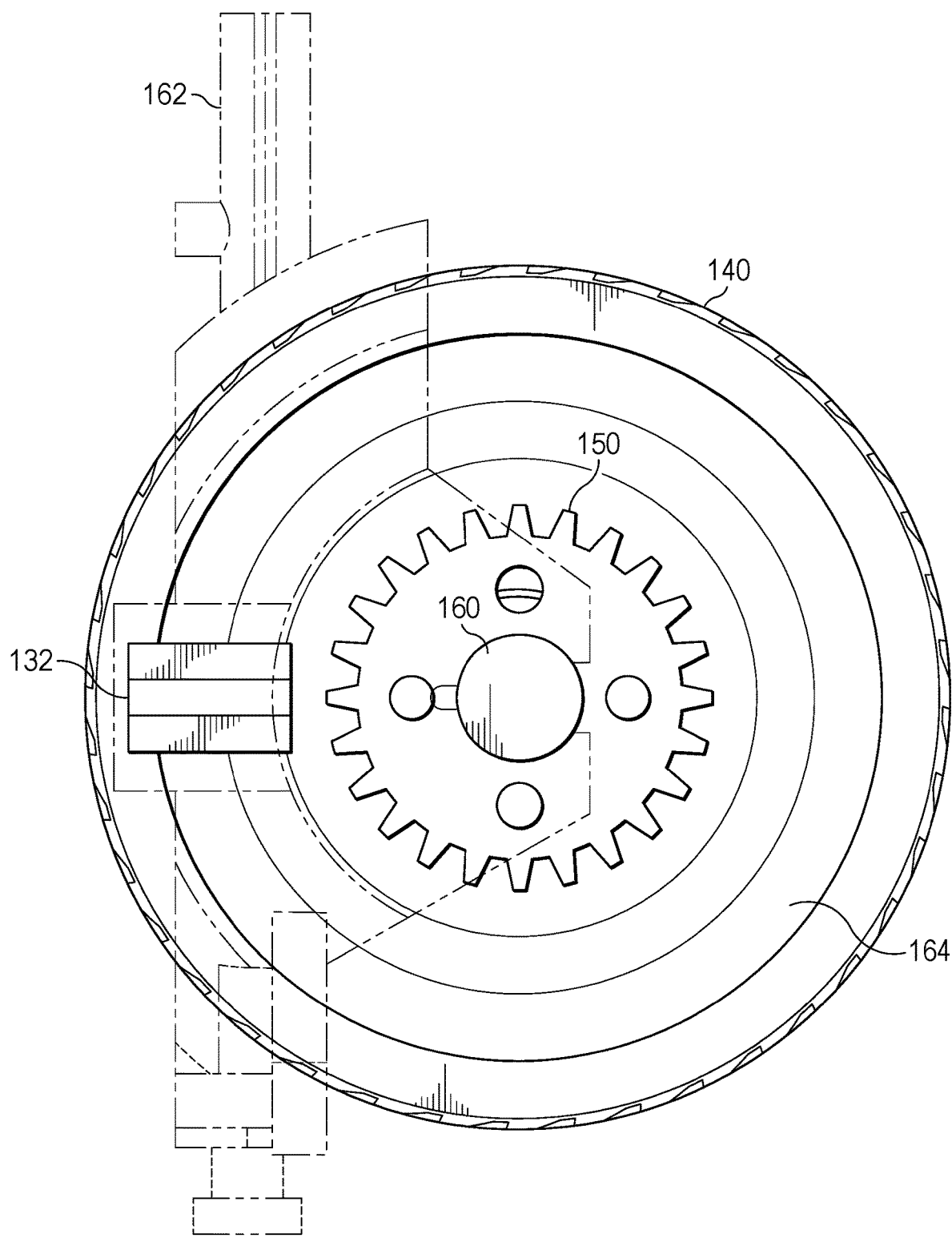
Figure 20C:
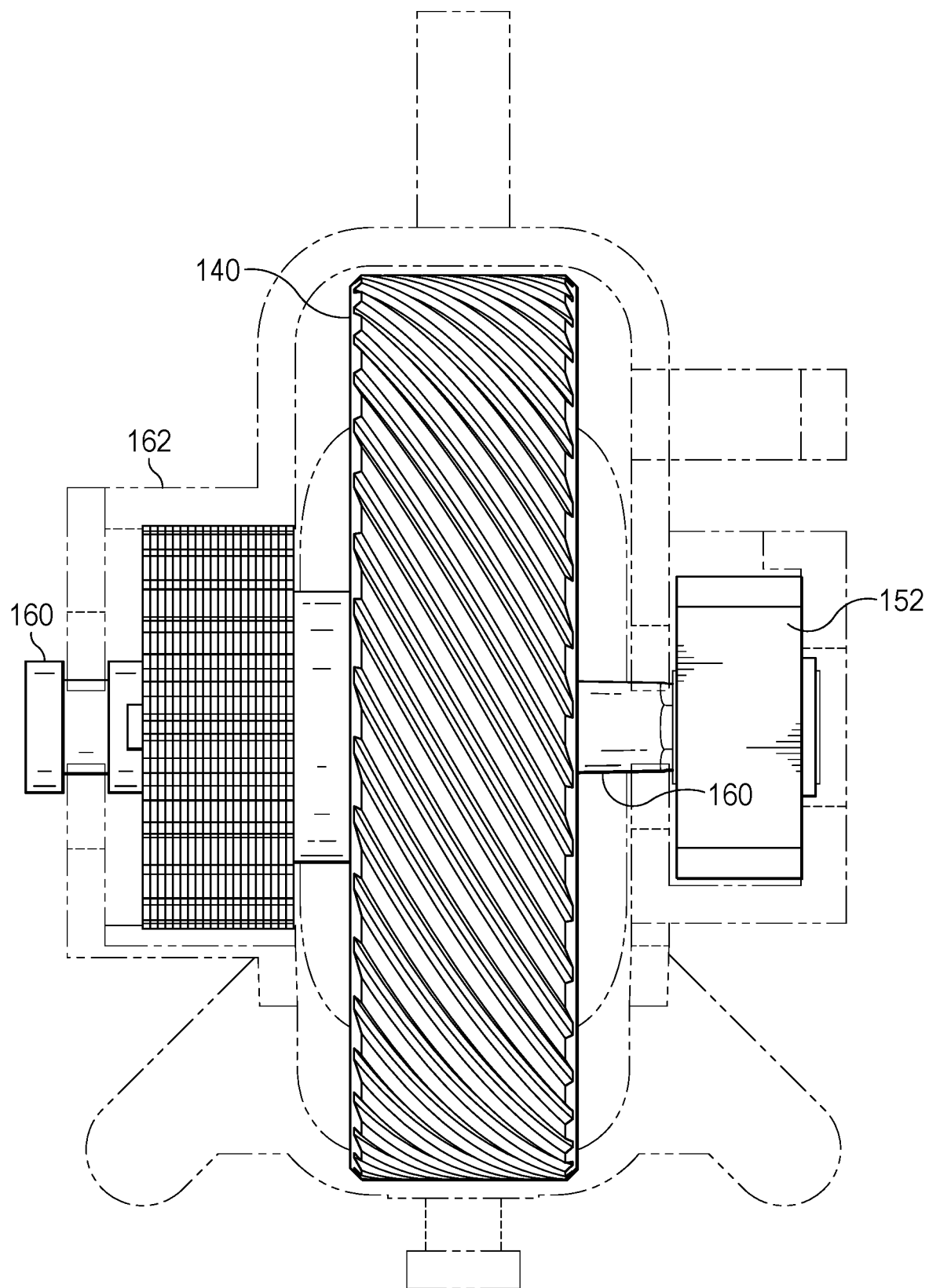
Figure 20D:
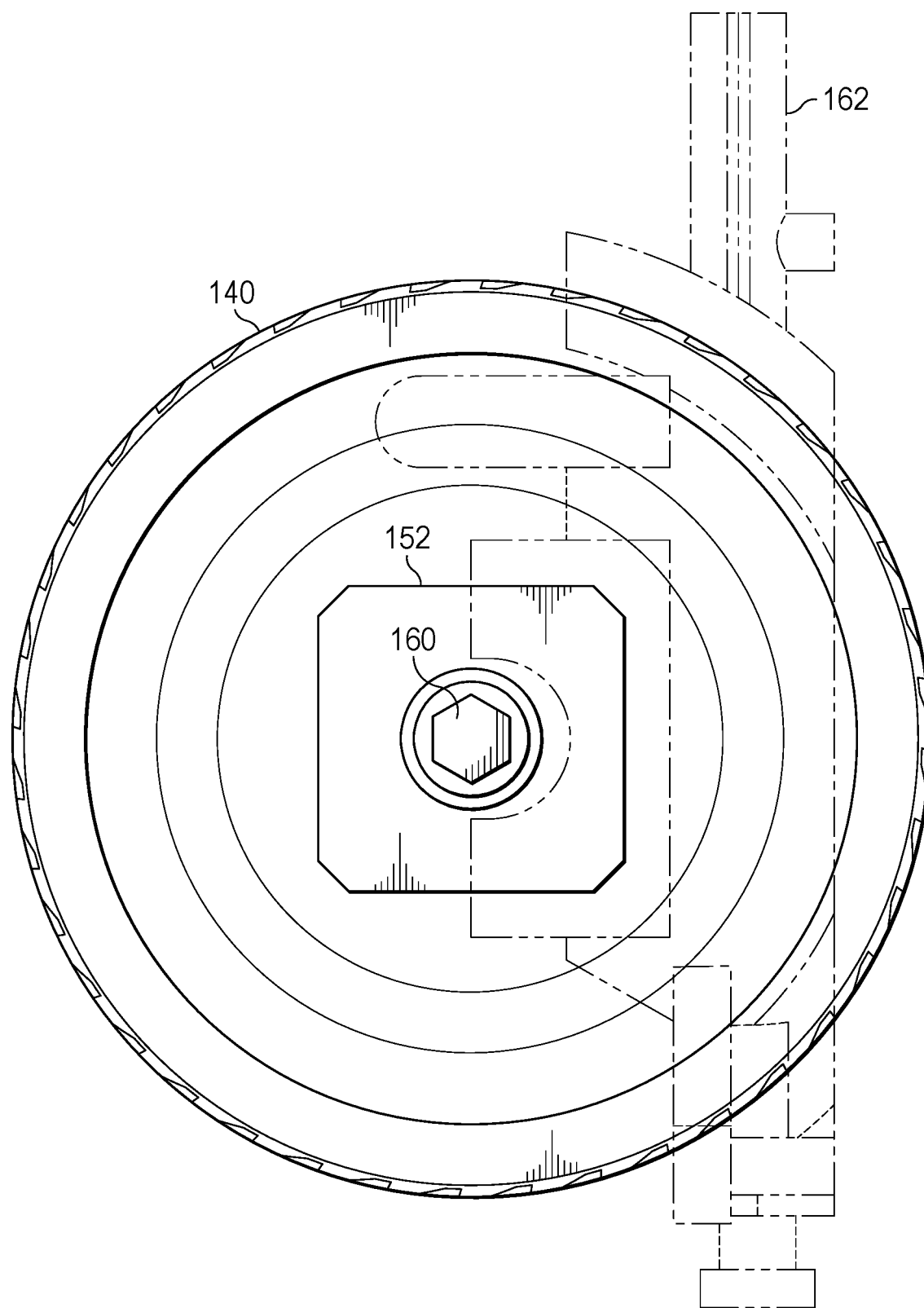

Referring now to FIGS. 20, 20A, 20B, 20C and 20D, a mouse is depicted having a scroll wheel 50 as an example of a magnetic based configuration to generate a haptic response in resistance to scroll wheel rotation. In the example embodiment, scroll wheel 50 generates the haptic response with a geared wheel 150 of ferromagnetic material that rotates proximate a magnet so that magnetic flux changes with rotational orientation relative to the geared wheel teeth. A rotation sensor 152 couples to the scroll wheel to detect changes in rotational orientation that are reported as scroll commands. FIG. 20A depicts a perspective view of scroll wheel 50 with geared wheel 150 coupled to a central core wheel 164 that has an axle 160 extending to and rotationally coupling with a cradle 162. A rotation sensor couples to axle 160 on an opposite side of geared wheel 150. FIG. 20B depicts the orientation of magnet 132 relative to geared wheel 150 so that the magnetic flux varies as the gear proximity to the magnet changes distance between gear peaks and valleys. The amount of haptic feedback is adjusted by moving cradle 162 relative to the rotational axis of geared wheel or by changing the size of magnet 132. In one embodiment, magnet 132 is one or more electropermanent magnets that a controller can turn off so that the scroll wheel rotates without haptic response. FIG. 20C depicts a top view of the scroll wheel to illustrate axle 160 coupled into cradle 162 with geared wheel 150 configured to rotate and rotation sensor 152 configured to measure rotational orientation. In one embodiment, rotation sensor 152 is a Hall sensor that detects pulses in current related to movement of gear teeth past the magnet. FIG. 20D depicts a side view of the scroll wheel having rotation sensor 152 coupled to axle 160 and oriented to have an optical sensing element directed at wheel core 164 to detect rotation.

Figure 21:
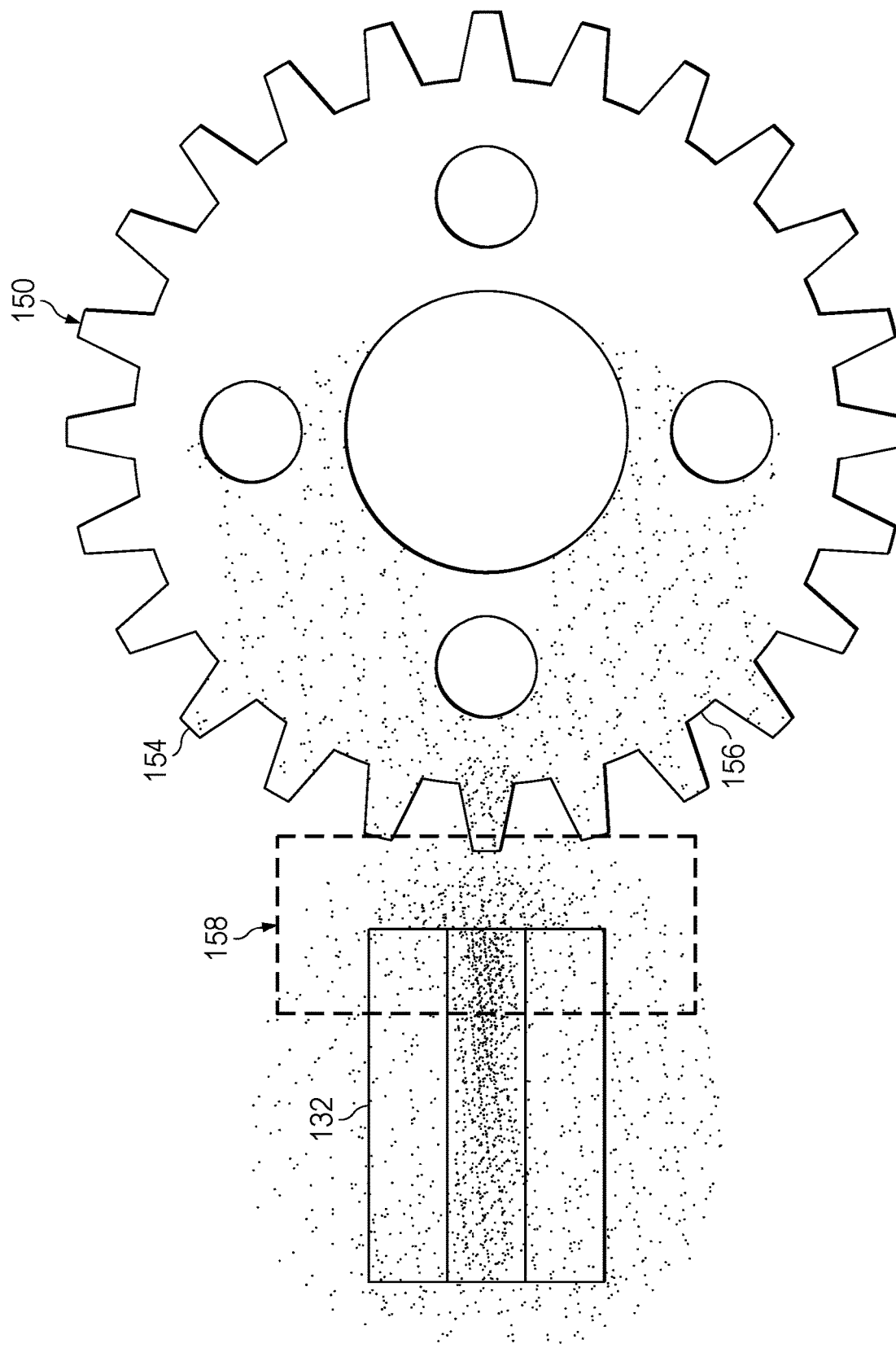
FIG. 21 depicts a side view of the geared wheel disposed proximate a magnet with a graph illustrating how magnetic flux changes in response to gear proximity with magnet as geared wheel rotates.

Referring now to FIG. 21, a side view depicts geared wheel 150 disposed proximate a magnet 152 with a graph 158 illustrating how magnetic flux changes in response to gear proximity with magnet 132 as geared wheel 150 rotates. When a peak region 154 of geared wheel 150 passes by magnet 132, magnetic flux increases resulting in increased resistance to rotation. When a valley region 156 of geared wheel 150 passes by magnet 132, magnetic flux decreases resulting in decreased resistance to rotation so that a haptic effect is generated. The amount of haptic effect is configurable by the size of the peaks, depth of the valleys, size of the magnet, distance of the magnet to the geared wheel and type of ferromagnetic material from which the geared wheel is made. In one example embodiment, geared wheel 150 is made of a silicon steel material that has an enhanced magnetic interaction. As described above, during rotation the movement of geared wheel 150 relative to magnet 132 creates current spikes that a Hall sensor or a current detection device can monitor to detect rotational orientation changes. For example, spikes in current related to changes in magnetic fields may be sensed by a mouse microcontroller unit (MCU) that interfaces with the ferromagnetic material through an analog GPIO.

Figure 22:
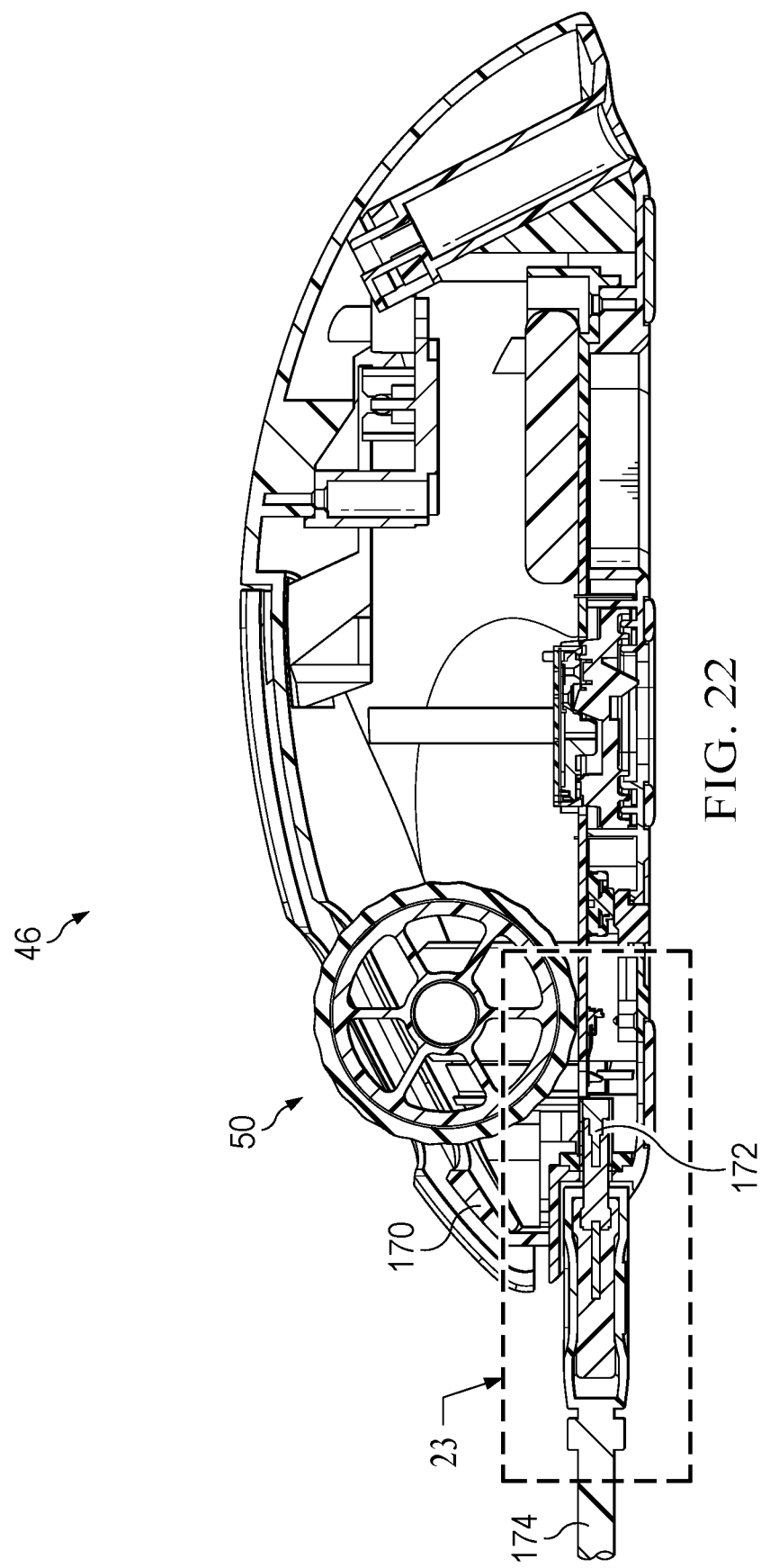
FIG. 22 depicts a side sectional view of a mouse having a cable connection arrangement with enhanced resistance to internal breakage.

Referring now to FIG. 22, a side sectional view of a mouse 46 depicts a cable connection arrangement having enhanced resistance to internal breakage. USB cable connections, particularly small-sized cable connections such as Type-C connections, can break internal components of a peripheral device when torsion forces are applied, such as with mouse peripheral ports. In the example embodiment, a chassis 170 of mouse 46 has a USB Type-C cable port 172 that accepts a USB Type-C cable connector 174. When torsional forces are applied at cable port 172 by cable connector 174, a small circuit board that mounts the USB Type-C port allows some movement dampened by a rubber sleeve to help reduce the risk of breakages that can cause mouse failure, such as solder breaks.

Figure 23:
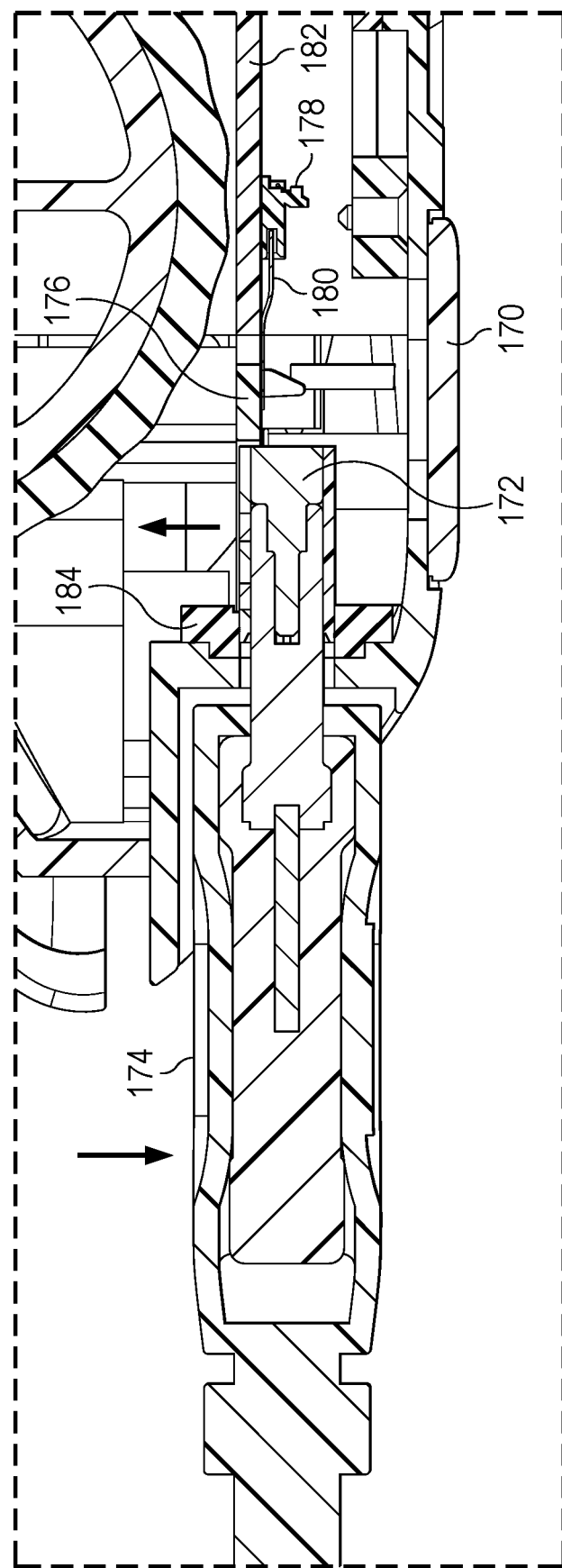
FIG. 23 depicts a detailed view of the mouse having a cable connection arrangement with enhanced resistance to internal breakage.

Referring now to FIG. 23, a detailed view depicts the mouse 46 having a cable connection arrangement with enhanced resistance to internal breakage. In the example embodiment, cable connector 174 couples to cable port 172 that is affixed, such as with solder, to a free floating receptacle board 176. Receptacle board 176 is free to move vertically relative to chassis 170 and a main circuit board 182 of mouse 46. Receptacle board 176 interfaces with main board 182 through a flexible circuit cable connector 178 and a flexible circuit cable 180. A rubber sleeve 184 holds receptacle board 176 in place by fitting around cable port 172 and coupling to chassis 170. In one example embodiment, soft foam may also be inserted around receptable board 176 to protect receptacle board 176 from damage. In the example embodiment, a push down on cable connector 174 translates to receptable board 176 as an upward movement while communication with main board 182 is maintained through the flexible cable. Rubber sleeve 184 couples to chassis 170, such as with an adhesive, so that force applied to cable port 172 is absorbed by the rubber sleeve material without translating to the receptacle board, thereby avoiding damage to the receptacle board and the port affixed by solder to the receptable board.

Figure 24:
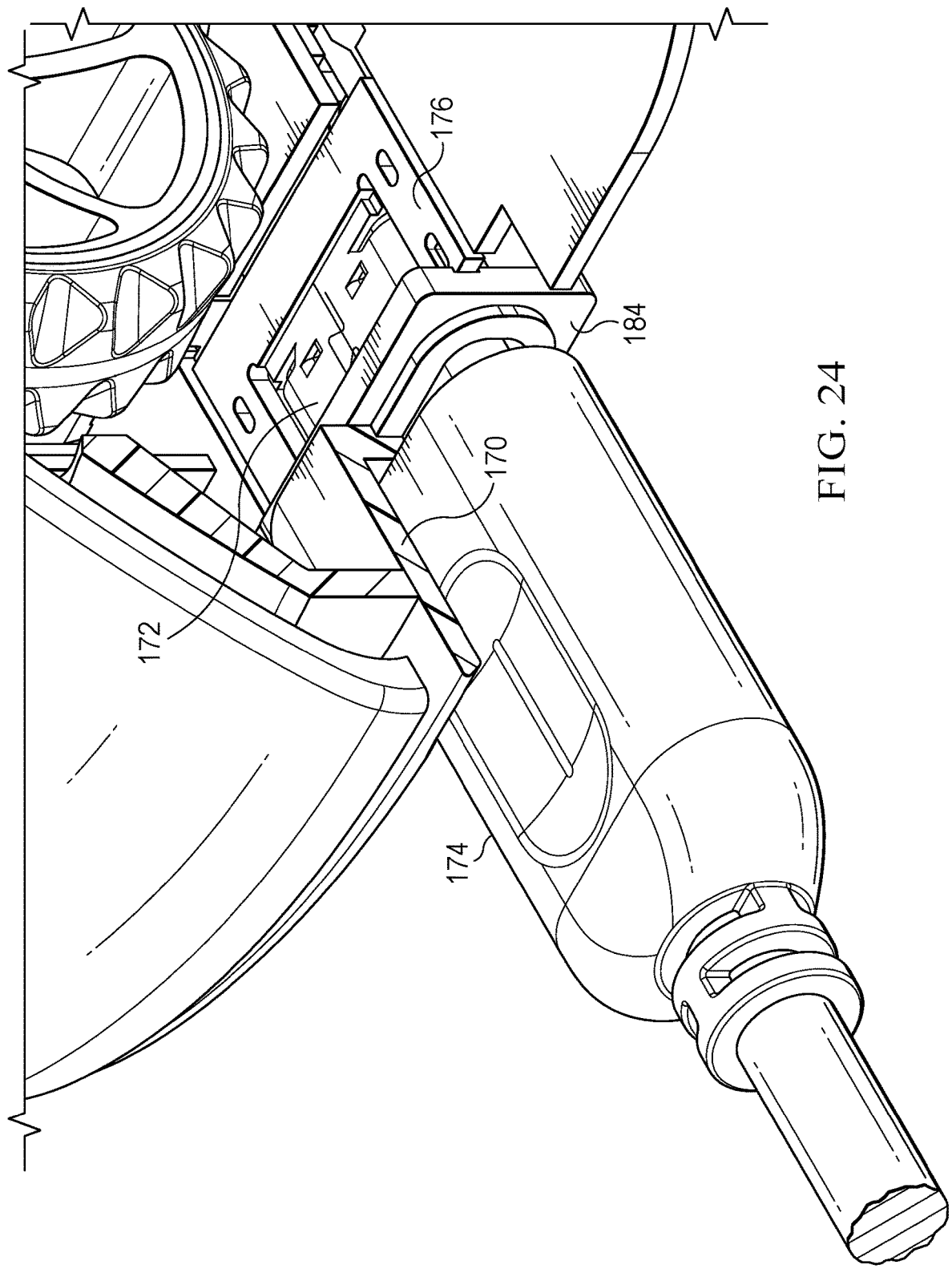
FIG. 24 depicts an upper perspective sectional view of the mouse cable connection arrangement with enhanced resistance to breakage.

Referring now to FIG. 24, an upper perspective sectional view depicts the mouse 46 cable connection arrangement with enhanced resistance to breakage. Cable port connector 172 in the example embodiment is a Type-C connector that solders to receptacle board 176, which floats free relative to main board 182. Receptacle board 176 has a small surface area, such as substantially only the size of the cable port and flexible cable connector, so that a greater amount of movement is tolerable without impacting internal structures within chassis 170. Cable port 172 inserts through rubber sleeve 184, which couples to chassis 170, such as with adhesive, and aligns cable port 172 with the opening of chassis 170 through which the cable connector inserts.

Figure 25:
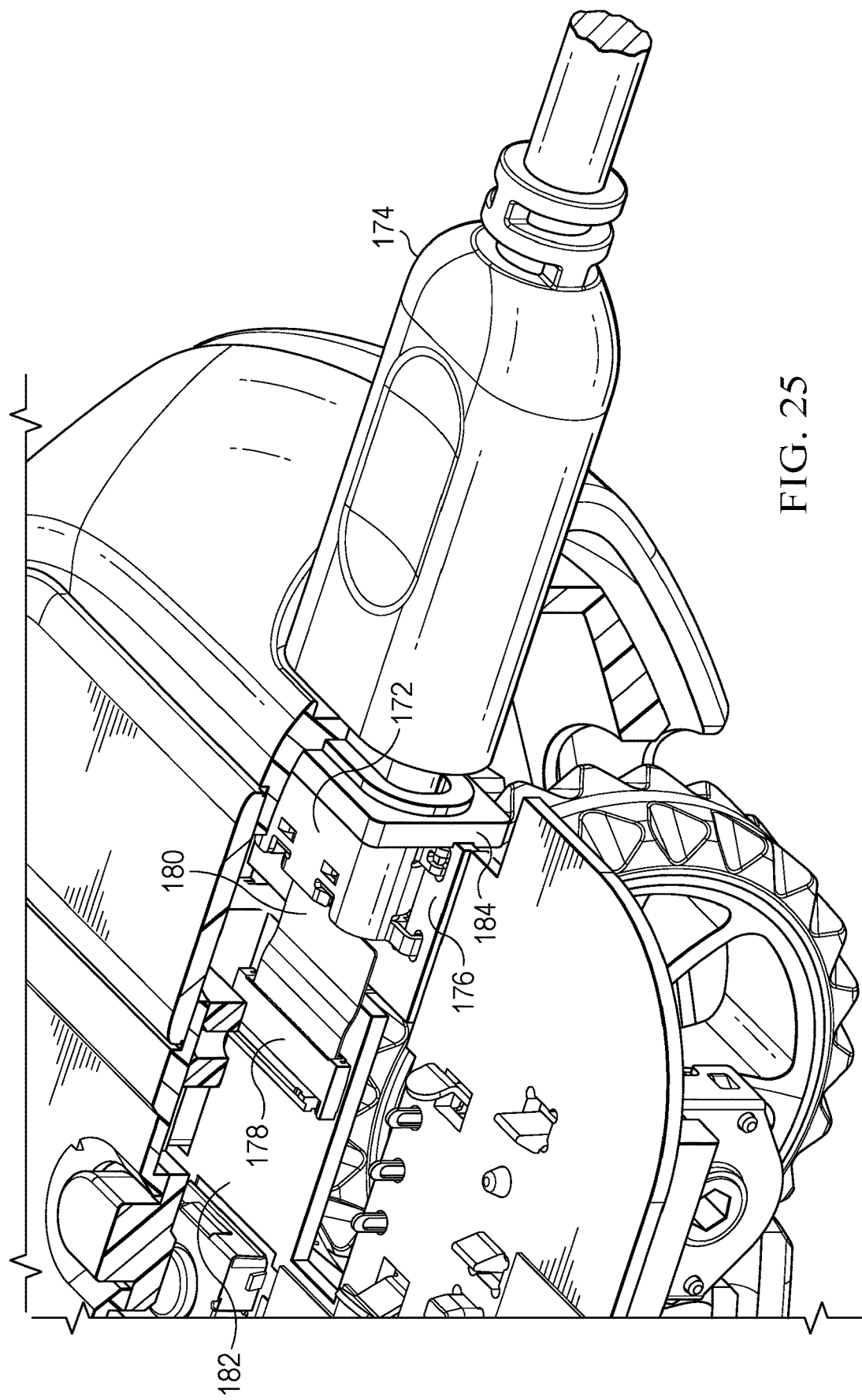
FIG. 25 depicts a lower perspective sectional view of the mouse cable connection arrangement with enhanced resistance to breakage.

Referring now to FIG. 25, a lower perspective sectional view depicts the mouse cable connection arrangement with enhanced resistance to breakage. Receptacle board 176 couples to cable port 172 and interfaces through circuit board wirelines with flexible printed circuit cable 180 to communicate power and information through connector 178 to main board 182. Rubber sleeve 184 couples to chassis 170 to absorb external forces applied by cable connector 174 and to maintain the cable opening of cable port 172 aligned to accept cable connector 174 through the chassis opening. Rubber sleeve 184 is, for instance, a rubberized injection molded plastic or a silicon rubber material that withstands applied forces without tearing and yields to move within constraints associated with the size of receptacle board 176 so that receptacle board 176 will not impact other internal structures. In one embodiment, rubber sleeve 184 and flexible printed circuit cable 180 are the only coupling locations of receptacle board 176 to mouse 46. In one example embodiment, rubber sleeve 184 does not couple directly to receptacle board 176 but rather only indirectly by inserting around cable port 172. Alternatively, adhesive on rubber sleeve 184 may also couple to receptacle board 176, although this approach may transfer some stress to the receptacle board. In one embodiment, the inner circumference of rubber sleeve 184 may have adhesive to couple to the outer surface of cable port 172 to hold the assembly in alignment with the chassis opening when rubber sleeve 184 couples to chassis 170. One advantage of the small size of receptacle board 176 is that substantially thicker circuit board material may be used for receptacle board 176 without impacting the thickness of main board 182. For instance, receptacle board 176 may have twice the thickness of main board 182 for a more robust coupling of cable port 172.

Figure 26:
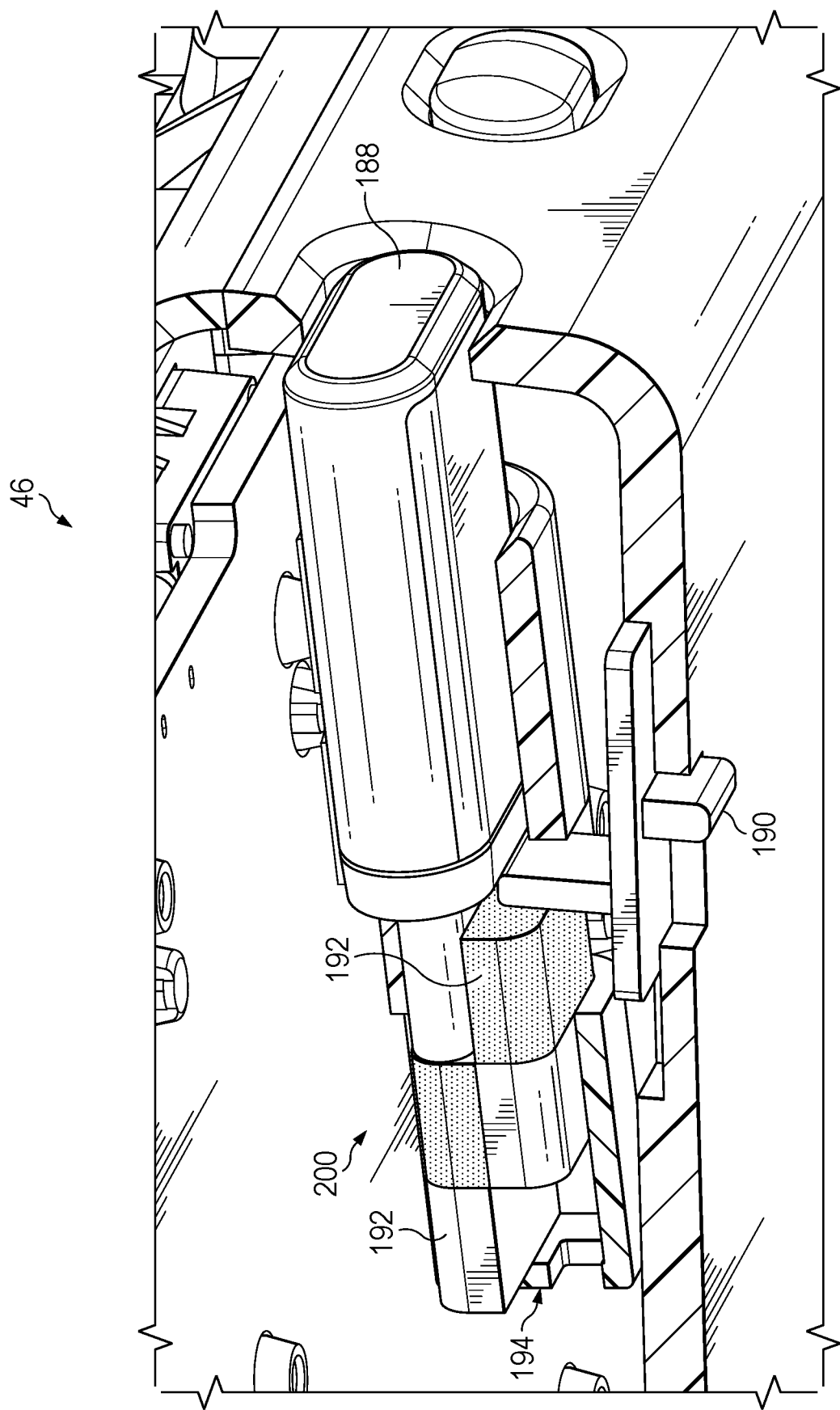
FIGS. 26 and 26A depict a magnetic toggle switch configured to remove a wireless dongle from a mouse cable port.
Figure 26A:
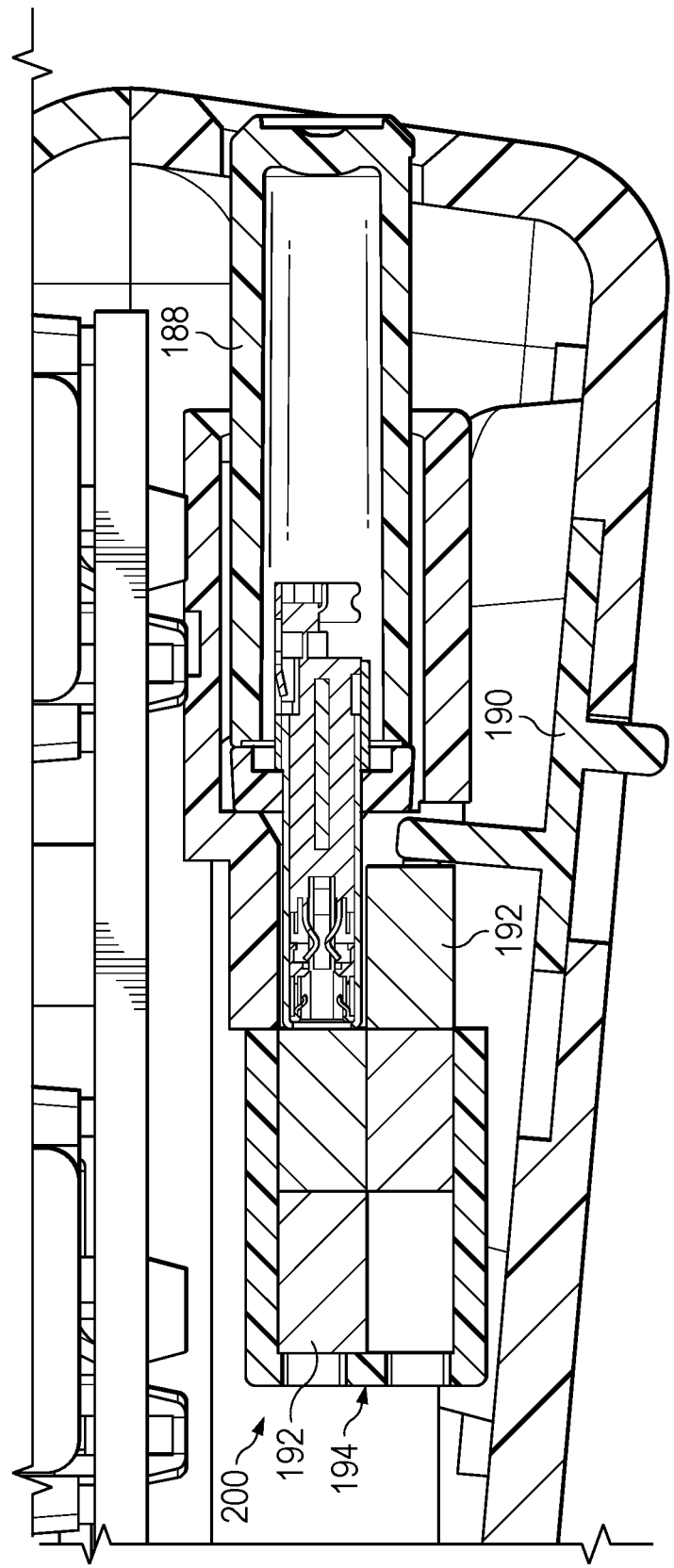

Referring now to FIGS. 26 and 26A, a magnetic toggle switch 200 is depicted configured to remove a wireless dongle 188 from a mouse 46 cable port. In the example embodiment, wireless dongle 188 has a USB Type-C connector that couples to a USB Type-C port of mouse 46 in a manner similar to the cable arrangement of FIG. 25, such as with a receptacle circuit board. Wireless dongle 188 includes wireless radio circuitry to communicate through a wireless interface, such as a BLUETOOTH or similar wireless personal area network (WPAN) or a wireless local area network (WLAN). In order to minimize torsional forces that transfer from wireless dongle 188 to internal structure of mouse 46, wireless dongle 188 fully inserts with the end of the dongle flush to the mouse chassis, as is depicted in FIG. 26. Although a flush insertion limits the risk that torsional forces can damage internal chassis structure, the lack of any part of wireless dongle 188 extending from the chassis introduces difficulty for an end user to remove wireless dongle 188 from the mouse.

The magnetic toggle switch 200 interacts with wireless dongle 188 to push wireless dongle 188 out of mouse 46 so that an end user can grasp and pull the wireless dongle free. The magnetic toggle switch 200 has a ferromagnetic housing 194 and first and second vertically stacked magnets 192 within housing 194. An exposed lever 190 abuts against the end of the lower magnet 192 to push the lower magnet further into the mouse housing in order to command an ejection of wireless dongle 188. As is illustrated by FIG. 26A, both magnets 192 fit into housing 194 with the same magnetic pole orientation, resulting in the upper magnet north pole aligning with the lower magnet south pole is a laterally offset manner. When wireless dongle 188 inserts into the wireless cable port, the upper magnet 192 is pressed backwards, which interacts magnetically with the lower magnet to extend out and press against exposed lever 190 to press out to an installed position as shown.

Figure 27:
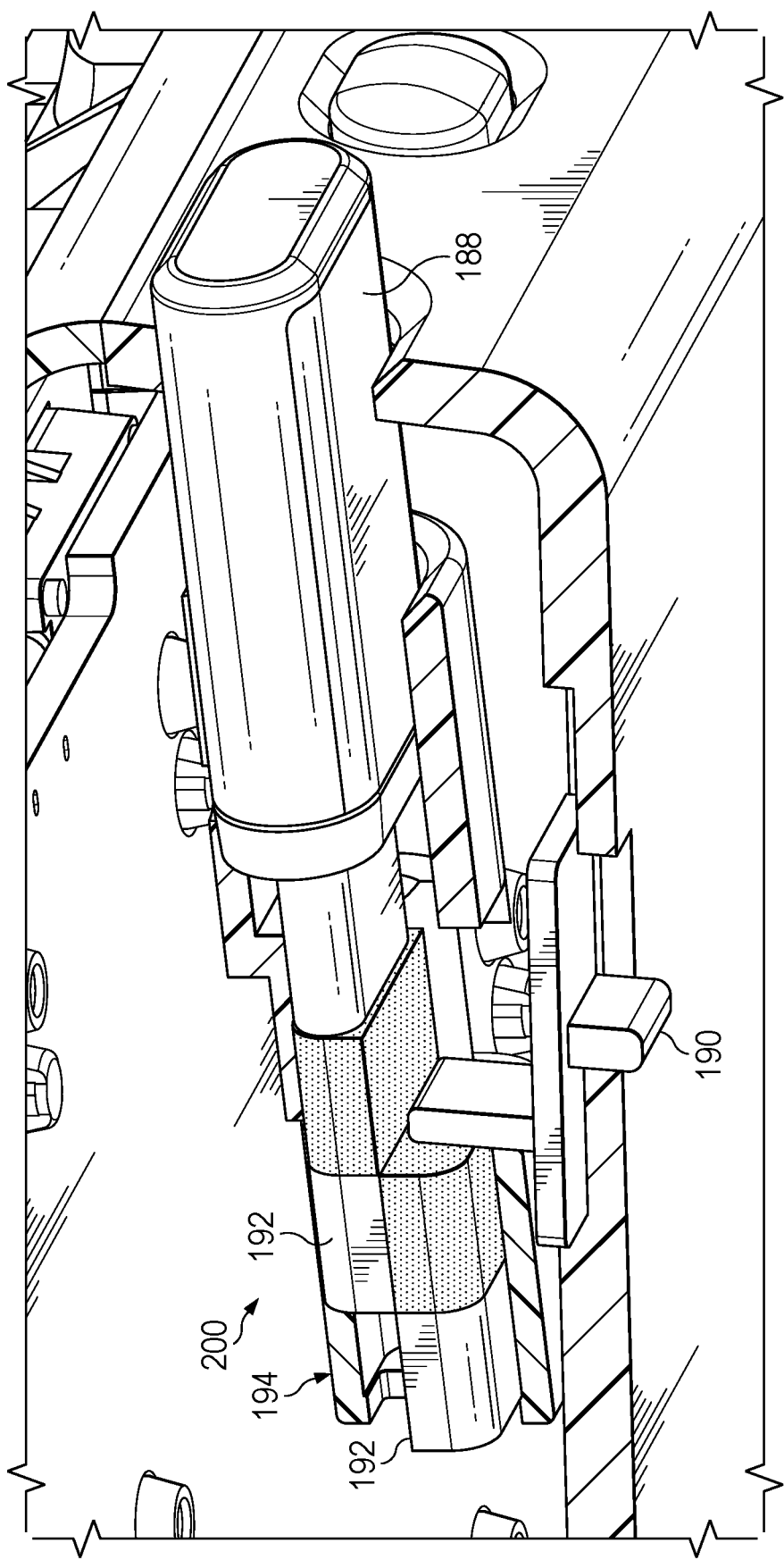
FIGS. 27 and 27A depict a magnetic toggle switch activated to remove a wireless dongle from a mouse cable port.
Figure 27A:
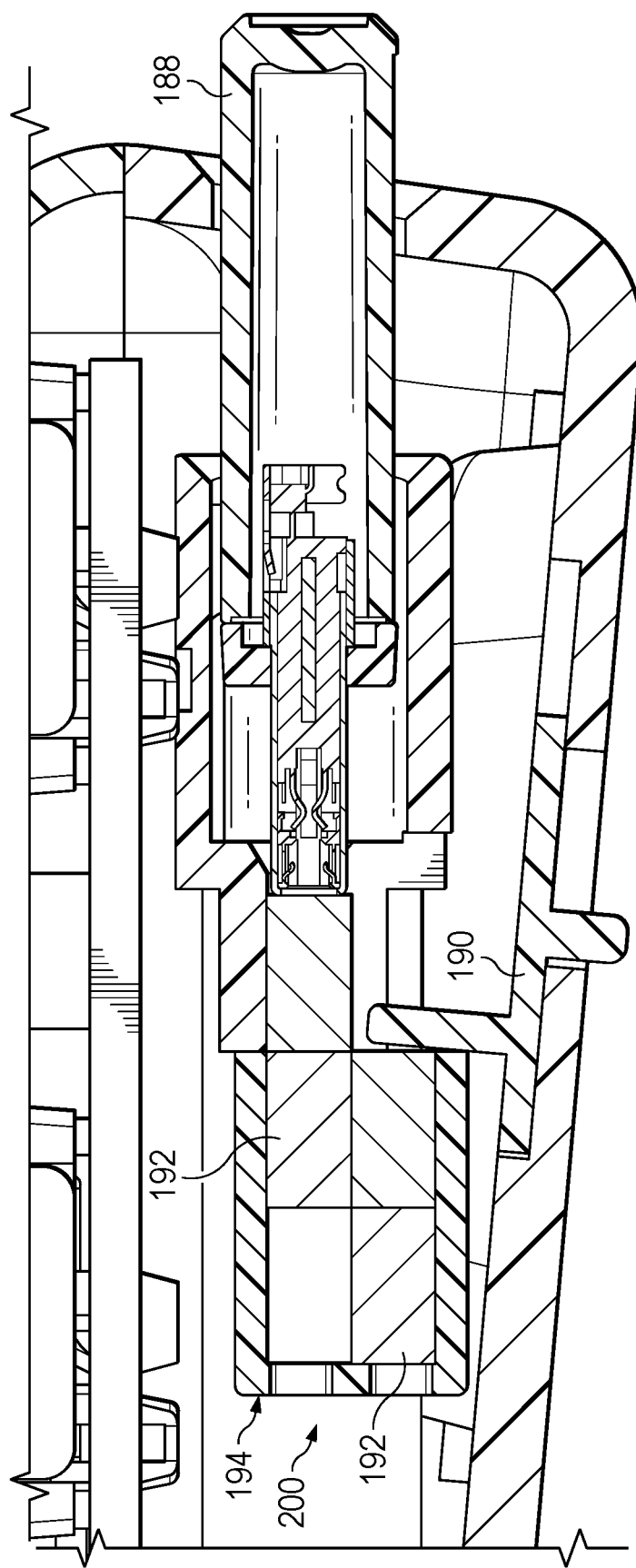

Referring now to FIGS. 27 and 27A, a magnetic toggle switch 200 is depicted actuated to remove a wireless dongle 188 from a mouse cable port. When exposed lever 190 is pressed inward against the lower magnet 192, the south poles align resulting in a rejection force pressing the upper magnet outward and against wireless dongle 188. FIG. 27A depicts the upper magnet motivated outward to push wireless dongle 188 out of mouse 46 so that an end user finger can grasp the dongle and pull it free. In one example embodiment, a lubricant, such as grease, disposed between the magnets 192 helps to move the magnets relative to each other. Alternatively, ball bearings or other friction reduction devices may be used to reduce resistance against the movement of the magnets in response to changes in the magnetic field. In another example embodiment, rather than having an exposed lever 190 the lower magnet 192 extends out to be pressed directly inward to eject the wireless dongle. In this regard, ferromagnetic housing 194 keeps the magnets in place within the housing by magnetic attraction.

Figure 28A:
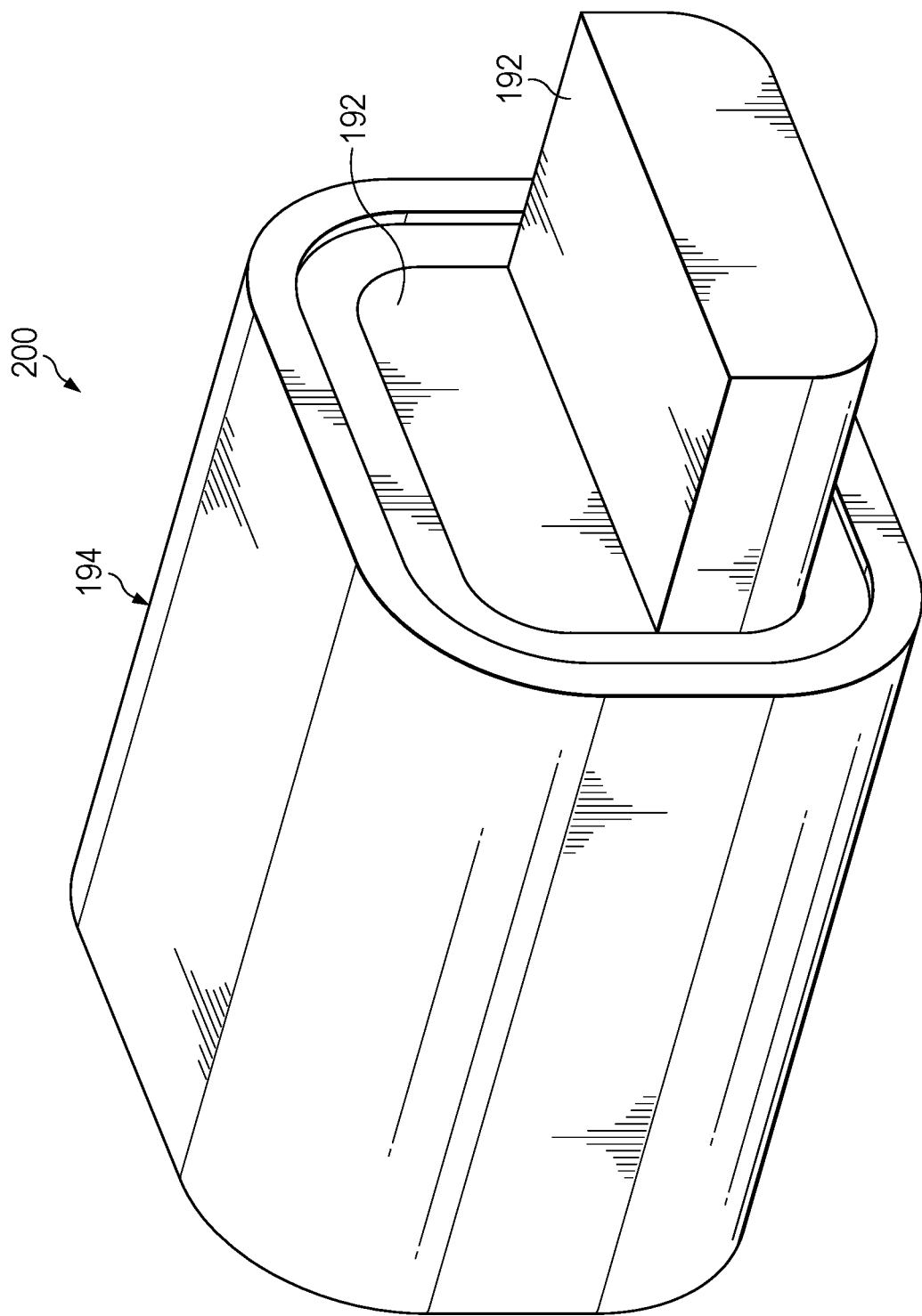
FIGS. 28A, 28B, 28C and 28D depict a magnetic toggle switch configured to complete a circuit to indicate switch position.
Figure 28B:
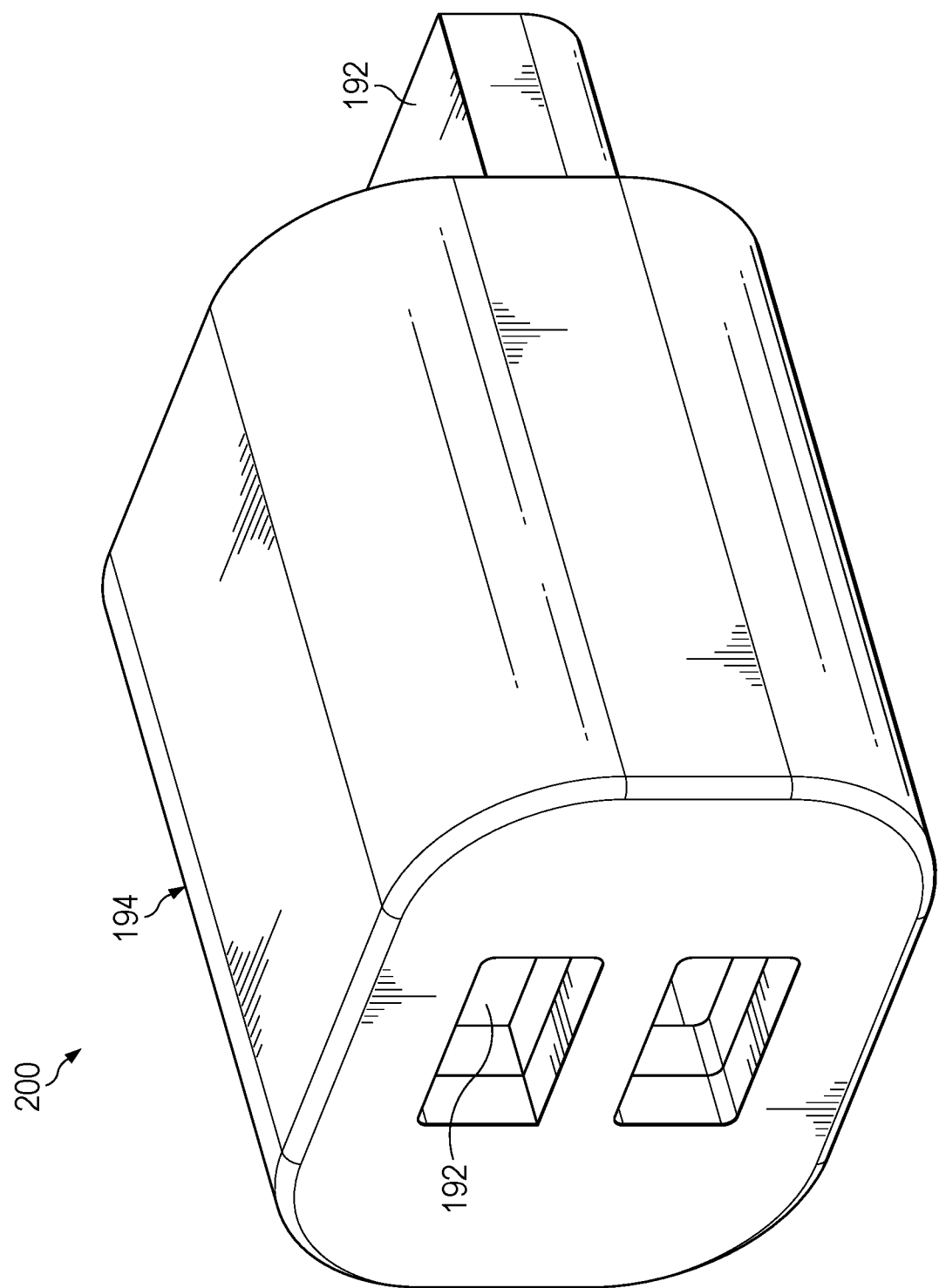
Figure 28C:
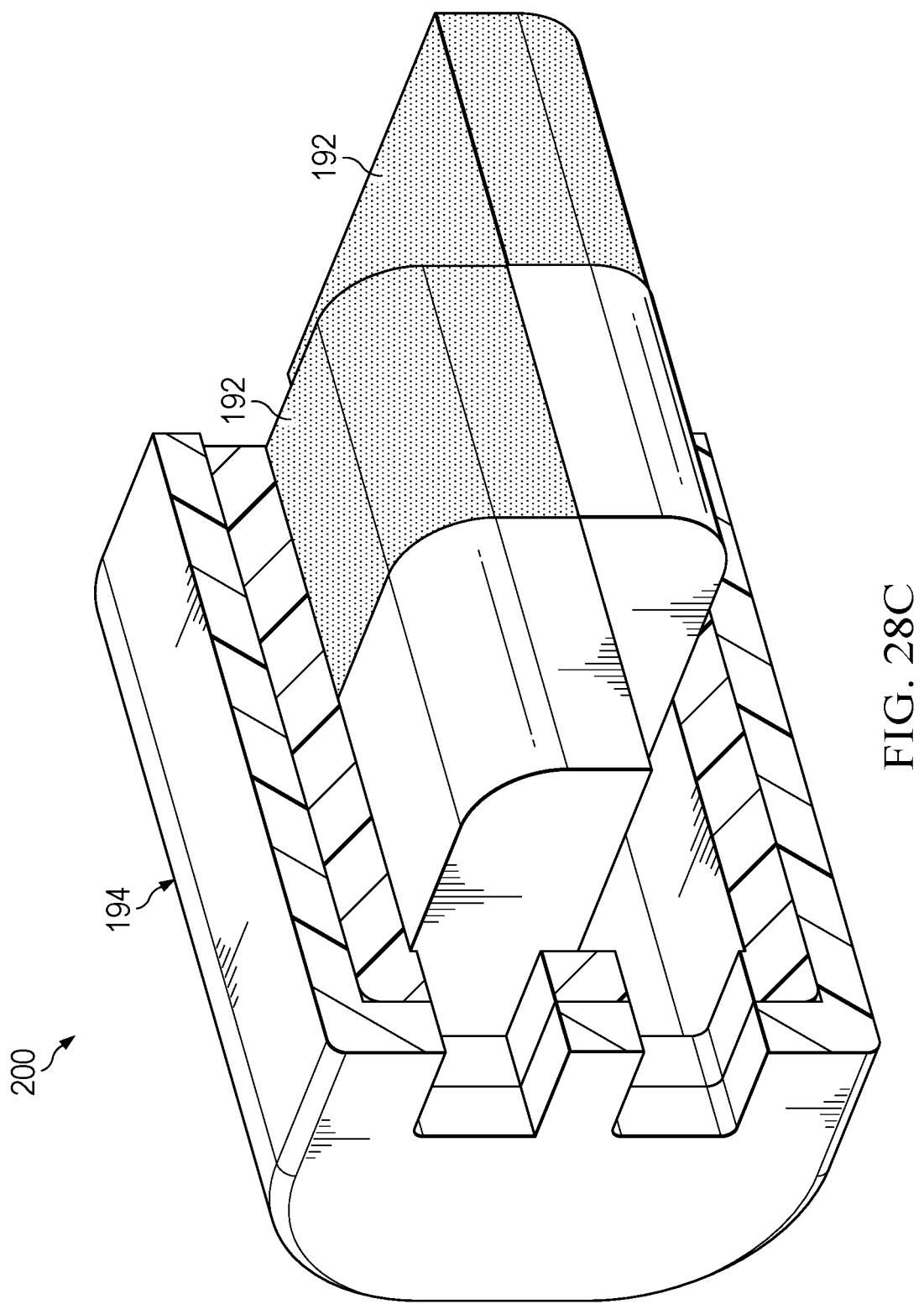
Figure 28D:
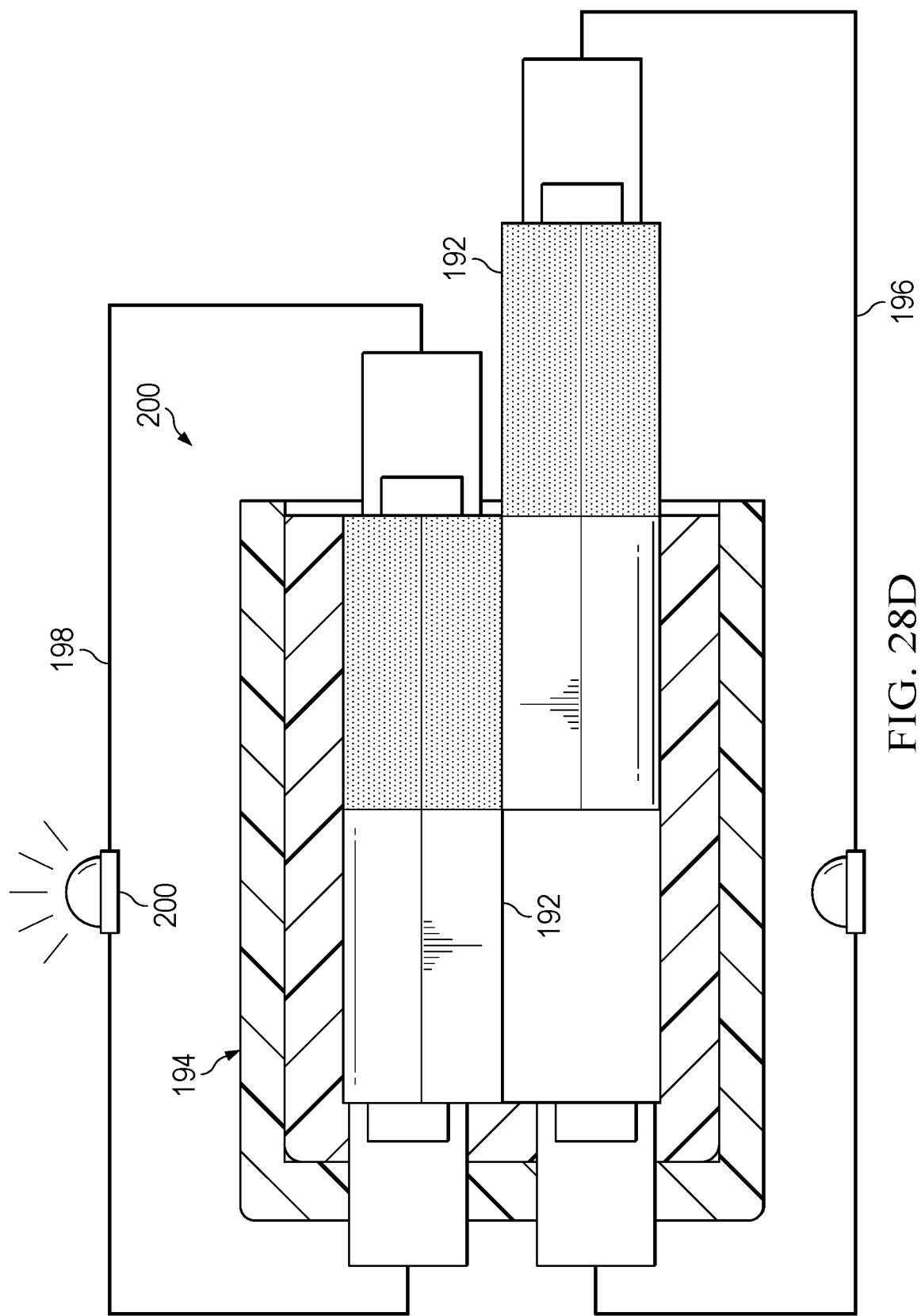

Referring now to FIGS. 28A, 28B, 28C and 28D, a magnetic toggle switch 200 is depicted configured to complete a circuit to indicate switch position. Ferromagnetic housing 194 maintains magnets 192 in the housing with a length of substantially the length of the magnets so that repelling force from like pole alignment will bias one of the magnets 192 out of housing 194 at all times. FIG. 28A depicts the lower magnet extending out and the upper magnet pressed inward. FIG. 28B depicts that the upper magnet presses to the rear side of housing 194 where it can move an internal part. FIG. 28C depicts a sectional view of magnetic toggle switch 200 showing the alignment of opposite poles of the upper and lower magnets 192. When lower magnet 192 is pressed inward to housing 194, alignment of like poles within housing 194 will force the upper magnet out of housing 192 and keep the lower magnet within housing 194. FIG. 28D depicts an example embodiment in which magnetic toggle switch 200 is used to turn a current on and off by engaging the current through the magnets or otherwise completing a circuit. In one example embodiment, movement of the magnets relative to each other generates a current that is monitored for an indication of switch actuation.

Although the present invention has been described in detail, it should be understood that various changes, substitutions and alterations can be made hereto without departing from the spirit and scope of the invention as defined by the appended claims.

What is claimed is:

1. An information handling system comprising: a housing; a processor disposed in the housing and operable to execute instruction to process information; a memory disposed in the housing and interfaced with the processor, the memory operable to store the information and instructions; a keyboard interfaced with the processor, the keyboard having a frame and plural key caps, each key cap configured to accept an end user press down to a depressed position as an input and biased to return to a raised position; a balancing bar coupled to a bottom side of at least one of the plural key caps and configured to maintain the at least one of the plural key caps in a level orientation when moved between the depressed position and the raised position; at least one magnet proximate the balancing bar to dampen rattle associated with movement of the balancing bar; wherein the at least one of the plural key caps comprises a spacebar key cap; wherein the at least one magnet further comprises: a first magnet coupled to a bottom side of the spacebar key cap at a first of the opposing ends of the balancing bar; and a second magnet coupled to a bottom side of the spacebar key cap at a second of the opposing ends of the balancing bar; and further comprising at least one base magnet coupled to the frame proximate the balancing bar axis.

2. The information handling system of claim 1 wherein the at least one magnet couples to the at least one of the plural key caps proximate a location at which the balancing bar touches the at least one of the plural key caps.

3. The information handling system of claim 1 wherein the balancing bar rotates about an axis coupled to the frame and touches the spacebar key cap at opposing ends of the balancing bar.

4. The information handling system of claim 3 further comprising first and second members extending down from a bottom side of the spacebar key cap proximate the opposing ends of the balancing bar, a first magnet coupled to the first member, a second magnet coupled to the second member.

5. The information handling system of claim 4 further comprising first and second cushions coupled to the first and second members between each of the first and second members and the opposing ends of the balancing bar.

6. The information handling system of claim 5 wherein the first and second cushions have a channel engaged with the balancing bar.

7. A method for managing audible sounds of an information handling system keyboard, the method comprising: coupling plural key caps in a keyboard frame; biasing the plural key caps to a raised position; balancing one or more of the plural key caps with a balancing bar coupled to the frame at a rotational axis and pressing against the one or more of the plural key caps with each of opposing ends; magnetically attracting each of the opposing ends to the one or more of the plural key caps—wherein: each of the opposing ends presses up against at bottom surface of the one of the plural key caps; and plural magnets couple to the bottom surface, each of the plural magnets aligned with one of the opposing ends; and further comprising coupling one or more base magnets to the frame proximate the rotational axis.

8. The method of claim 7 wherein the one or more of the plural key caps comprises a spacebar key cap.

9. The method of claim 7 further comprising: coupling the balancing bar to the frame with plural snaps integrated in the frame; and coupling plural base magnets to the frame between the plural snaps.

10. The method of claim 7 further comprising:
    extending a member from a bottom side of the one or more of the plural key caps; and
    coupling a magnet to the member proximate balancing bar.

11. A keyboard comprising: a frame; plural key caps, each key cap configured to accept an end user press down to a depressed position as an input and biased to return to a raised position; a balancing bar coupled to a bottom side of at least one of the plural key caps and configured to maintain the at least one of the plural key caps in a level orientation when moved between the depressed position and the raised position; at least one magnet proximate the balancing bar to dampen movement of the balancing bar; wherein the at least one of the plural key caps comprises a spacebar key cap; wherein the at least one magnet further comprises: a first magnet coupled to a bottom side of the spacebar key cap at a first of the opposing ends of the balancing bar; and a second magnet coupled to a bottom side of the spacebar key cap at a second of the opposing ends of the balancing bar; and further comprising at least one base magnet coupled to the frame proximate a rotational axis of the balancing bar.

12. The keyboard of claim 11 wherein the at least one magnet couples to the at least one of the plural key caps proximate a location at which the balancing bar touches the at least one of the plural key caps.

\* \* \* \* \*

UNITED STATES PATENT AND TRADEMARK OFFICE
CERTIFICATE OF CORRECTION

| | | |
|---|---|---|
| PATENT NO. | : 11,914,796 B1 | Page 1 of 1 |
| APPLICATION NO. | : 18/214600 | |
| DATED | : February 27, 2024 | |
| INVENTOR(S) | : Peng Lip Goh and Deeder M. Aurongzeb | |

It is certified that error appears in the above-identified patent and that said Letters Patent is hereby corrected as shown below:

In the Claims

In Column 16, Claim 7, Line 25, please replace "—" with --;--;
In Column 16, Claim 7, Line 26, please replace "at" with --a--.

Signed and Sealed this
Twenty-sixth Day of March, 2024

Katherine Kelly Vidal
Director of the United States Patent and Trademark Office